United States Patent
Chen et al.

(10) Patent No.: US 12,218,160 B2
(45) Date of Patent: Feb. 4, 2025

(54) PIXEL SENSOR INCLUDING A LAYER STACK TO REDUCE AND/OR BLOCK THE EFFECTS OF PLASMA PROCESSING AND ETCHING ON THE PIXEL SENSOR

(71) Applicant: Taiwan Semiconductor Manufacturing Company, Ltd., Hsinchu (TW)

(72) Inventors: Wei-Lin Chen, Tainan (TW);
Ching-Chung Su, Tainan (TW);
Chun-Hao Chou, Tainan (TW);
Kuo-Cheng Lee, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 71 days.

(21) Appl. No.: 17/249,788

(22) Filed: Mar. 12, 2021

(65) Prior Publication Data
US 2022/0293651 A1 Sep. 15, 2022

(51) Int. Cl.
*H01L 27/146* (2006.01)
(52) U.S. Cl.
CPC .. *H01L 27/14618* (2013.01); *H01L 27/14621* (2013.01); *H01L 27/14627* (2013.01); *H01L 27/14685* (2013.01)
(58) Field of Classification Search
CPC ......... H01L 27/14618; H01L 27/14621; H01L 27/14627; H01L 27/14685; H01L 27/14645; H01L 27/1462; H01L 27/1463; H01L 27/1464; H01L 27/14643; H01L 27/14689
See application file for complete search history.

(56) References Cited

U.S. PATENT DOCUMENTS

| | | | |
|---|---|---|---|
| 9,564,468 B2 | 2/2017 | Chou et al. | |
| 10,163,974 B2 | 12/2018 | Su et al. | |
| 10,522,580 B2 | 12/2019 | Cheng et al. | |
| 2015/0115382 A1* | 4/2015 | Wu | H01L 27/14689 438/70 |
| 2016/0307940 A1* | 10/2016 | Cheng | H01L 27/1464 |
| 2018/0286907 A1* | 10/2018 | Su | H01L 27/14868 |
| 2020/0144320 A1* | 5/2020 | Seo | H01L 27/14636 |
| 2021/0126028 A1* | 4/2021 | Jeon | H01L 27/14609 |
| 2021/0233947 A1* | 7/2021 | Zang | H01L 27/14605 |

FOREIGN PATENT DOCUMENTS

| | | |
|---|---|---|
| CN | 105990384 A | 10/2016 |
| CN | 108493203 A | 9/2018 |
| CN | 110828490 A | 2/2020 |
| TW | 201901801 A | 1/2019 |
| TW | 201913980 A | 4/2019 |

* cited by examiner

*Primary Examiner* — Nelson Garces
(74) *Attorney, Agent, or Firm* — Harrity & Harrity, LLP

(57) ABSTRACT

A pixel sensor may include a layer stack to reduce and/or block the effects of plasma and etching on a photodiode and/or other lower-level layers. The layer stack may include a first oxide layer, a layer having a band gap that is approximately less than 8.8 electron-Volts (eV), and a second oxide layer. The layer stack may reduce and/or prevent the penetration and absorption of ultraviolet photons resulting from the plasma and etching processes, which may otherwise cause the formation of electron-hole pairs in the substrate in which the photodiode is included.

20 Claims, 42 Drawing Sheets

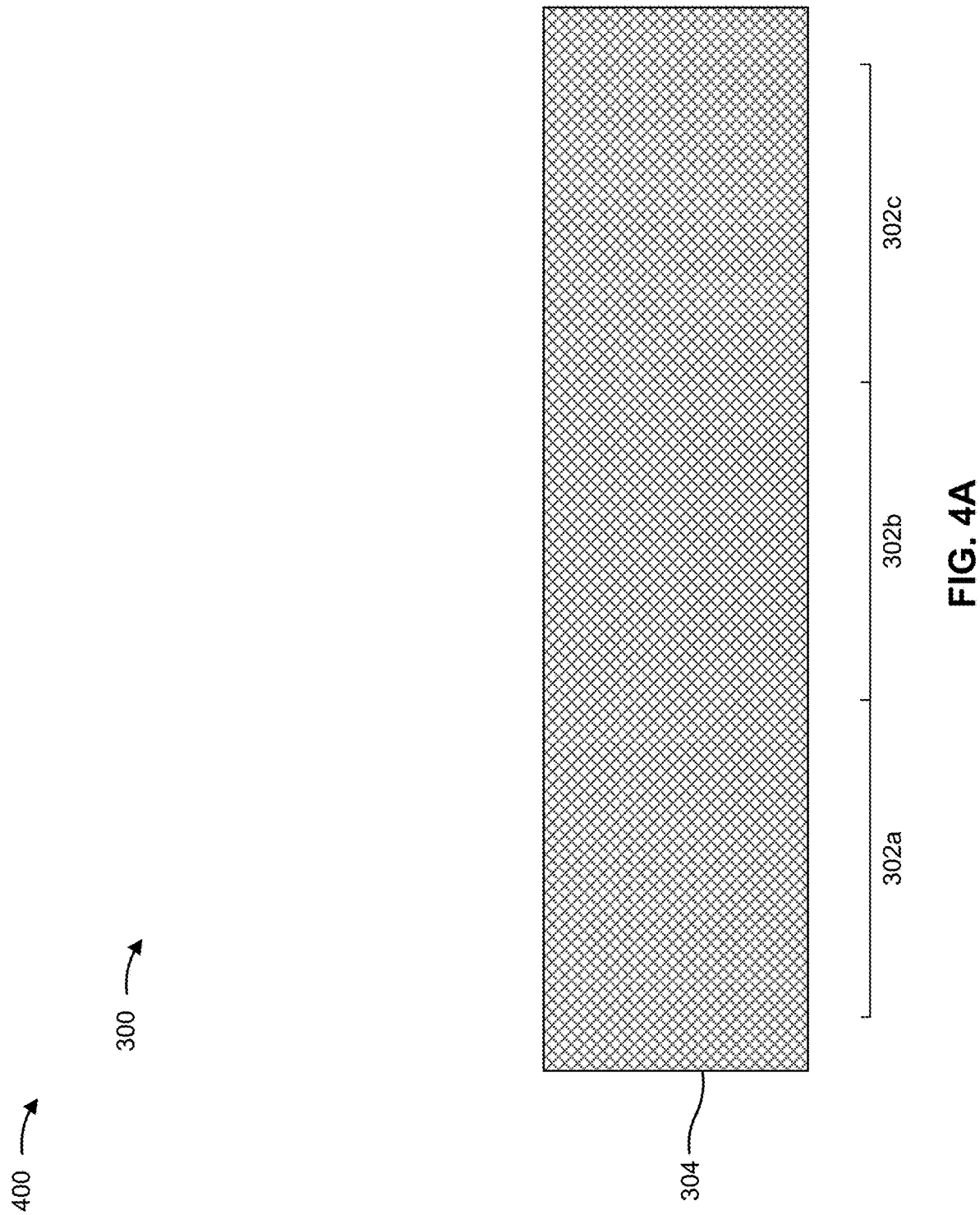

PIXEL SENSOR INCLUDING A LAYER STACK TO REDUCE AND/OR BLOCK THE EFFECTS OF PLASMA PROCESSING AND ETCHING ON THE PIXEL SENSOR

BACKGROUND

Digital cameras and other optical imaging devices employ image sensors. Image sensors convert optical images to digital data that may be represented as digital images. An image sensor includes an array of pixel sensors and supporting logic. The pixel sensors of the array are unit devices for measuring incident light, and the supporting logic facilitates read-out of the measurements. One type of image sensor commonly used in optical imaging devices is a back side illumination (BSI) image sensor. BSI image sensor fabrication can be integrated into semiconductor processes for low cost, small size, and high integration. Further, BSI image sensors have low operating voltage, low power consumption, high quantum efficiency, and low read-out noise, and allow random access.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4M are diagrams of an example implementation described herein.

DETAILED DESCRIPTION

Figure 1:
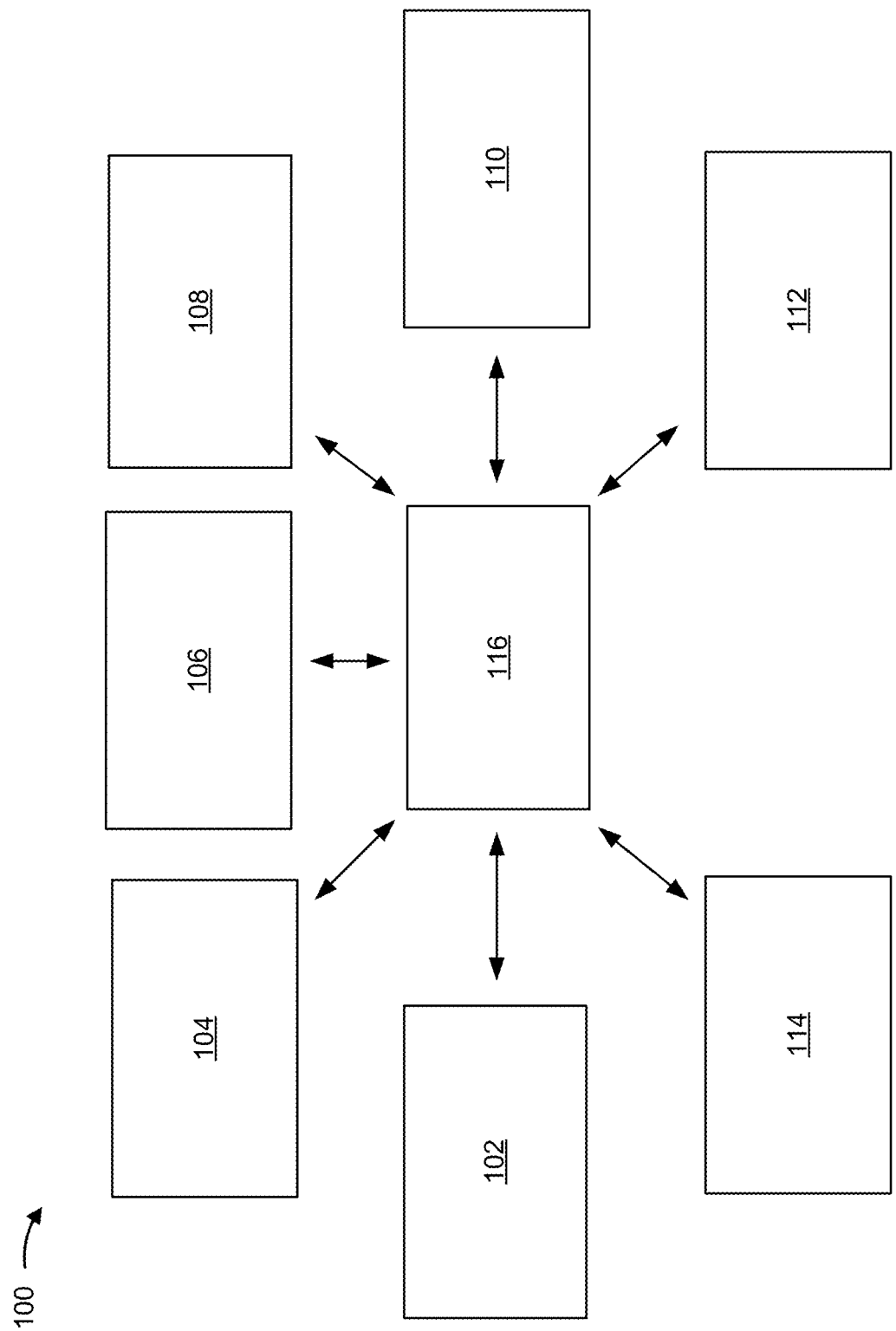
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A pixel array may be processed through various types of semiconductor processing operations to form the pixel array. Some types of semiconductor processing operations include the use of plasma processing, such as plasma etching or plasma ashing. In some cases, ultraviolet radiation in the plasma that is used in plasma and etching processing (e.g., plasma-based etching and/or plasma-less etching) can result in the formation of electron-hole pairs in one or more dielectric layers of the pixel array. The electrons and/or holes may migrate into photodiodes of the pixel array, which may damage the photodiodes and/or may decrease the performance of the pixel array by decreasing dark current (DC) performance of the pixel array and/or decreasing white pixel (WP) performance of the pixel array.

Some implementations described herein provide various pixel sensors and pixel arrays that include a layer stack to reduce and/or block the effects of plasma and etching on photodiodes and/or other lower-level layers. The layer stack may include a first oxide layer, a layer having a band gap that is approximately less than 8.8 electron-Volts (eV), and a second oxide layer. The layer stack may reduce and/or prevent the penetration and absorption of ultraviolet photons resulting from the plasma and etching processes, which may otherwise cause the formation of electron-hole pairs in the substrate in which the photodiodes are included. This enables the dark current performance, the white pixel performance, the quantum efficiency, and/or the cross-talk performance of the pixel sensors and pixel arrays described herein to be maintained while blocking or reducing the effects of plasma processing and etching on the pixel sensors and pixel arrays.

The layer stack may reduce and/or block the effects of plasma processing and etching on a pixel sensor in that the first oxide layer may absorb ultraviolet photons at or below wavelengths approximately equal to and/or less than 140 nanometers, and the layer having a band gap that is approximately less than 8.8 eV may absorb ultraviolet photons at wavelengths of approximately equal and/or less than 250 nanometers. Electron-hole pairs that are formed in the first oxide layer and in the layer having a band gap that is approximately less than 8.8 eV do not pass through to the second oxide layer because the band gap of the second oxide layer (which may be approximately 5 eV, for example) is less than the band gap of the layer having a band gap that is approximately less than 8.8 eV.

FIG. 1 is a diagram of an example environment 100 in which systems and/or methods described herein may be implemented. As shown in FIG. 1, environment 100 may include a plurality of semiconductor processing tools 102-114 and a wafer/die transport tool 116. The plurality of semiconductor processing tools 102-114 may include a deposition tool 102, an exposure tool 104, a developer tool 106, an etch tool 108, a planarization tool 110, a plating tool 112, an ion implantation tool 114, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

Wafer/die transport tool 116 includes a mobile robot, a robot arm, a tram or rail car, an overhead hoist transport (OHT) system, an automated materially handling system (AMHS), and/or another type of device that is used to transport wafers and/or dies between semiconductor processing tools 102-114 and/or to and from other locations such as a wafer rack, a storage room, and/or the like. In some implementations, wafer/die transport tool 116 may be a programmed device that is configured to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
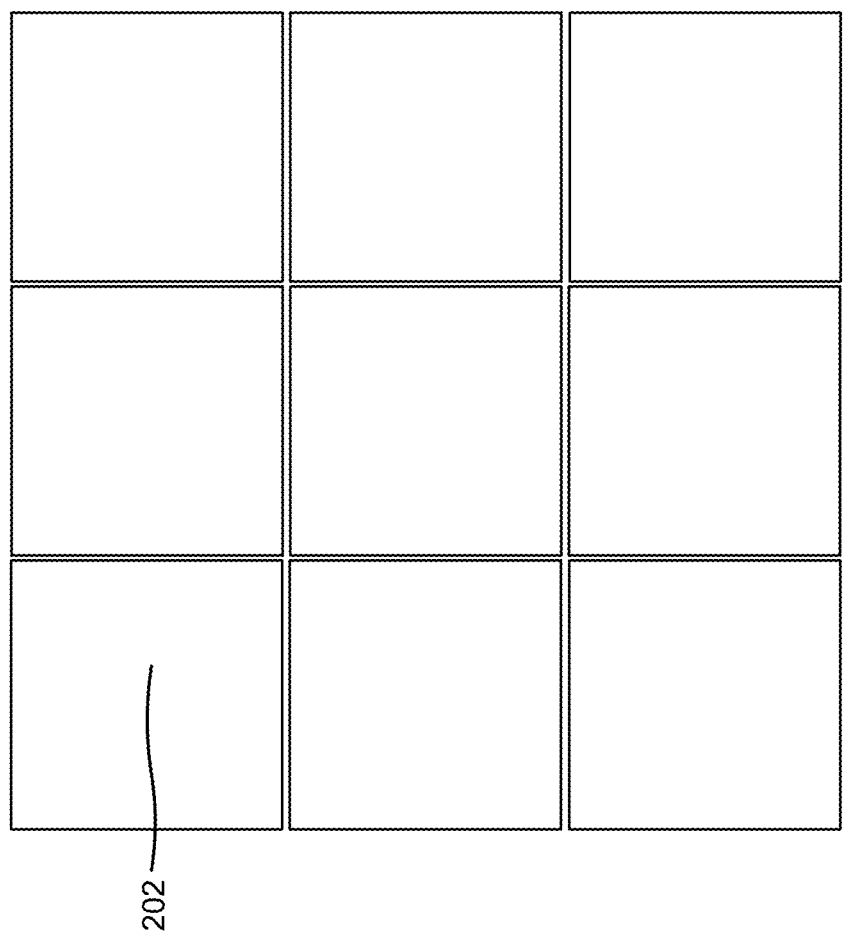
FIGS. 2 and 3 are diagrams of example pixel arrays described herein.

FIG. 2 shows a top-down view of the pixel array 200. In some implementations, the pixel array 300 may be included in an image sensor. The image sensor may include a complementary metal oxide semiconductor (CMOS) image sensor, a back side illuminated (BSI) CMOS image sensor, or another type of image sensor. As shown in FIG. 2, the pixel array 200 may include a plurality of pixel sensors 202. As further shown in FIG. 2, the pixel sensors 202 may be arranged in a grid. In some implementations, the pixel sensors 202 are square-shaped (as shown in the example in FIG. 2). In some implementations, the pixel sensors 202 include other shapes such as circle shapes, octagon shapes, diamond shapes, and/or other shapes.

The pixel sensors 202 may be configured to sense and/or accumulate incident light (e.g., light directed toward the pixel array 200). For example, a pixel sensor 202 may absorb and accumulate photons of the incident light in a photodiode. The accumulation of photons in the photodiode may generate a charge representing the intensity or brightness of the incident light (e.g., a greater amount of charge may correspond to a greater intensity or brightness, and a lower amount of charge may correspond to a lower intensity or brightness).

The pixel array 200 may be electrically connected to a back-end-of-line (BEOL) metallization stack (not shown) of the image sensor. The BEOL metallization stack may electrically connect the pixel array 200 to control circuitry that may be used to measure the accumulation of incident light in the pixel sensors 202 and convert the measurements to an electrical signal.

As indicated above, FIG. 2 is provided as an example. Other examples may differ from what is described with regard to FIG. 2.

Figure 3:
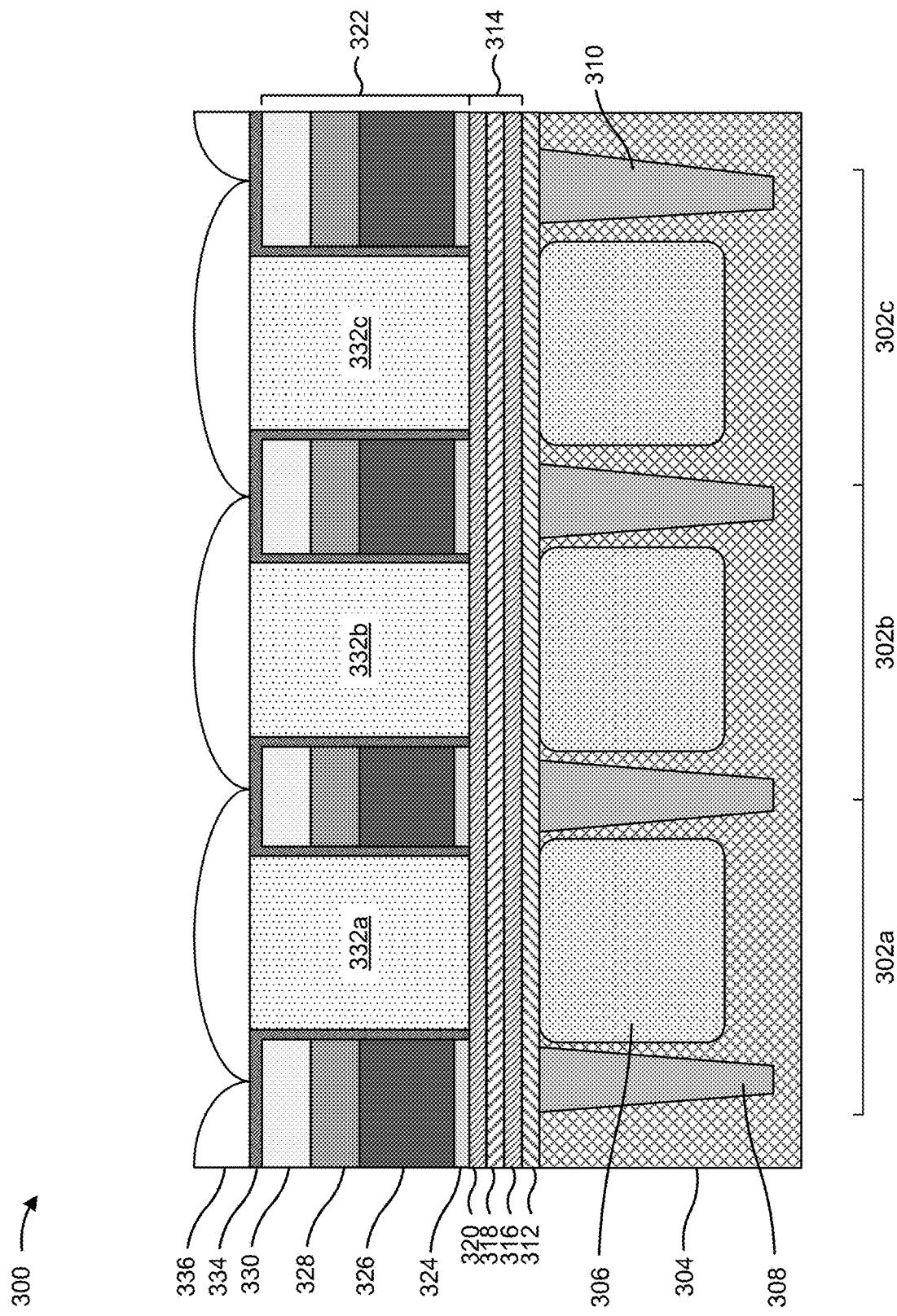

FIG. 3 is a diagram of an example pixel array 300 described herein. In some implementations, the example pixel array 300 illustrated in FIG. 3 may include, or may be included in, the pixel array 200 (or a portion thereof). In some implementations, the pixel array 300 may be included in an image sensor. The image sensor may include a CMOS image sensor, a BSI CMOS image sensor, or another type of image sensor.

As shown in FIG. 3, the pixel array 300 may include a plurality of adjacent pixel sensors 302, such as pixel sensors 302a-302c. In some implementations, the pixel sensors 302a-302c are configured as square-shaped pixel sensors 202 included in the pixel array 200. In some implementations, the pixel sensors 302a-302c include other shape(s) of pixel sensors such as octagon-shaped pixel sensors or a combination square-shaped and octagon-shaped pixel sensors.

The pixel sensors 302 may be formed in a substrate 304, which may include a semiconductor die substrate, a semiconductor wafer, or another type of substrate in which semiconductor pixels may be formed. In some implementations, the substrate 304 is formed of silicon (Si), a material including silicon, a III-V compound semiconductor material such as gallium arsenide (GaAs), a silicon on insulator (SOI), or another type of semiconductor material that is capable of generating a charge from photons of incident light.

Each pixel sensor 302 may include a photodiode 306. A photodiode 306 may include a region of the substrate 304 that is doped with a plurality of types of ions to form a p-n junction or a PIN junction (e.g., a junction between a p-type portion, an intrinsic (or undoped) type portion, and an n-type portion). For example, the substrate 304 may be doped with an n-type dopant to form a first portion (e.g., an n-type portion) of a photodiode 306 and a p-type dopant to form a second portion (e.g., a p-type portion) of the photodiode 306. A photodiode 306 may be configured to absorb photons of incident light. The absorption of photons causes a photodiode 306 to accumulate a charge (referred to as a photocurrent) due to the photoelectric effect. Here, photons bombard the photodiode 306, which causes emission of electrons of the photodiode 306. The emission of electrons causes the formation of electron-hole pairs, where the electrons migrate toward the cathode of the photodiode 306 and the holes migrate toward the anode, which produces the photocurrent.

An isolation structure 308 may be included in the substrate 304 between adjacent pixel sensors 302. The isolation structure 308 may provide optical isolation by blocking or preventing diffusion or bleeding of light from one pixel sensor 302 to another pixel sensor 302, thereby reducing crosstalk between adjacent pixel sensors 302. The isolation structure 308 may include trenches or deep trench isolation (DTI) structures filled with an oxide layer 310. The isolation structure 308 may be formed in a grid layout in which the isolation structure 308 extends around the perimeters of the pixel sensors 302 in the pixel array 300 and intersects at various locations of the pixel array 300. In some implementations, the isolation structure 308 is formed in the backside of the substrate 304 to provide optical isolation between the pixel sensors 302, and thus may be referred to as a backside DTI (BDTI) structure.

The oxide layer 310 may function as a dielectric buffer layer between the photodiodes 306 and the layers above the photodiodes 306. The oxide layer 310 may include an oxide material such as a silicon oxide ($SiO_x$) (e.g., silicon dioxide ($SiO_2$)), a hafnium oxide ($HfO_x$), a tantalum oxide ($TaO_x$), an aluminum oxide ($AlO_x$), or another type of dielectric oxide material. In some implementations, another type of dielectric material is used in place of the oxide layer 310, such as a silicon nitride ($Si_xN_y$), a silicon carbide ($SiC_x$), a titanium nitride ($TiN_x$), or a tantalum nitride ($TaN_x$).

A high dielectric constant (high-k) dielectric layer 312 may be included on the substrate 304 and over the photodiodes 306 and the isolation structure 308. The high-k dielectric layer 312 may reduce crosstalk between adjacent photodiodes 306 and can accumulate holes to reduce dark current and/or white pixel formation in the pixel array 300. The high-k dielectric layer 312 may include a negatively charged material. The negatively charged material may have a greater overall negative charge relative to other dielectric materials to increase hole accumulation at an interface of the high-k dielectric layer 312 and the substrate 304. This creates a depletion region near the interface. The depletion region may reduce dark current and/or may reduce white pixel formation in the pixel array 300. Examples of high-k dielectric materials that may be used in the high-k dielectric layer 312 may include high-k metal oxides such as a hafnium oxide ($HfO_x$), an aluminum oxide ($Al_xO_y$), a zirconium oxide ($ZrO_x$), a magnesium oxide ($MgO_x$), a yttrium oxide ($Y_xO_y$), a tantalum oxide ($Ta_xO_y$), a titanium oxide ($TiO_x$), a lanthanum oxide ($La_xO_y$), a barium oxide ($BaO_x$), or another type of high-k metal oxide.

A layer stack 314 may be located over and/or on the high-k dielectric layer 312. The layer stack 314 may be configured to further increase dark current performance and/or white pixel performance by reducing and/or preventing damage to the photodiodes 306 that might otherwise result from radiation damage, plasma processing, and/or etching of various layers and/or structures of the pixel array 300. In particular, the layer stack 314 may resist and/or block electron-hole pairs from migrating downward into the substrate 304 and the photodiodes 306, which might otherwise increase the dark current of the pixel array 300 and/or might otherwise increase the formation of white pixels in the pixel array 300. The layer stack 314 may protect the photodiodes 306 prior to, during, and/or after various types of semiconductor processing operations, such as plasma ashing (e.g., photoresist stripping, in-situ and/or ex-situ), etching, plasma etching, argon treatment, and/or plasma pre-cleaning, among other examples.

The layer stack 314 may include a first layer 316 over and/or on the high-k dielectric layer 312. The first layer 316 may include an oxide material and may be referred to as an oxide layer. The oxide material may include a silicon oxide ($SiO_x$) or another type of oxide having a relatively high band gap. As an example, the first layer 316 may include silicon dioxide ($SiO_2$) and may have a band gap of approximately 8.8 eV.

The layer stack 314 may include a second layer 318 over and/or on the first layer 316. The second layer 318 may include a material having a band gap that is lower than the band gap of the material of the first layer 316. For example, the second layer 318 may include a material having a band gap that is less than approximately 8.8 eV. Materials that may be included in the second layer 318 include a hafnium oxide ($HfO_x$), a hafnium silicon oxide ($HfSiO_x$), an aluminum oxide ($Al_xO_y$), a silicon nitride ($Si_xN_y$), a zirconium oxide ($ZrO_x$), a magnesium oxide ($MgO_x$), a yttrium oxide ($Y_xO_y$), a tantalum oxide ($Ta_xO_y$), a titanium oxide ($TiO_x$), a lanthanum oxide ($La_xO_y$), a barium oxide ($BaO_x$), a silicon carbide (SiC), a lanthanum aluminum oxide ($LaAlO_x$), a strontium oxide (SrO), a zirconium silicon oxide ($ZrSiO_x$), and/or a calcium oxide (CaO), among other examples. In some implementations, the second layer 318 includes a silicon nitride ($Si_xN_y$) layer, which has a band gap of approximately 5 eV.

The layer stack 314 may include a third layer 320 over and/or on the second layer 318. The third layer 320 may include an oxide material and may be referred to as an oxide layer. The oxide material may include a silicon oxide ($SiO_x$) or another type of oxide having a relatively high band gap, and a band gap that is greater than the band gap of the second layer 318. As an example, the third layer 320 may include silicon dioxide ($SiO_2$) and may have a band gap of approximately 8.8 eV.

The differences in band gaps of the layers in the layer stack 314 may trap electron-hole pairs before the electron-hole pairs can migrate to the substrate 304 and damage the photodiodes 306. In particular, the third layer 320, having a band gap of approximately 8.8 eV, may absorb ultraviolet radiation at and/or below wavelengths of approximately 140 nanometers. The second layer 318 may be configured to absorb ultraviolet radiation having a wavelength equal to and/or less than approximately 250 nanometers. Absorption of the ultraviolet radiation in the second layer 318 may result in the formation of electron-hole pairs in the second layer 318. Electron-hole pairs generated in the second layer 318 from the absorption of ultraviolet light may not be capable of passing through the first layer 316 because the electron-hole pairs were generated in the lower band gap material of the second layer 318 and cannot jump to the higher band gap material of the third layer 320. Thus, the first layer 316 may be configured to prevent migration of the electron-hole pairs toward the photodiodes 306. Moreover, no (or very few) electron-hole pairs may be generated in the first layer 316 because ultraviolet radiation was absorbed in the top oxide layer (e.g., the third layer 320) approximately at or below wavelengths of 140 nanometers, and in the second layer 318 approximately at or below wavelengths of 250 nanometers.

The thickness of the first layer 316, the second layer 318, and/or the third layer 320 may be configured to satisfy various performance parameters. In these examples, the layer stack 314 may be referred to as an oxide-nitride-oxide layer stack. In some implementations, the thickness of the first layer 316 is in a range of approximately 300 angstroms to approximately 1500 angstroms to achieve sufficient ultraviolet radiation damage protection and to achieve sufficient quantum efficiency performance. In some implementations, the thickness of the second layer 318 is equal to or greater than approximately 250 angstroms to achieve sufficient ultraviolet radiation damage protection. In some implementations, the thickness of the second layer 318 may be increased (e.g., to approximately 900 angstroms) to reduce electron-hole trapping at an interface between the substrate 304 and the high-k dielectric layer 312. In some implementations, the thickness of the third layer 320 is approximately 250 angstroms.

In some implementations, the thickness of the first layer 316, the second layer 318, and/or the third layer 320 may be configured such that the pixel sensors 302 achieve a luminance of approximately 84 to approximately 88 lux. In some implementations, the thickness of the first layer 316 may be reduced to achieve a greater luminance. In some implementations, the thickness of the first layer 316, the second layer 318, and/or the third layer 320 may be configured such that the pixel sensors 302 achieve a red/green/blue peak percentage of approximately 56%, approximately 69% to approximately 70%, and approximately 60% to approximately 63%, respectively. In some implementations, the thickness of the first layer 316, the second layer 318, and/or the third layer 320 may be configured such that the pixel sensors 302 achieve an average crosstalk percentage of approximately 10.5% to approximately 10.7%.

A grid structure 322 may be included over and/or on the layer stack 314 (e.g., the oxide-nitride-oxide layer stack). The grid structure 322 may include a plurality of interconnected columns formed from a plurality of layers that are etched to form the columns. The grid structure 322 may surround the perimeters of the pixel sensors 302 and may be configured to provide additional crosstalk reduction and/or mitigation in combination with the isolation structure 308.

In some implementations, the sidewalls of the grid structure 322 are substantially straight and parallel (e.g., the sidewalls are at an approximately 90 degree angle relative to a top surface of the grid structure 322). In some implementations, the sidewalls of the grid structure 322 are angled or tapered. In these examples, the sidewalls may taper between the top and the bottom of the grid structure 322 at an angle (e.g., a 95 degree angle) relative to the top surface of the grid structure 322 such that the bottom of the grid structure 322 is wider relative to the top of the grid structure 322. In some implementations, the particular angle of the sidewalls may be based on an amount of incident light that the grid structure 322 is to block (e.g., a greater angle may block a lesser amount of light relative to a smaller angle).

The grid structure 322 may include a plurality of layers over and/or on the layer stack 314. The grid structure 322 may include one or more metal layers (or metal-containing layers) and one or more dielectric layers, and may be referred to a composite metal grid (CMG). For example, the grid structure 322 may include a titanium nitride (TiN) layer 324 on and/or over the third layer 320, and a tungsten layer 326 on and/or over the titanium nitride layer 324. The titanium nitride layer 324 may have a thickness of approximately 300 angstroms, and the tungsten layer 326 may have a thickness of approximately 2000 angstroms. In some implementations, other metals or metal-containing materials are included, such as titanium, tantalum, tantalum nitride, aluminum, tungsten, copper, copper alloy, alloys thereof, or combinations thereof. The titanium nitride layer 324 and the tungsten layer 326 may block incident light from passing between neighboring pixel sensors 302 to help reduce cross talk.

The grid structure 322 may include an oxide layer 328 on and/or over the tungsten layer 326, and a hard mask layer 330 on and/or over the oxide layer 328. In some implementations, the oxide layer 328 includes a silicon oxide (e.g., silicon dioxide ($SiO_2$)) or a hafnium oxide (e.g., hafnium dioxide ($HfO_2$)). In some implementations, the oxide layer 328 includes another type of material having a relatively low refractive index (e.g., lower than silicon) such that the oxide layer 328 may provide optical isolation between adjacent pixel sensors 302 and may provide increased quantum efficiency by reflecting incident light toward the photodiodes 306. The hard mask layer 330 may include a silicon nitride ($Si_xN_y$) layer or a silicon oxynitride (SiON) layer, among other examples. In some implementations, a thickness of the oxide layer 328 is approximately 600 angstroms. In some implementations, a thickness of the hard mask layer 330 is approximately 1400 angstroms.

Respective color filter regions 332 may be included in the areas between the grid structure 322. For example, a color filter region 332a may be formed in between columns of the grid structure 322 over the photodiode 306 of the pixel sensor 302a, a color filter region 332b may be formed in between columns of the grid structure 322 over the photodiode 306 of the pixel sensor 302b, a color filter region 332c may be formed in between columns of the grid structure 322 over the photodiode 306 of the pixel sensor 302c, and so on. Alternatively, the areas between the grid structure 322 may be completely filled with a passivation layer, and a color filter layer including the color filter regions 332 may be formed above the grid structure 322 on the passivation layer.

Each color filter region 332 may be configured to filter incident light to allow a particular wavelength of the incident light to pass to a photodiode 306 of an associated pixel sensor 302. For example, the color filter region 332a included in the pixel sensor 302a may filter red light for the pixel sensor 302a (and thus, the pixel sensor 302a may be a red pixel sensor), the color filter region 332b included in the pixel sensor 302b may filter green light for the pixel sensor 302b (and thus, the pixel sensor 302b may be a green pixel sensor), the color filter region 332c included in the pixel sensor 302c may filter blue light for the pixel sensor 302c (and thus, the pixel sensor 302c may be a blue pixel sensor), and so on.

A blue filter region may permit the component of incident light near a 450 nanometer wavelength to pass through a color filter region 332 and block other wavelengths from passing. A green filter region may permit the component of incident light near a 550 nanometer wavelength to pass through a color filter region 332 and block other wavelengths from passing. A red filter region may permit the component of incident light near a 650 nanometer wavelength to pass through a color filter region 332 and block other wavelengths from passing. A yellow filter region may permit the component of incident light near a 580 nanometer wavelength to pass through a color filter region 332 and block other wavelengths from passing.

In some implementations, a color filter region 332 may be non-discriminating or non-filtering, which may define a white pixel sensor. A non-discriminating or non-filtering color filter region 332 may include a material that permits all wavelengths of light to pass into the associated photodiode 306 (e.g., for purposes of determining overall brightness to increase light sensitivity for the image sensor). In some implementations, a color filter region 332 may be an MR bandpass color filter region, which may define a near infrared (NIR) pixel sensor. An MR bandpass color filter region 332 may include a material that permits the portion of incident light in an MR wavelength range to pass to an associated photodiode 306 while blocking visible light from passing.

A passivation liner 334 may be included on the sidewalls of the columns (or the openings) of the grid structure 322 between the sidewalls and the color filter regions 332. In some implementations, the passivation liner 334 is included on a top surface of the hard mask layer 330. In some implementations, the passivation liner 334 is omitted from a bottom surface of the grid structure 322 between the third layer 320 and the color filter regions 332 so that the passivation liner 334 is not in the optical path of the pixel sensors 302. The passivation liner 334 may be included on the sidewalls of the grid structure 322 to promote adhesion between the sidewalls of the grid structure 322 and the color filter regions 332 and reduces or prevents the sidewalls from being corroded by the color filter regions 332. In some implementations, the passivation liner 334 includes an oxide such as a silicon oxide ($SiO_x$), a silicon nitride ($Si_xN_y$), a silicon oxynitride (SiON), or another type of material.

A micro-lens layer 336 may be included above and/or on the color filter regions 332. The micro-lens layer 336 may include a respective micro-lens for each of the pixel sensors 302. For example, a micro-lens may be formed to focus incident light toward the photodiode 306 of the pixel sensor 302a, another micro-lens may be formed to focus incident light toward the photodiode 306 of the pixel sensor 302b, another micro-lens may be formed to focus incident light toward the photodiode 306 of the pixel sensor 302c, and so on.

As indicated above, FIG. 3 is provided as an example. Other examples may differ from what is described with regard to FIG. 3.

FIGS. 4A-4M are diagrams of an example implementation 400 described herein. Example implementation 400 may be an example process or method for forming the pixel array 300 having the layer stack 314 included therein to reduce and/or prevent ultraviolet radiation damage and/or etching damage to the photodiodes of the pixel sensors included therein. In some implementations, the various example techniques and procedures described in connection with FIGS. 4A-4M may be used in connection with other pixel arrays described herein, such as the pixel array 200, the pixel array 500 described in connection with FIG. 5, the pixel array 700 described in connection with FIG. 7, and/or the pixel array 900 described in connection with FIG. 9.

As shown in FIG. 4A, the pixel sensors 302 (e.g., the pixel sensor 302a, the pixel sensor 302b, the pixel sensor 302c, and so on) may be formed in the substrate 304. The substrate 304 may include a silicon substrate, a substrate formed of a material including silicon, a III-V compound semiconductor substrate such as gallium arsenide (GaAs) substrate, a silicon on insulator (SOI) substrate, or another type of substrate is capable of generating a charge from photons of incident light.

Figure 4B:
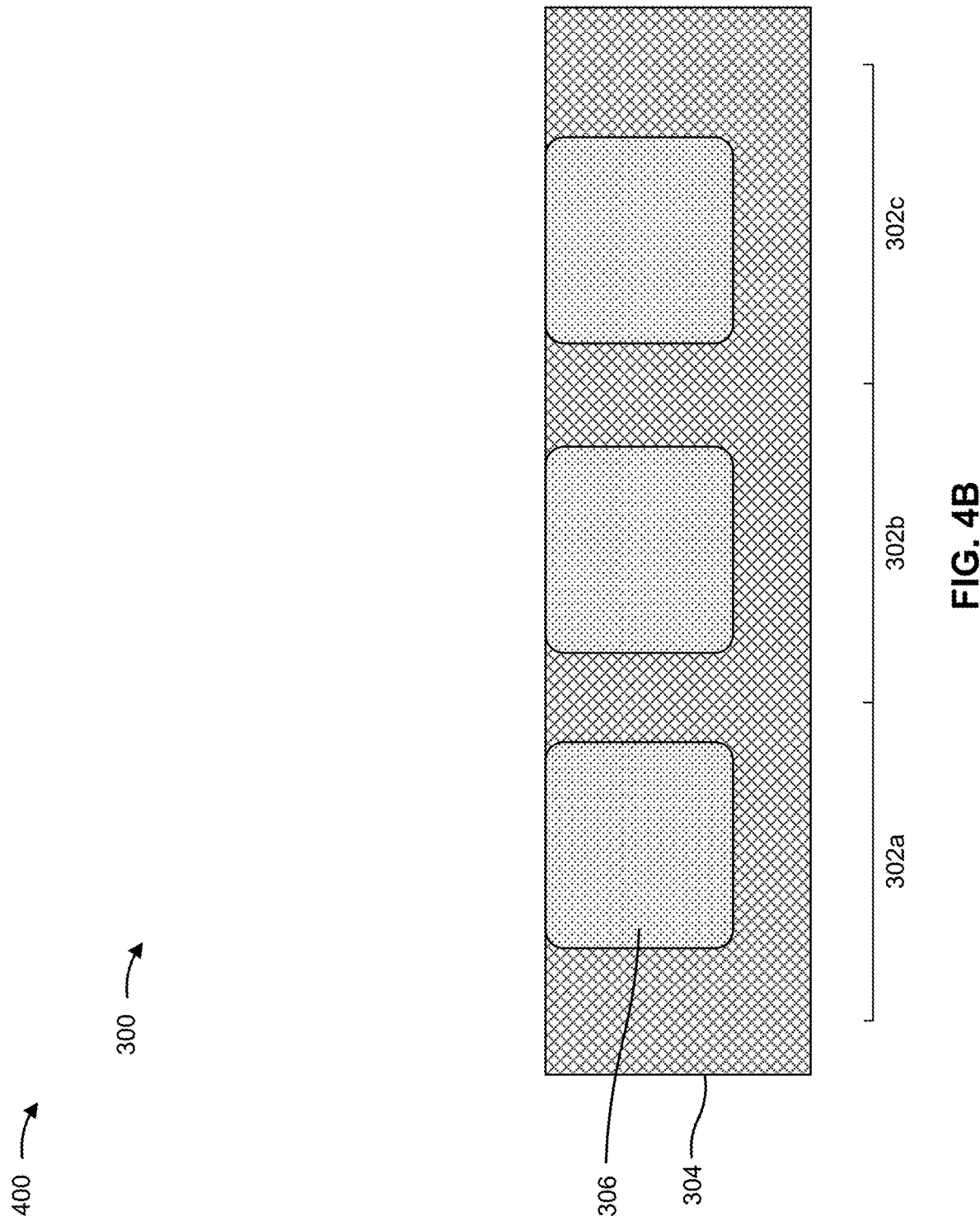

As shown in FIG. 4B, one or more semiconductor processing tools may form a plurality of photodiodes 306 in the substrate 304. For example, the ion implantation tool 114 may dope the portions of the substrate 304 using an ion implantation technique to form a respective photodiode 306 for a plurality of pixel sensors 302 (e.g., pixel sensors 302a-302c). The substrate 304 may be doped with a plurality of types of ions to form a p-n junction for each photodiode 306. For example, the substrate 304 may be doped with an n-type dopant to form a first portion (e.g., an n-type portion) of a photodiode 306 and a p-type dopant to form a second portion (e.g., a p-type portion) of the photodiode 306. In some implementations, another technique is used to form the photodiodes 306 such as diffusion.

Figure 4C:
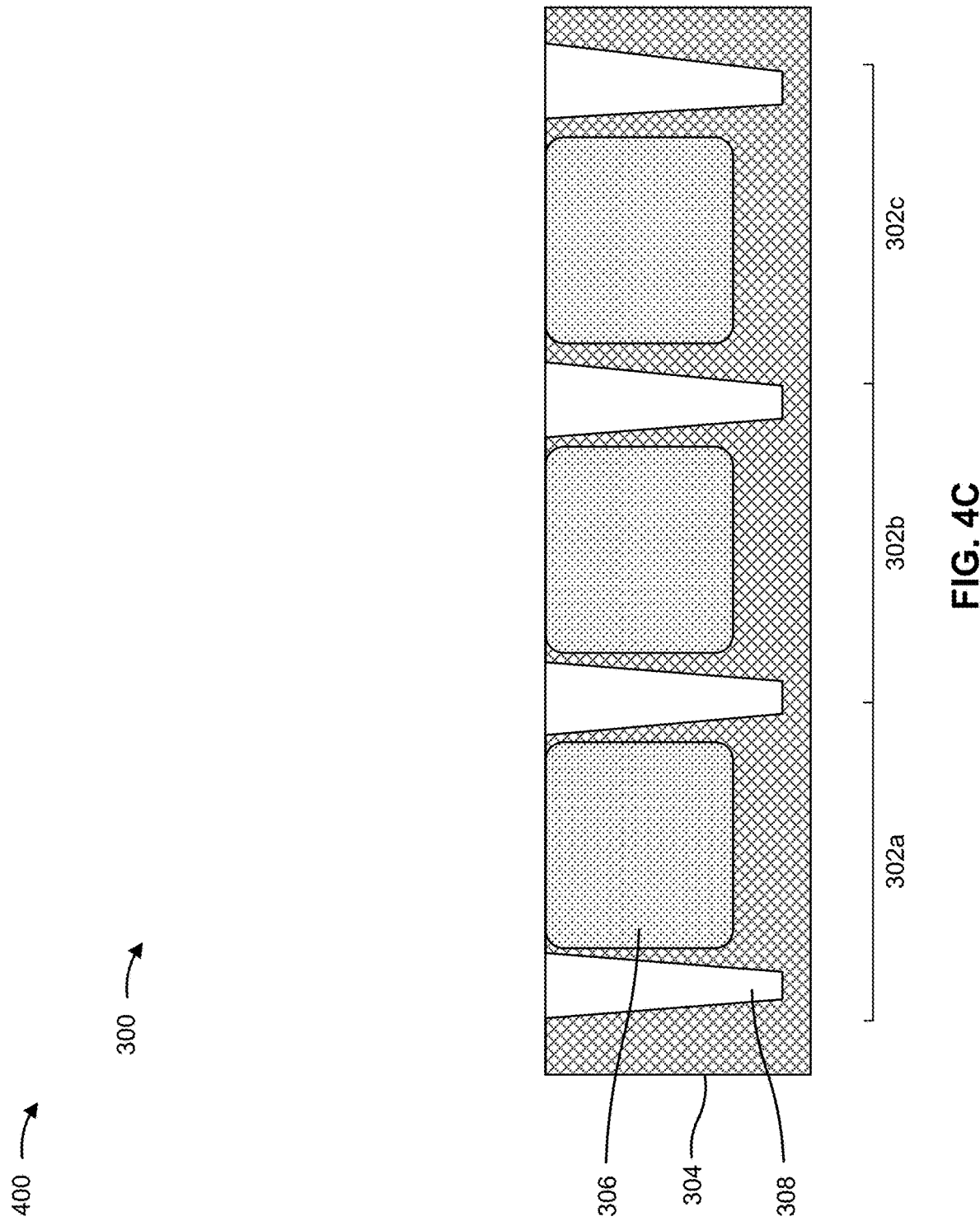

As shown in FIG. 4C, openings may be formed in the substrate 304 to form an isolation structure 308 (e.g., a DTI structure) in the substrate 304. In particular, the openings may be formed such that the isolation structure 308 may be formed between each of the photodiodes 306 of the pixel sensors 302. In some implementations, one or more semiconductor processing tools may be used to form the one or more openings for the isolation structure 308 in the substrate 304. For example, the deposition tool 102 may form a photoresist layer on the substrate 304, the exposure tool 104 may expose the photoresist layer to a radiation source to pattern the photoresist layer, the developer tool 106 may develop and remove portions of the photoresist layer to expose the pattern, and the etch tool 108 may etch portions of substrate 304 to form the openings for the isolation structure 308 in the substrate 304. In some implementations, a photoresist removal tool removes the remaining portions of the photoresist layer (e.g., using a chemical stripper and/or another technique) after the etch tool 108 etches the substrate 304.

Figure 4D:
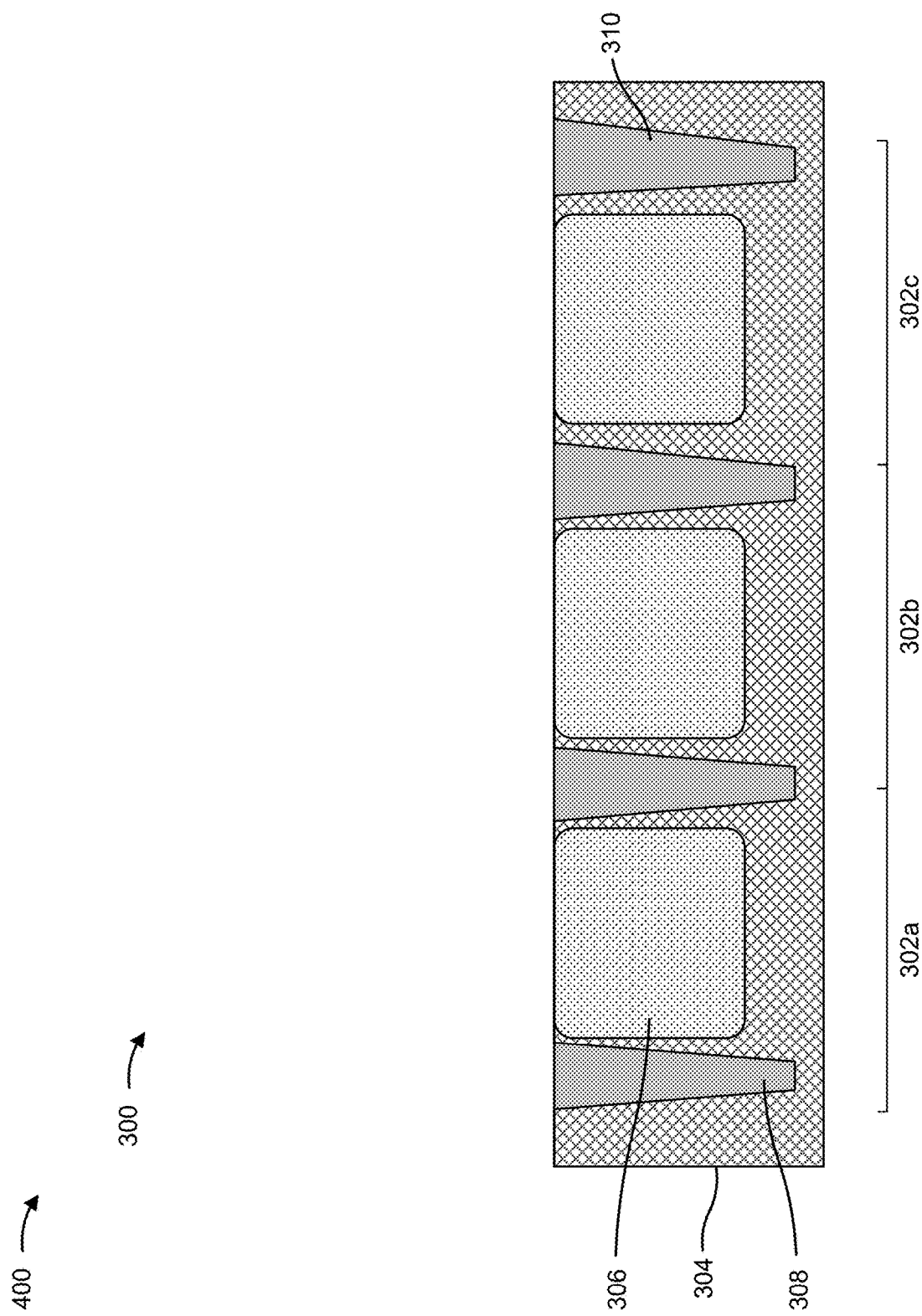

As shown in FIG. 4D, the isolation structure 308 may be filled with an oxide layer 310. In particular, a semiconductor processing tool (e.g., the deposition tool 102) may deposit the oxide layer 310 (e.g., a silicon oxide ($SiO_x$), a tantalum oxide ($Ta_xO_y$), or another type of oxide) such that the oxide layer 310 is formed in the isolation structure 308. The semiconductor processing tool may deposit the oxide layer 310 using various PVD techniques, CVD techniques and/or ALD techniques, such as sputtering, PECVD, HDP-CVD, SACVD, or PEALD.

Figure 4E:
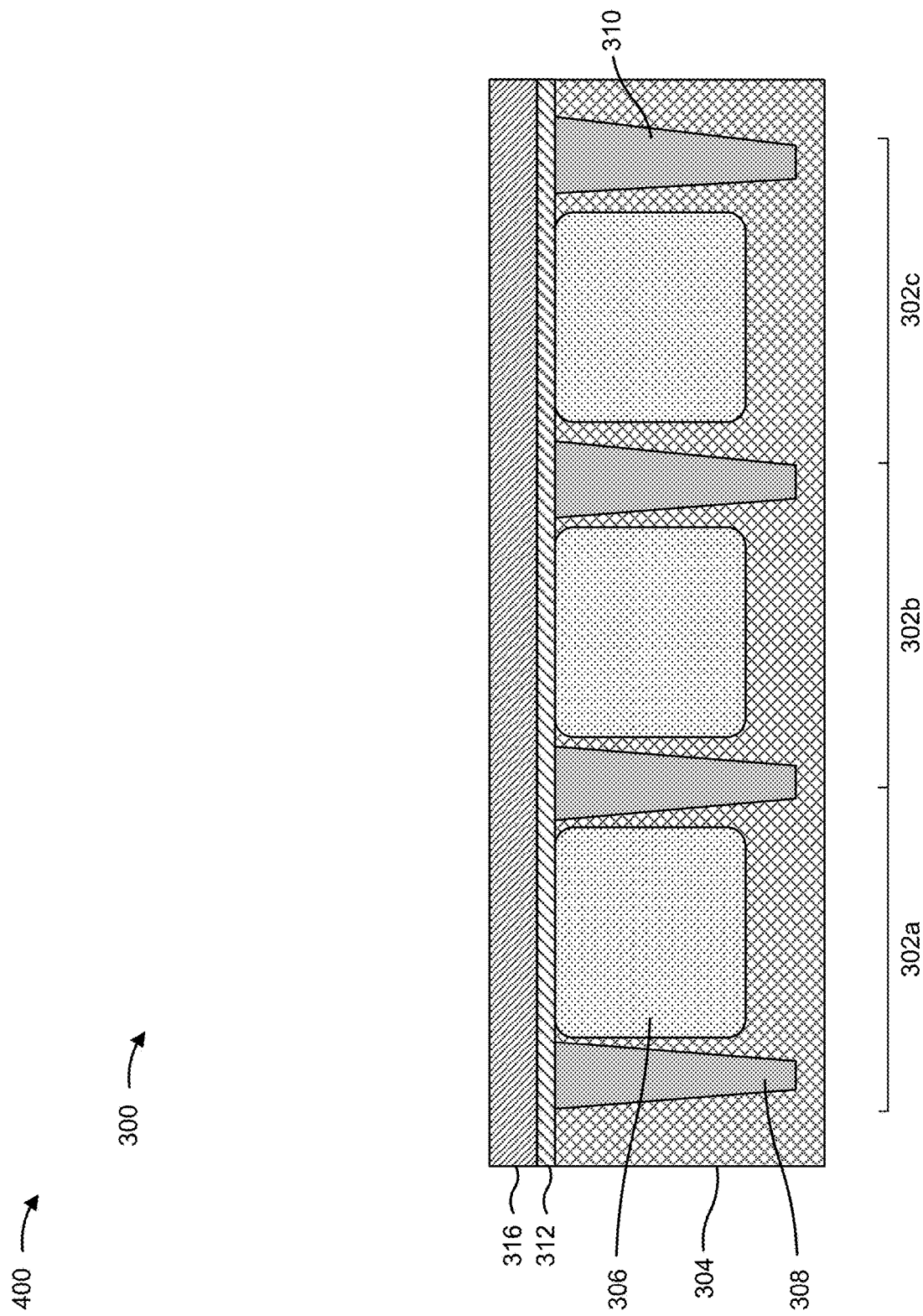

As shown in FIG. 4E, the high-k dielectric layer 312 may be formed over and/or on the substrate 304, over and/or on the isolation structure 308, and/or over and/or on the photodiodes 306. In particular, a semiconductor processing tool (e.g., the deposition tool 102) may deposit the high-k dielectric layer 312 using various PVD techniques, CVD techniques and/or ALD techniques, such as sputtering, PECVD, HDP-CVD, SACVD, or PEALD. In some implementations, the planarization tool 110 may planarize the high-k dielectric layer 312 after the high-k dielectric layer 312 is deposited.

As further shown in FIG. 4E, the first layer 316 of the layer stack 314 may be formed over and/or on the high-k dielectric layer 312. In particular, a semiconductor processing tool (e.g., the deposition tool 102) may deposit the first layer 316 using various PVD techniques, CVD techniques and/or ALD techniques, such as sputtering, PECVD, HDP-CVD, SACVD, or PEALD. In some implementations, the first layer 316 may be formed to a thickness of approximately 1000 angstroms. In some implementations, other layers such as a silicon nitride ($Si_xN_y$) layer may be formed over and/or on the first layer 316 as part of a buried color filter array (BCFA) process.

Figure 4F:
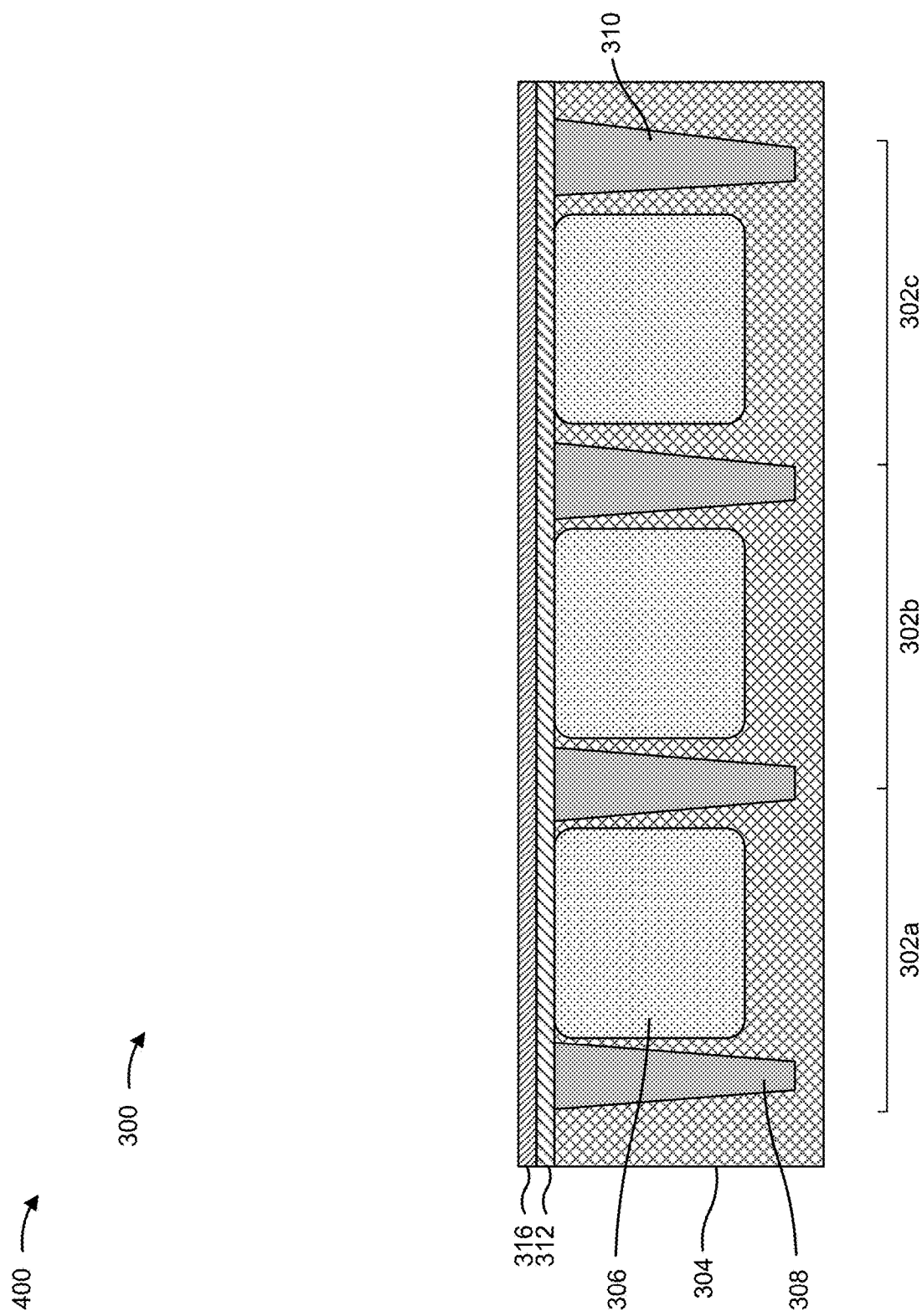

As shown in FIG. 4F, one or more etching operations may be performed on the pixel array 300 to reduce the thickness of the first layer 316, which may increase the quantum efficiency of the pixel array 300. For example, the etch tool 108 may perform a dry etch of the first layer 316 (and other layers on the first layer 316, if included) to reduce the thickness of the first layer 316 (e.g., to approximately 800 angstroms). As another example, the etch tool 108 may perform a wet etch of the first layer 316 (e.g., after the dry etch is performed) to further reduce the thickness of the first layer 316 (e.g., to approximately 300 angstroms). Alternatively, the first layer 316 may be deposited to the finished thickness (e.g., of approximately 300 angstroms).

Figure 4G:
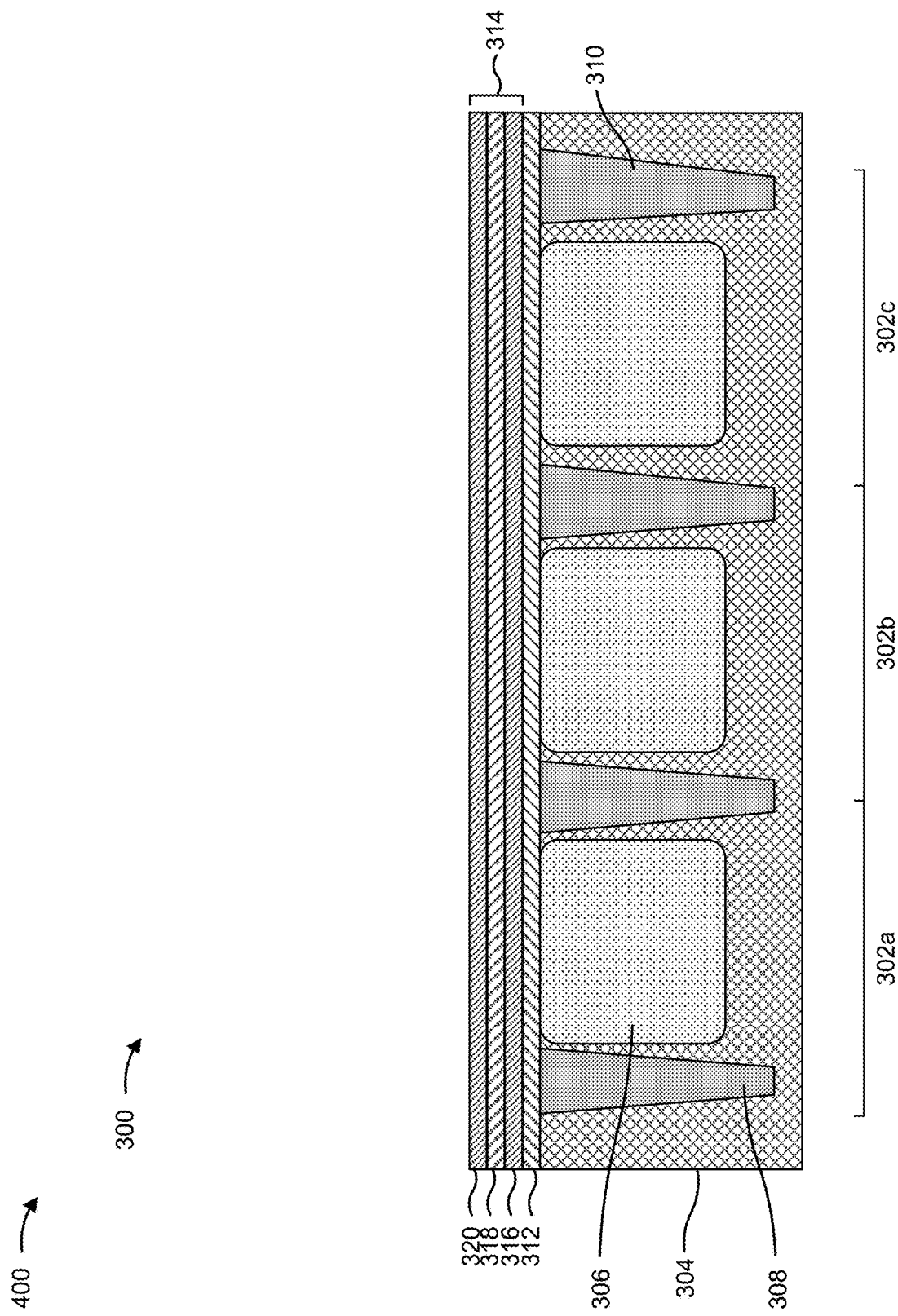

As shown in FIG. 4G, the remaining layers of the layer stack 314 may be formed over and/or on the first layer 316. For example, a semiconductor processing tool (e.g., the deposition tool 102) may deposit the second layer 318 over and/or on the first layer 316 using various PVD techniques, CVD techniques and/or ALD techniques, such as sputtering, PECVD, HDP-CVD, SACVD, or PEALD. As another example, a semiconductor processing tool (e.g., the deposition tool 102) may deposit the third layer 320 over and/or on the second layer 318 using various PVD techniques, CVD techniques and/or ALD techniques, such as sputtering, PECVD, HDP-CVD, SACVD, or PEALD. In some implementations, the planarization tool 110 may planarize the second layer 318 after the second layer 318 is deposited and prior to formation of the third layer 320. In some implementations, the planarization tool 110 may planarize the third layer 320 after the third layer 320 is deposited.

Figure 4H:
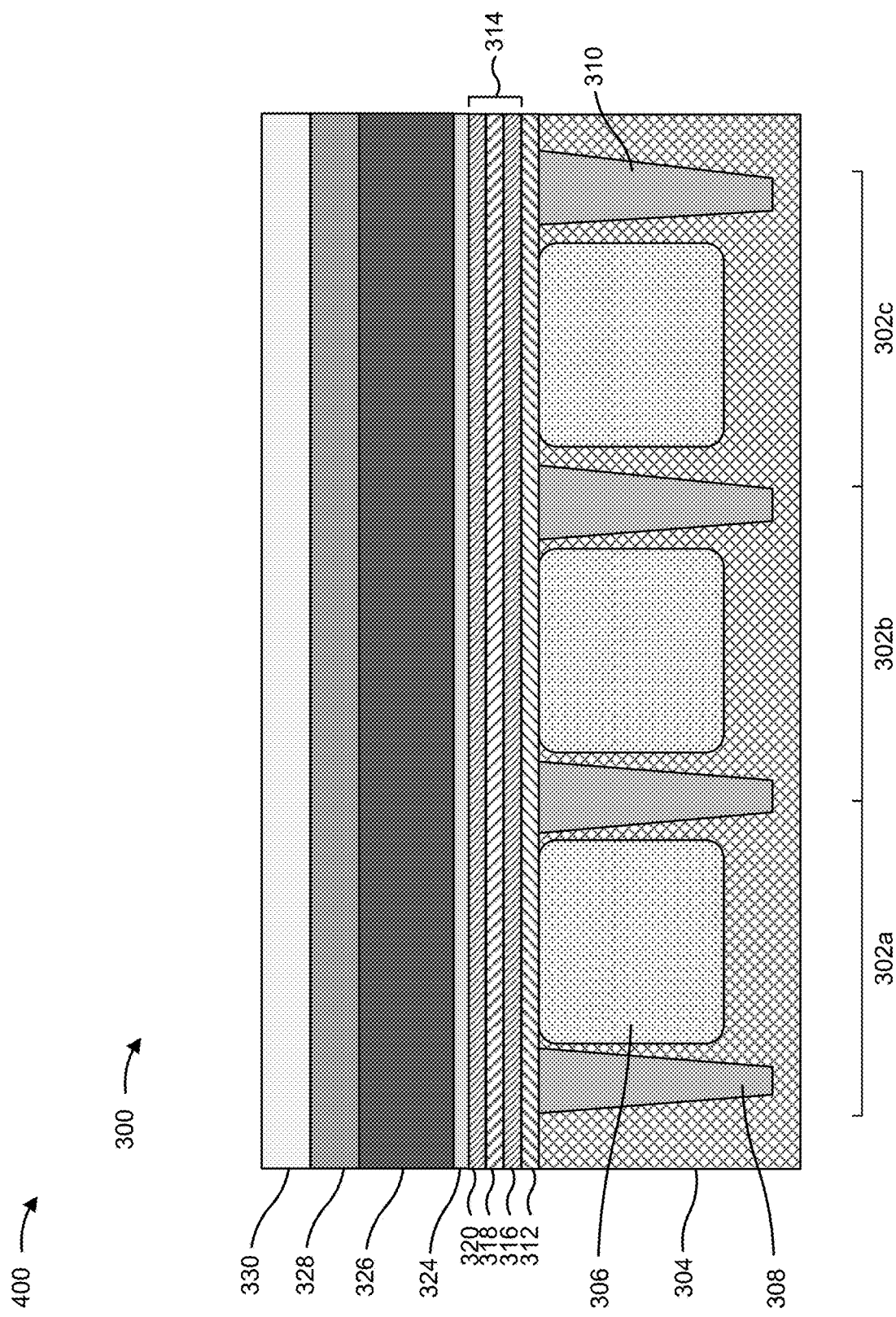

As shown in FIG. 4H, a plurality of layers may be formed over and/or on the layer stack 314 as part of forming the grid structure 322. The plurality of layers may include, for example, the titanium nitride ($TiN_x$) layer 324, the tungsten (W) layer 326, the oxide layer 328, and the hard mask layer 330. The deposition tool 102 and/or the plating tool 112 may deposit the titanium nitride layer 324 over and/or on the third layer 320. The deposition tool 102 and/or the plating tool 112 may deposit the tungsten layer 326 over and/or on the titanium nitride layer 324. The deposition tool 102 may deposit the titanium nitride layer 324 and/or the tungsten layer 326 using various PVD techniques, CVD techniques and/or ALD techniques, such as sputtering, PECVD, HDP-CVD, SACVD, or PEALD. The plating tool 112 may deposit the titanium nitride layer 324 and/or the tungsten layer 326 using an electroplating technique and/or an electroless plating technique.

The deposition tool 102 may deposit the oxide layer 328 over and/or on the tungsten layer 326. The deposition tool 102 may deposit the hard mask layer 330 over and/or on the oxide layer 328. The deposition tool 102 may deposit the oxide layer 328 and/or the hard mask layer 330 using various PVD techniques, CVD techniques and/or ALD techniques, such as sputtering, PECVD, HDP-CVD, SACVD, or PEALD.

Figure 4I:
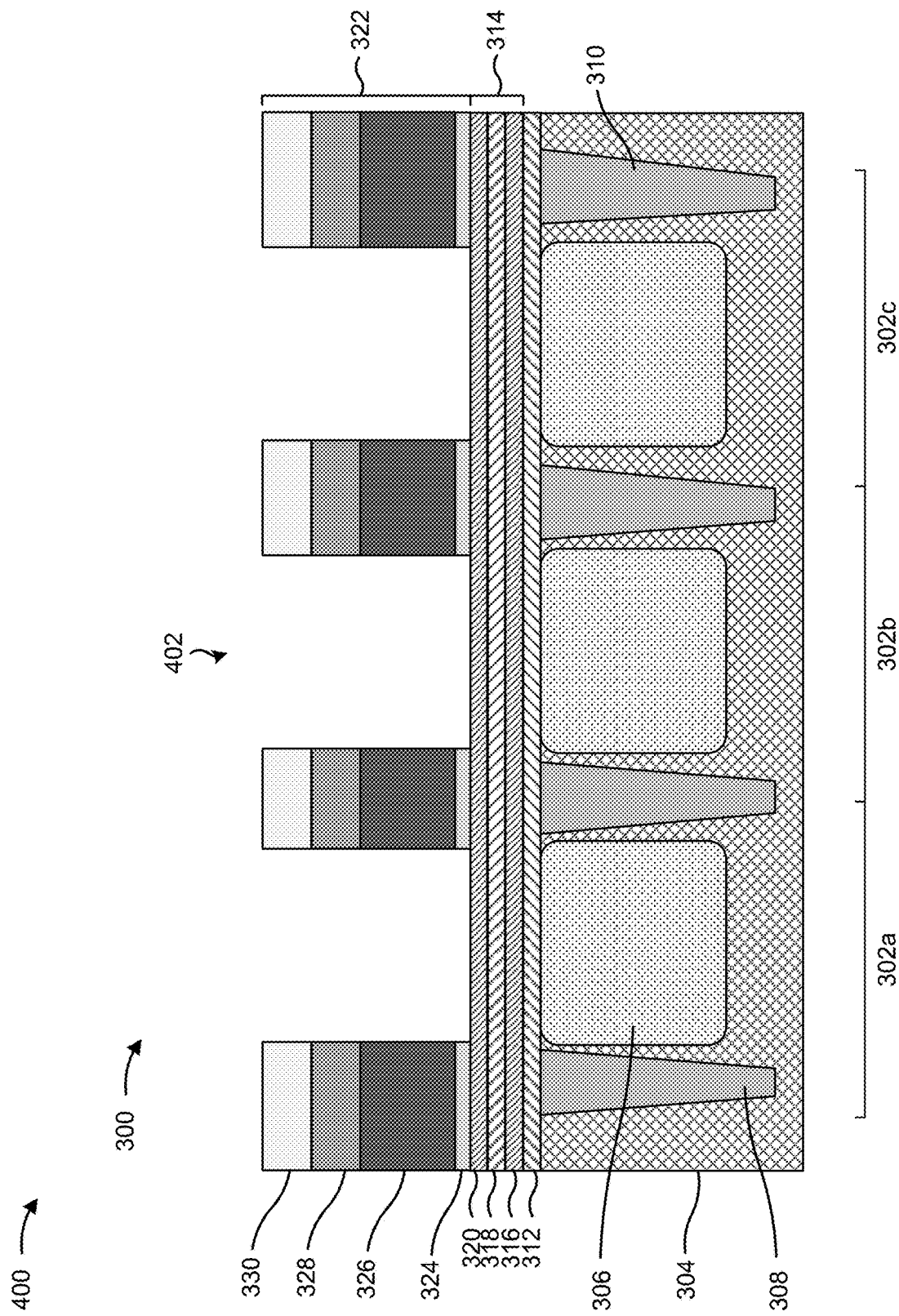

As shown in FIG. 4I, openings 402 may be formed in the plurality of layers to form the grid structure 322. The openings 402 may be formed over the photodiodes 306 of the pixel sensors 302 such that color filter regions may be filled in the openings 402. In some implementations, the opening 402 and the grid structure 322 are formed using a photoresist (e.g., deposited by the deposition tool 102), where a pattern in the photoresist is formed by exposing the photoresist to a radiation source (e.g., using the exposure tool 104) and removing either the exposed portions or the non-exposed portions of the photoresist (e.g., using developer tool 106). In some implementations, the openings 402 and the grid structure 322 are formed using the hard mask layer 330 to define the openings 402. In these examples, the pattern may be formed in the hard mask layer 330, and the etching tool 108 etches the openings 402 through the oxide layer 328, through the tungsten layer 326, through the titanium nitride layer 324, and to the third layer 320 based on the pattern in the hard mask layer 330.

Figure 4J:
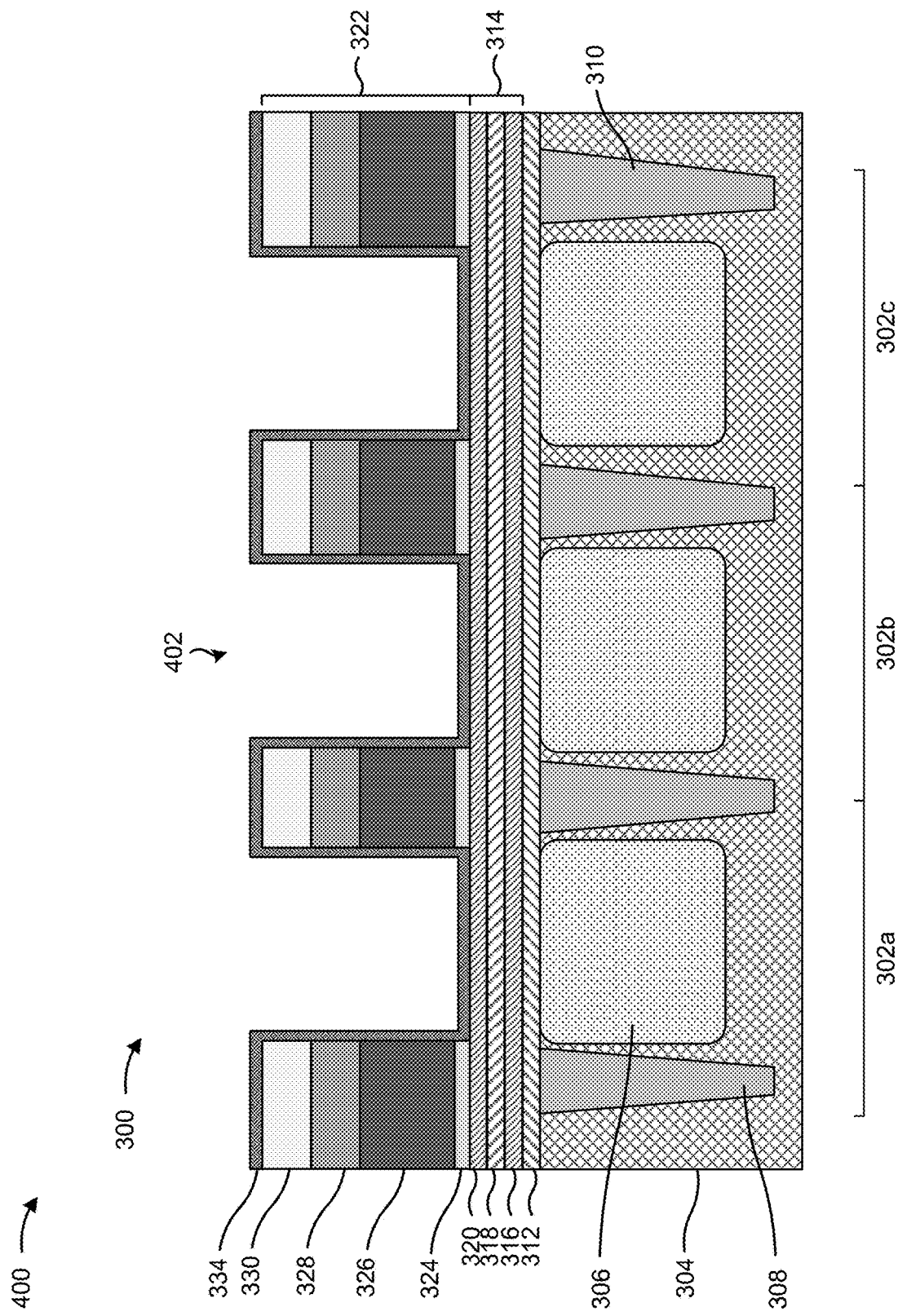

As shown in FIG. 4J, the passivation liner 334 may be formed over and/or on the hard mask layer 330, over and/or on the sidewalls of the grid structure 322 in the openings 402, and over and/or on the third layer 320 in the openings 402. A semiconductor processing tool (e.g., the deposition tool 102) may conformally deposit the passivation liner 334 using various PVD techniques, CVD techniques and/or ALD techniques, such as sputtering, PECVD, HDP-CVD, SACVD, or PEALD. The passivation liner 334 may be conformally deposited to a thickness in a range of approximately 10 angstroms to approximately 200 angstroms.

Figure 4K:
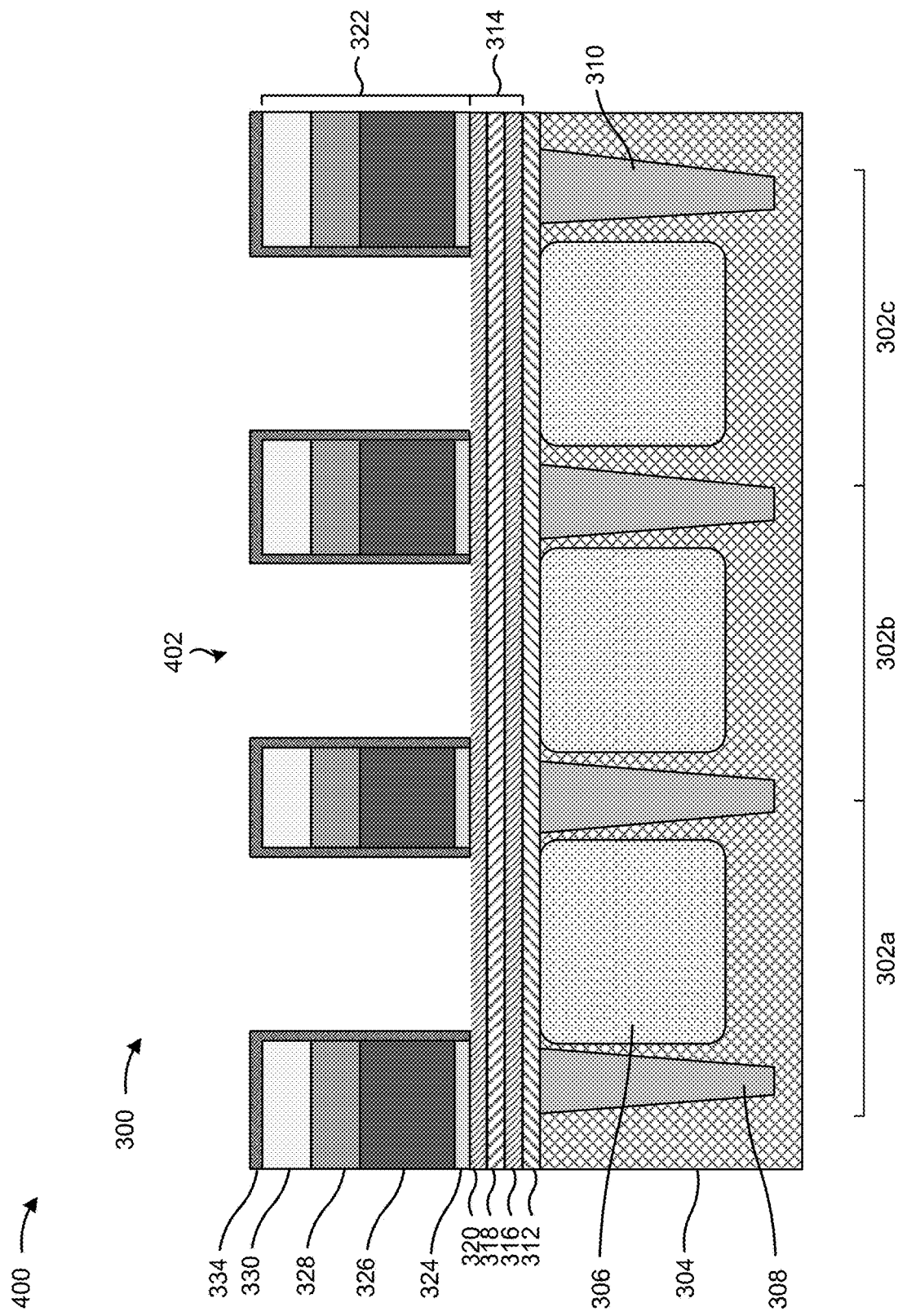

As shown in FIG. 4K, portions of the passivation liner 334 may be removed from the third layer 320 in the openings 402 such that the impact of the passivation liner 334 on the quantum efficiency of the pixel sensors 302 is reduced. The etch tool 108 may perform a dry etch and/or a wet etch to remove the portions of the passivation liner 334 from the third layer 320 in the openings 402.

Figure 4L:
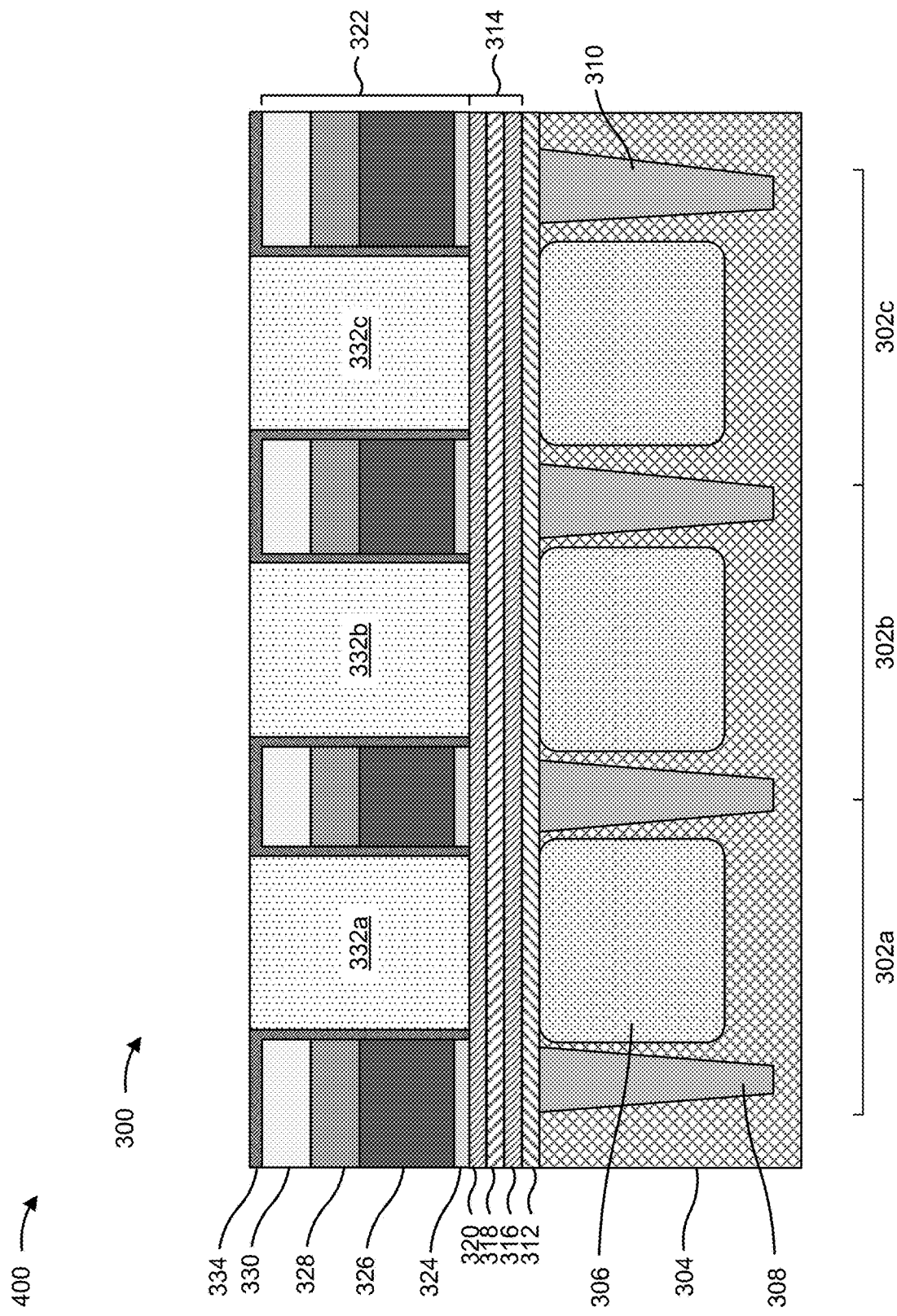

As shown in FIG. 4L, respective color filter regions 332 may be formed for each of the pixel sensors 302 in the pixel array 300 in the openings 402. For example, the color filter region 332a may be formed in an opening 402 above the photodiode 306 for the pixel sensor 302a, a color filter region 332b may be formed in an opening 402 above the photodiode 306 for the pixel sensor 302b, a color filter region 332c may be formed in an opening 402 above the photodiode 306 for the pixel sensor 302c, and so on. Each color filter region 332 may be formed in between the grid structure 322 to reduce color mixing between adjacent pixel sensors 302. A semiconductor processing tool (e.g., the deposition tool 102) may deposit the color filter regions 332 using various PVD techniques, CVD techniques and/or ALD techniques, such as sputtering, PECVD, HDP-CVD, SACVD, or PEALD.

Figure 4M:
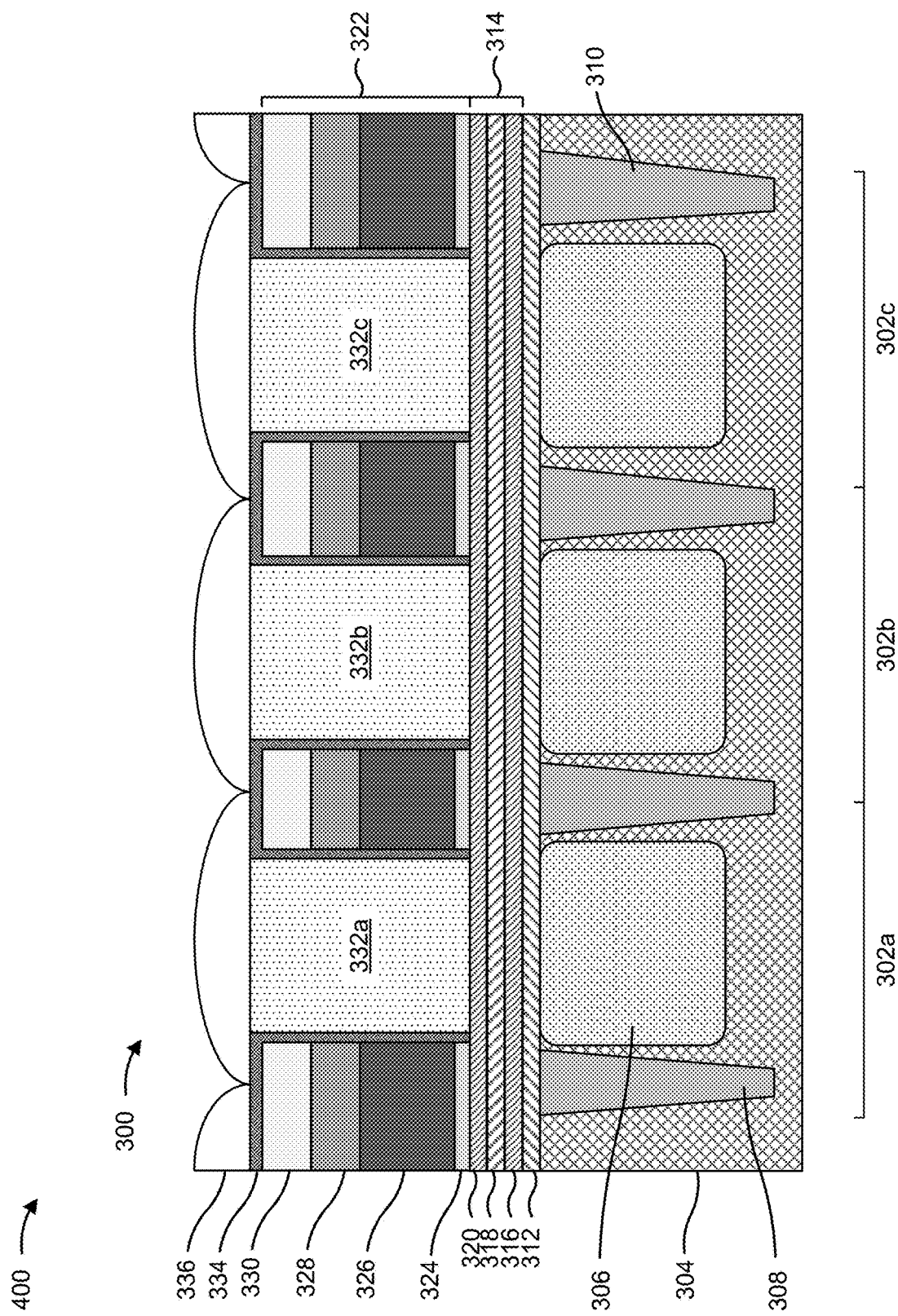

As shown in FIG. 4M, the micro-lens layer 336 including a plurality of micro-lenses is formed over and/or on the color filter regions 332. The micro-lens layer 336 may include a respective micro-lens for each of the pixel sensors 302 included in the pixel array 300. For example, a micro-lens may be formed over and/or on the color filter region 332a of the pixel sensor 302a, a micro-lens may be formed over and/or on the color filter region 332b of the pixel sensor 302b, a micro-lens may be formed over and/or on the color filter region 332c of the pixel sensor 302c, and so on.

As indicated above, FIGS. 4A-4M are provided as an example. Other examples may differ from what is described with regard to FIGS. 4A-4M.

Figure 5:
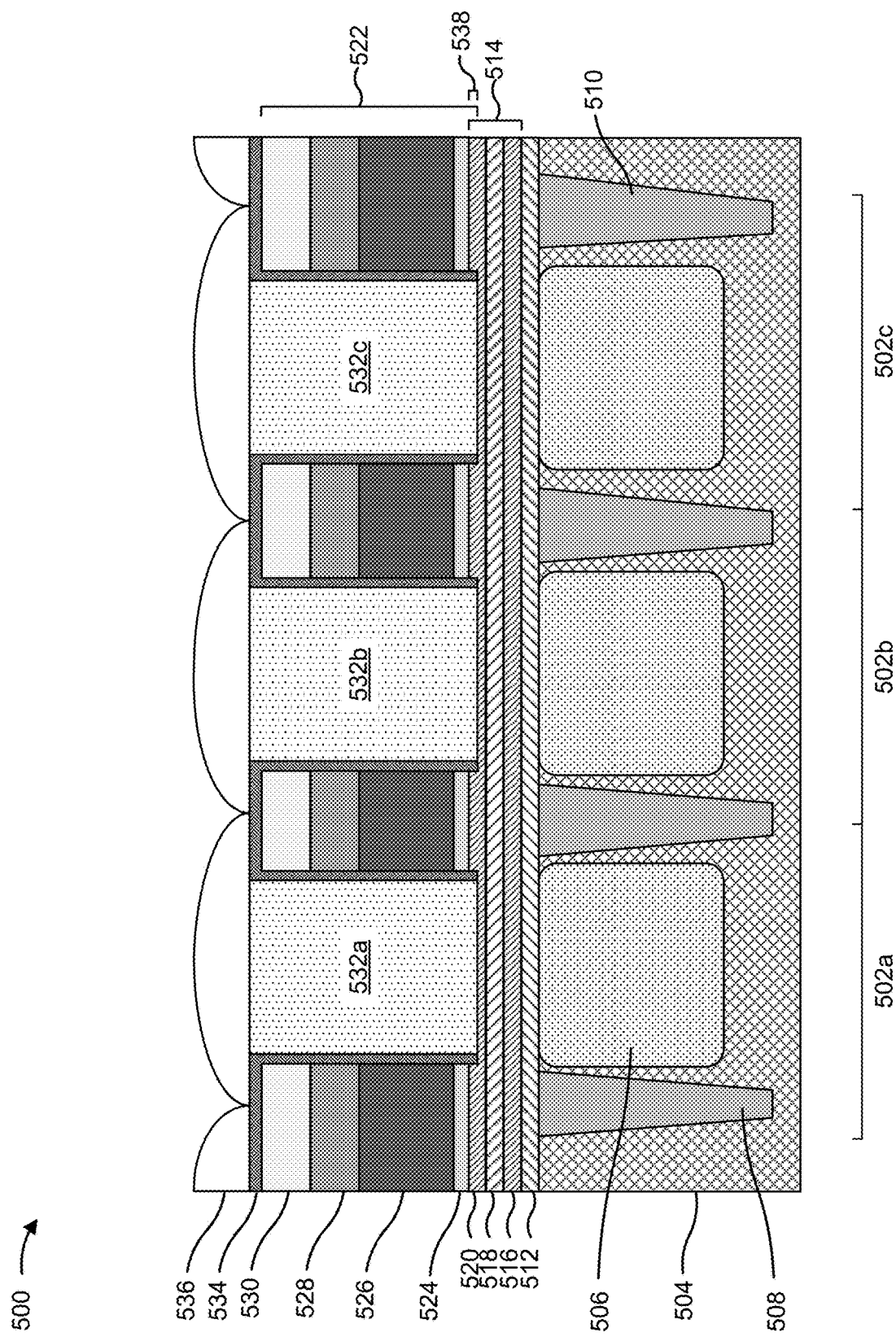
FIG. 5 is a diagram of an example pixel array described herein.

FIG. 5 is a diagram of an example pixel array 500 described herein. The pixel array 500 may be similar to the pixel array 300 and may include similar layers and/or structures. However, the pixel array 500 further includes over-etch regions through a portion of the thickness of the third layer in the layer stack. The over-etch regions may result from etching the openings to form the grid structure. In particular, the over-etch regions may result from etching the openings partially into the third layer to ensure that the openings are fully formed through the titanium nitride layer. This may prevent a quantum efficiency reduction that might otherwise occur if a portion of the titanium nitride layer were to remain on the third layer (e.g., because the titanium nitride layer might otherwise reflect incident light away from the photodiodes of the pixel sensors).

In some implementations, the example pixel array 500 illustrated in FIG. 5 may include, or may be included in, the pixel array 200 (or a portion thereof). In some implementations, the pixel array 500 may be included in an image sensor. The image sensor may include a CMOS image sensor, a BSI CMOS image sensor, or another type of image sensor.

As shown in FIG. 5, the pixel array 500 may include a plurality of adjacent pixel sensors 502 formed in a substrate 504, such as pixel sensors 502a-502c. Each pixel sensor 502 may include a photodiode 506. An isolation structure 508 may be included in the substrate 504 between adjacent pixel sensors 502 and filled with an oxide layer 510. A high-k dielectric layer 512 may be included on the substrate 504 and over the photodiodes 506 and the isolation structure 508.

A layer stack 514 may be included over and/or on the high-k dielectric layer 512. The layer stack 514 may be configured to further increase dark current performance and/or white pixel performance by reducing and/or preventing damage to the photodiodes 506 that might otherwise result from radiation damage, plasma processing, and/or etching of various layers and/or structures of the pixel array 500. The layer stack 514 may include a first layer 516 over and/or on the high-k dielectric layer 512. The first layer 516 may include an oxide material and may be referred to as an oxide layer. The layer stack 514 may include a second layer 518 over and/or on the first layer 516. The second layer 518 may include a material having a band gap that is lower than the band gap of the material of the first layer 516 such as a silicon nitride. For example, the second layer 518 may include a material having a band gap that is less than approximately 8.8 eV such as a silicon nitride ($Si_xN_y$). The layer stack 514 may include a third layer 520 over and/or on the second layer 518. The third layer 520 may include an oxide material and may be referred to as an oxide layer. The oxide material may include a silicon oxide ($SiO_x$) or another type of oxide having a relatively high band gap, and a band gap that is greater than the band gap of the second layer 518. As an example, the third layer 520 may include silicon dioxide ($SiO_2$) and may have a band gap of approximately 8.8 eV.

A grid structure 522 may be included over and/or on the layer stack 514 (e.g., the oxide-nitride-oxide layer stack) and may surround the perimeters of the pixel sensors 502. The grid structure 522 may include a plurality of layers over and/or on the layer stack 514. The grid structure 522 may include one or more metal layers (or metal-containing layers) and one or more dielectric layers, and may be referred to a CMG. For example, the grid structure 522 may include a titanium nitride (TiN) layer 524 on and/or over the third layer 520, and a tungsten layer 526 on and/or over the titanium nitride layer 524. As another example, the grid structure 522 may include an oxide layer 528 on and/or over the tungsten layer 526, and a hard mask layer 530 on and/or over the oxide layer 528.

Respective color filter regions 532 may be included in the areas between the grid structure 522. For example, a color filter region 532a may be formed in between columns of the grid structure 522 over the photodiode 506 of the pixel sensor 502a, a color filter region 532b may be formed in between columns of the grid structure 522 over the photodiode 506 of the pixel sensor 502b, a color filter region 532c may be formed in between columns of the grid structure 522 over the photodiode 506 of the pixel sensor 502c, and so on. A passivation liner 534 may be included on the sidewalls of the columns (or the openings) of the grid structure 522 between the sidewalls and the color filter regions 532. In some implementations, the passivation liner 534 is included on a top surface of the hard mask layer 530. In some implementations, the passivation liner 534 is omitted from a bottom surface of the grid structure 522 between the third layer 520 and the color filter regions 532 so that the passivation liner 534 is not in the optical path of the pixel sensors 502.

A micro-lens layer 536 may be included above and/or on the color filter regions 532. The micro-lens layer 536 may include a respective micro-lens for each of the pixel sensors 502. For example, a micro-lens may be formed to focus incident light toward the photodiode 506 of the pixel sensor 502a, another micro-lens may be formed to focus incident light toward the photodiode 506 of the pixel sensor 502b, another micro-lens may be formed to focus incident light toward the photodiode 506 of the pixel sensor 502c, and so on.

As described above, the grid structure 522 may extend at least partially into the third layer 520 of the layer stack 514. In particular, the openings of the grid structure 522 may extend into a portion 538 of the thickness of the third layer 520 (referred to as an over-etch region) to ensure that the openings are fully etched through the titanium nitride layer 524. Accordingly, a portion of the color filter regions 532 and a portion of the passivation liner 534 may be included in the portion 538 in the third layer 520.

As indicated above, FIG. 5 is provided as an example. Other examples may differ from what is described with regard to FIG. 5.

FIGS. 6A-6F are diagrams of an example implementation 600 described herein. Example implementation 600 may be an example process or method for forming the pixel array 500 having the layer stack 514 included therein to reduce and/or prevent ultraviolet radiation damage and/or etching damage to the photodiodes of the pixel sensors included therein.

Figure 6A:
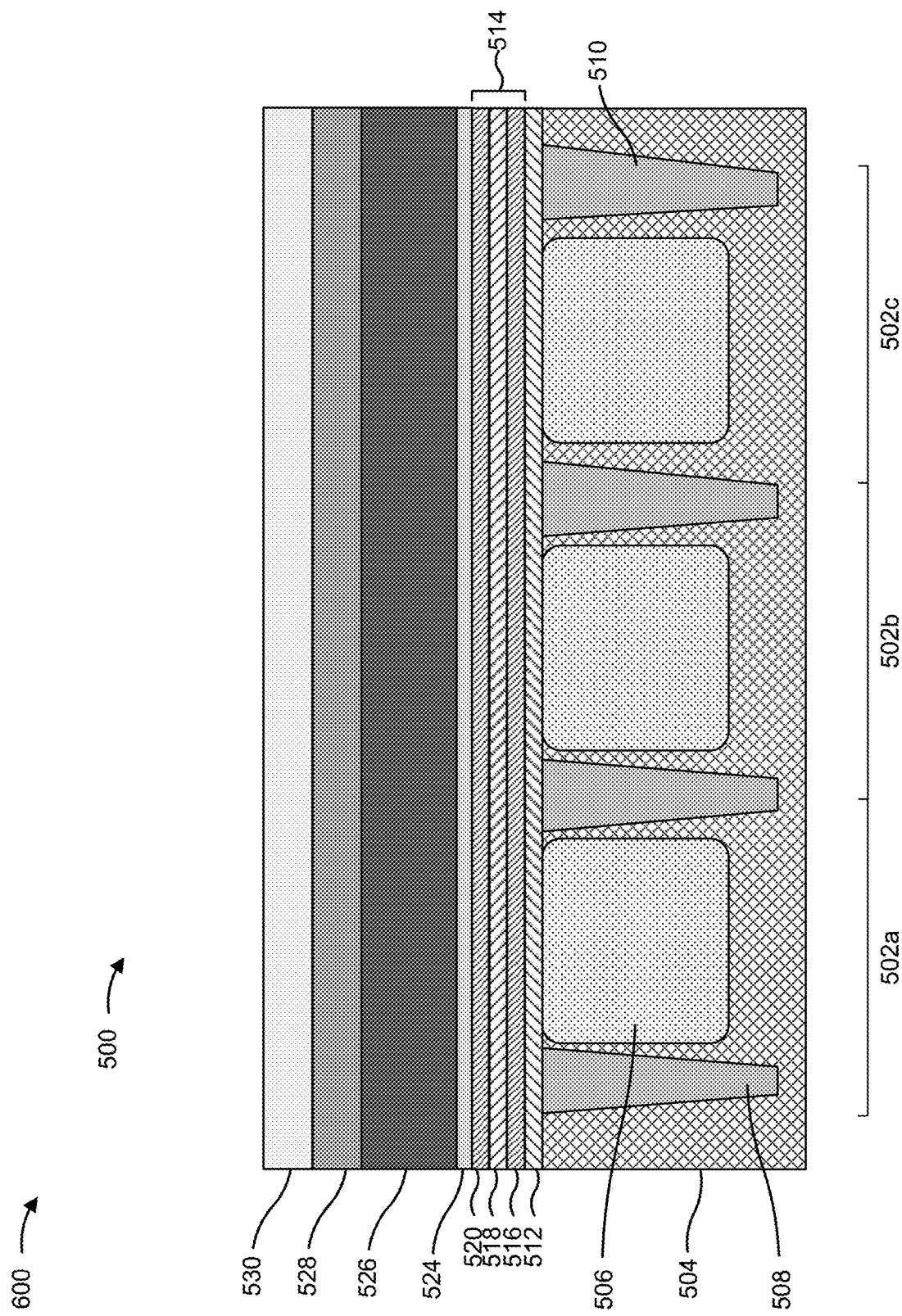
FIGS. 6A-6F are diagrams of an example implementation described herein.

As shown in FIG. 6A, the photodiodes 506, the isolation structures 508, the oxide layer 510, the high-k dielectric layer 512, the layer stack 514 (including the first layer 516, the second layer 518, and the third layer 520), the titanium nitride layer 524, the tungsten layer 526, the oxide layer 528, and the hard mask layer 530 may be formed in a similar manner as described above in connection with FIGS. 4A-4H.

Figure 6B:
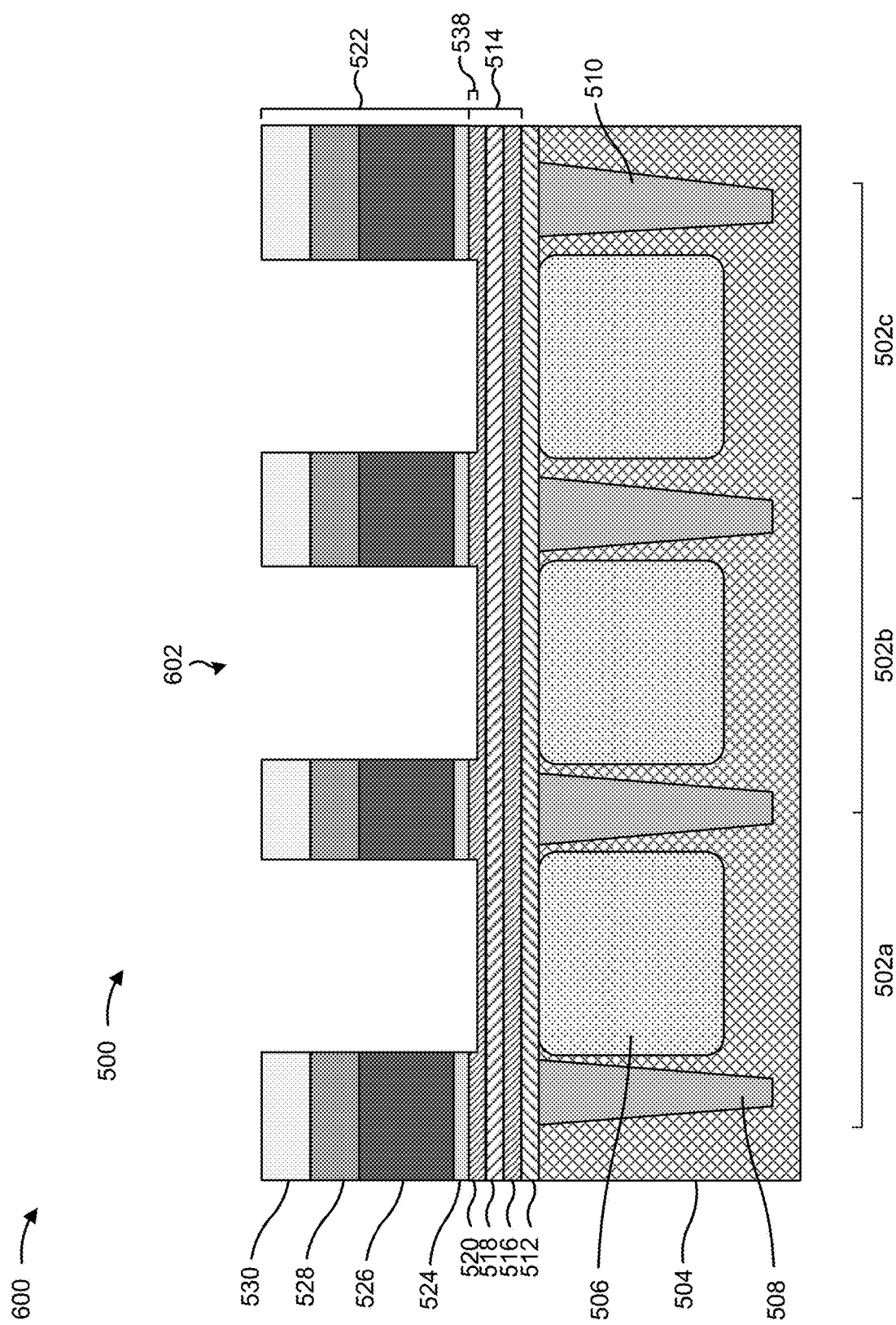

As shown in FIG. 6B, openings 602 may be formed in the plurality of layers to form the grid structure 522. The openings 602 may be formed over the photodiodes 506 of the pixel sensors 502 such that color filter regions may be filled in the openings 602. In some implementations, the opening 602 and the grid structure 522 are be formed using a photoresist (e.g., deposited by the deposition tool 102), where a pattern in the photoresist is formed by exposing the photoresist to a radiation source (e.g., using the exposure tool 104) and removing either the exposed portions or the non-exposed portions of the photoresist (e.g., using developer tool 106). In some implementations, the openings 602 and the grid structure 522 are formed using the hard mask layer 530 to define the openings 602. In these examples, the pattern may be formed in the hard mask layer 530, and the etching tool 108 etches the openings 602 through the oxide layer 528, through the tungsten layer 526, through the titanium nitride layer 524, and into at least the portion 538 of the third layer 520 based on the pattern in the hard mask layer 530. In some implementations, the portion 538 may extend into the third layer 520 from a top surface of the third layer 520 approximately 200 angstroms to approximately 350 angstroms to ensure that the tungsten layer 526 and the titanium nitride layer 524 are fully removed from the openings 602.

Figure 6C:
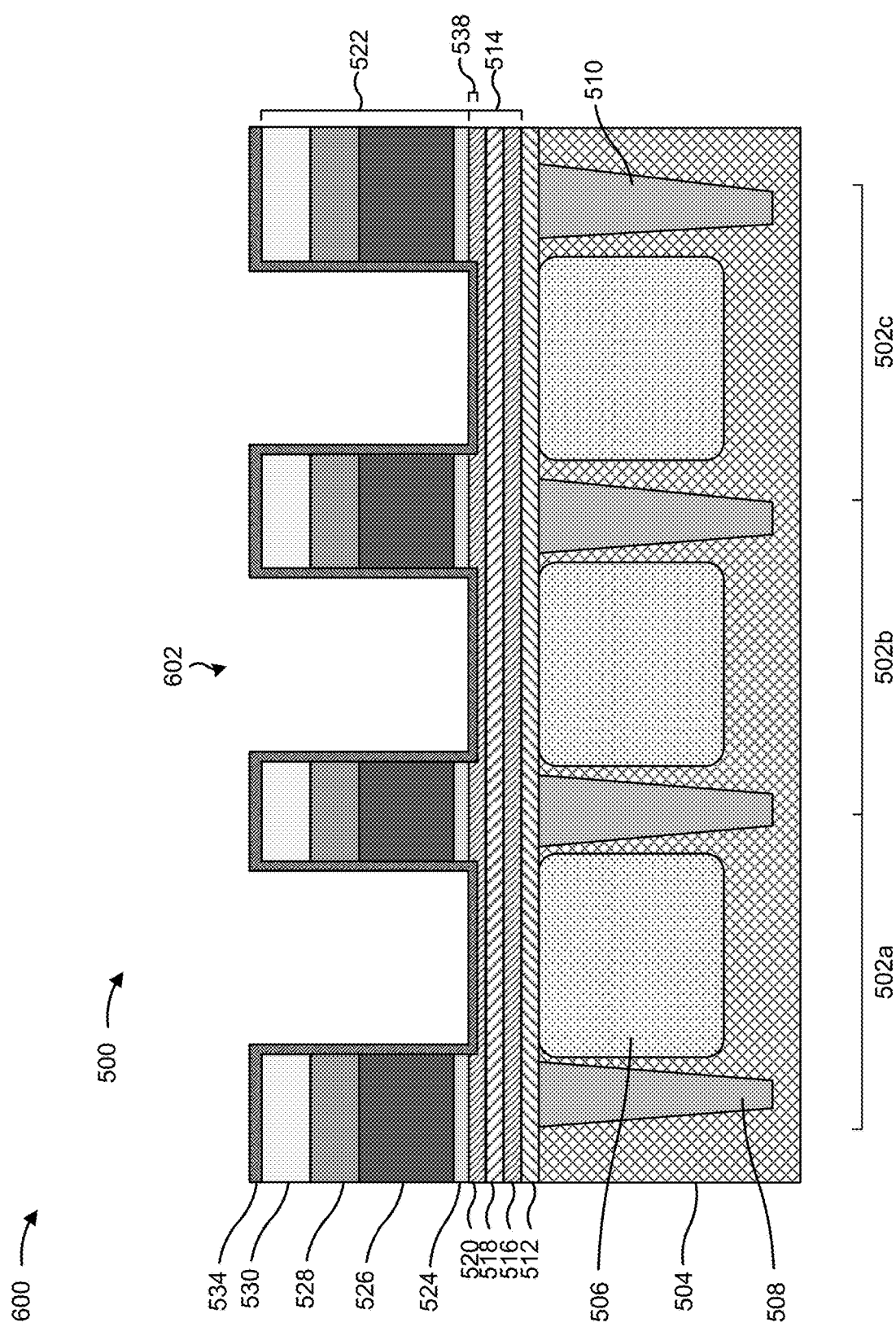

As shown in FIG. 6C, the passivation liner 534 may be formed over and/or on the hard mask layer 530, over and/or on the sidewalls of the grid structure 522 in the openings 602, and over and/or on the third layer 520 in the portion 538 etched into the third layer 520. A semiconductor processing tool (e.g., the deposition tool 102) may conformally deposit the passivation liner 534 using various PVD techniques, CVD techniques and/or ALD techniques, such as sputtering, PECVD, HDP-CVD, SACVD, or PEALD. The passivation liner 534 may be conformally deposited to a thickness in a range of approximately 10 angstroms to approximately 200 angstroms.

Figure 6D:
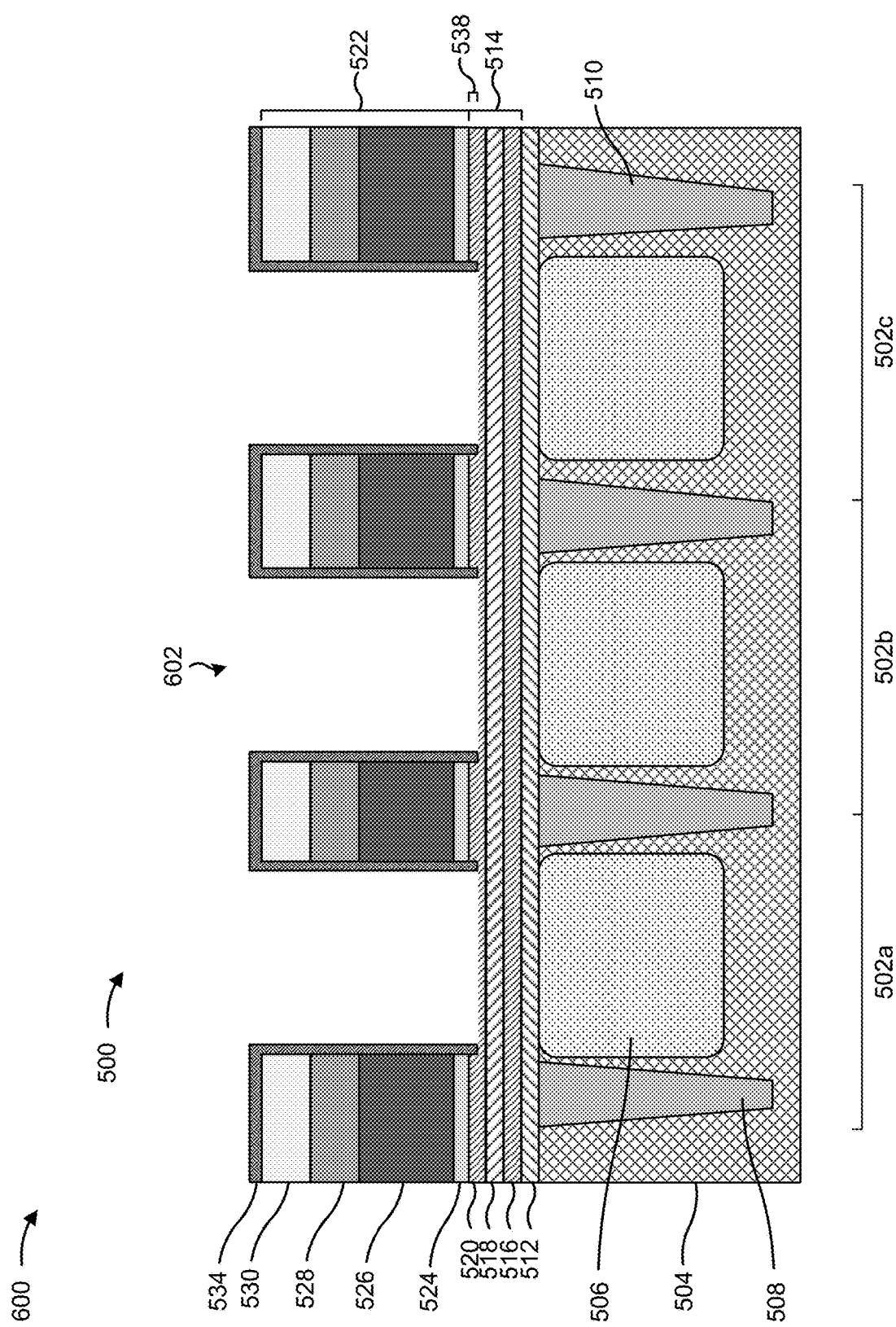

As shown in FIG. 6D, portions of the passivation liner 534 may be removed from the third layer 520 (e.g., the portion 538 in the third layer 520) in the openings 602 such that the impact of the passivation liner 534 on the quantum efficiency of the pixel sensors 502 is reduced. The etch tool 108 may perform a dry etch and/or a wet etch to remove the portions of the passivation liner 534 from the portion 538 in the third layer 520 in the openings 602.

Figure 6E:
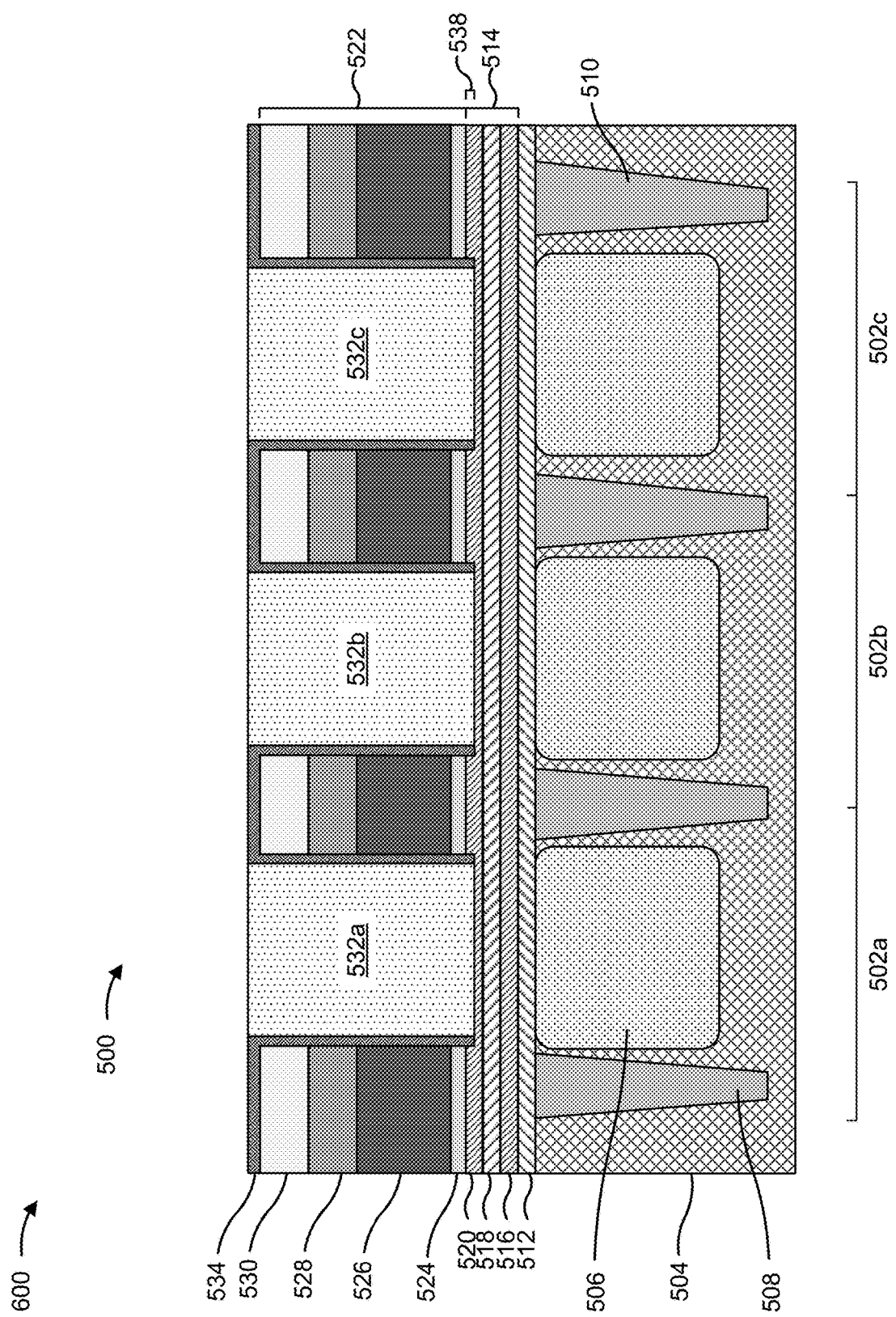

As shown in FIG. 6E, respective color filter regions 532 may be formed for each of the pixel sensors 502 in the pixel array 500 in the openings 602. For example, the color filter region 532a may be formed in an opening 602 above the photodiode 506 for the pixel sensor 502a, a color filter region 532b may be formed in an opening 602 above the photodiode 506 for the pixel sensor 502b, a color filter region 532c may be formed in an opening 602 above the photodiode 506 for the pixel sensor 502c, and so on. Each color filter region 532 may be formed in between the grid structure 522 to reduce color mixing between adjacent pixel sensors 502. Moreover, each color filter region 532 may be formed in the portion 538 in the third layer 520. A semiconductor processing tool (e.g., the deposition tool 102) may deposit the color filter regions 532 using various PVD techniques, CVD techniques and/or ALD techniques, such as sputtering, PECVD, HDP-CVD, SACVD, or PEALD.

Figure 6F:
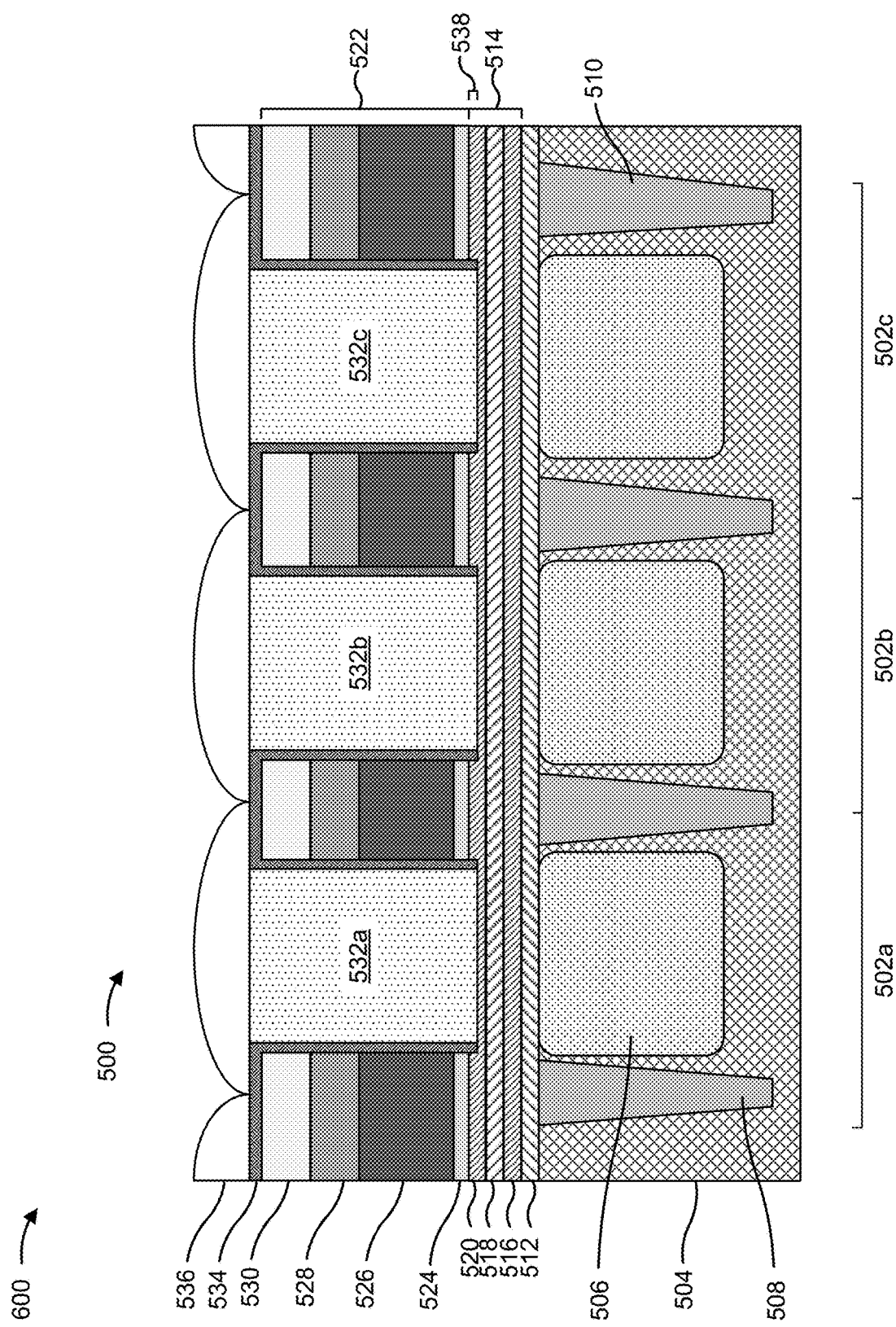

As shown in FIG. 6F, the micro-lens layer 536 including a plurality of micro-lenses is formed over and/or on the color filter regions 532. The micro-lens layer 536 may include a respective micro-lens for each of the pixel sensors 502 included in the pixel array 500. For example, a micro-lens may be formed over and/or on the color filter region 532a of the pixel sensor 502a, a micro-lens may be formed over and/or on the color filter region 532b of the pixel sensor 502b, a micro-lens may be formed over and/or on the color filter region 532c of the pixel sensor 502c, and so on.

As indicated above, FIGS. 6A-6F are provided as an example. Other examples may differ from what is described with regard to FIGS. 6A-6F.

Figure 7:
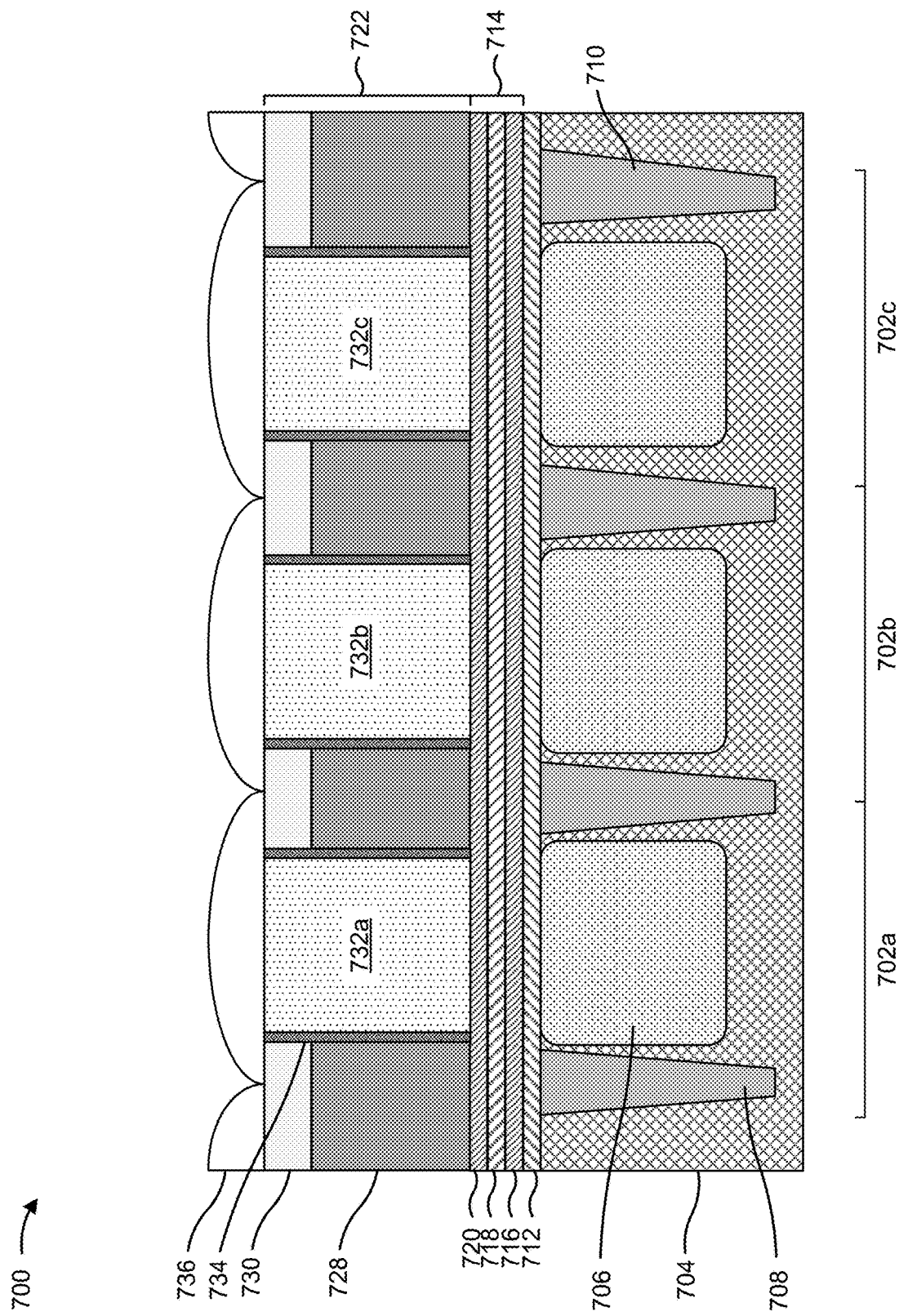
FIG. 7 is a diagram of an example pixel array described herein.

FIG. 7 is a diagram of an example pixel array 700 described herein. The pixel array 700 may be similar to the pixel array 300 and may include similar layers and/or structures. However, instead of including a CMG as the grid structure, the pixel array 700 includes a color filter in a box (CIAB) as the grid structure. The CIAB may also be referred to as an oxide grid or non-metal grid. The CIAB may provide increased dark current performance and/or increased white pixel performance relative to the CMG.

In some implementations, the example pixel array 700 illustrated in FIG. 7 may include, or may be included in, the pixel array 200 (or a portion thereof). In some implementations, the pixel array 700 may be included in an image sensor. The image sensor may include a CMOS image sensor, a BSI CMOS image sensor, or another type of image sensor.

As shown in FIG. 7, the pixel array 700 may include a plurality of adjacent pixel sensors 702 formed in a substrate 704, such as pixel sensors 702a-702c. Each pixel sensor 702 may include a photodiode 706. An isolation structure 708 may be included in the substrate 704 between adjacent pixel sensors 702 and filled with an oxide layer 710. A high-k dielectric layer 712 may be included on the substrate 704 and over the photodiodes 706 and the isolation structure 708.

A layer stack 714 may be included over and/or on the high-k dielectric layer 712. The layer stack 714 may be configured to further increase dark current performance and/or white pixel performance by reducing and/or preventing damage to the photodiodes 706 that might otherwise result from radiation damage, plasma processing, and/or etching of various layers and/or structures of the pixel array 700. The layer stack 714 may include a first layer 716 over and/or on the high-k dielectric layer 712. The first layer 716 may include an oxide material and may be referred to as an oxide layer. The layer stack 714 may include a second layer 718 over and/or on the first layer 716. The second layer 718 may include a material having a band gap that is lower than the band gap of the material of the first layer 716 such as a silicon nitride. For example, the second layer 718 may include a material having a band gap that is less than approximately 8.8 eV such as a silicon nitride ($Si_xN_y$). The layer stack 714 may include a third layer 720 over and/or on the second layer 718. The third layer 720 may include an oxide material and may be referred to as an oxide layer. The oxide material may include a silicon oxide ($SiO_x$) or another type of oxide having a relatively high band gap, and a band gap that is greater than the band gap of the second layer 718. As an example, the second layer 720 may include silicon dioxide ($SiO_2$) and may have a band gap of approximately 8.8 eV.

A grid structure 722 may be included over and/or on the layer stack 714 (e.g., the oxide-nitride-oxide layer stack) and may surround the perimeters of the pixel sensors 702. The grid structure 722 may include a plurality of layers over and/or on the layer stack 714. In particular, the grid structure 722 may include a plurality of oxide layers and may be referred to a CIAB. For example, the grid structure 722 may include an oxide layer 728 on and/or over the third layer 720, and a hard mask layer 730 on and/or over the oxide layer 728. The oxide layer 728 may include a silicon oxide (e.g., silicon dioxide ($SiO_2$)), a hafnium oxide (e.g., hafnium dioxide ($HfO_2$)), or another type of oxide material. The thickness of the oxide layer 728 may be in a range of approximately 2900 angstroms to approximately 3700 angstroms. The hard mask layer 730 may include a silicon nitride ($Si_xN_y$) or a silicon oxynitride (SiON), among other examples. An example thickness of the hard mask layer 730 may be approximately 1400 angstroms.

Respective color filter regions 732 may be included in the areas between the grid structure 722. For example, a color filter region 732a may be formed in between columns of the grid structure 722 over the photodiode 706 of the pixel sensor 702a, a color filter region 732b may be formed in between columns of the grid structure 722 over the photodiode 706 of the pixel sensor 702b, a color filter region 732c may be formed in between columns of the grid structure 722 over the photodiode 706 of the pixel sensor 702c, and so on. A passivation liner 734 may be included on the sidewalls of the columns (or the openings) of the grid structure 722 between the sidewalls and the color filter regions 732. In some implementations, the passivation liner 734 is omitted from a top surface of the hard mask layer 730. In some implementations, the passivation liner 734 is omitted from a bottom surface of the grid structure 722 between the third layer 720 and the color filter regions 732 so that the passivation liner 734 is not in the optical path of the pixel sensors 702.

A micro-lens layer 736 may be included above and/or on the color filter regions 732. The micro-lens layer 736 may include a respective micro-lens for each of the pixel sensors 702. For example, a micro-lens may be formed to focus incident light toward the photodiode 506 of the pixel sensor 702a, another micro-lens may be formed to focus incident light toward the photodiode 706 of the pixel sensor 702b, another micro-lens may be formed to focus incident light toward the photodiode 706 of the pixel sensor 702c, and so on.

As indicated above, FIG. 7 is provided as an example. Other examples may differ from what is described with regard to FIG. 7.

FIGS. 8A-8G are diagrams of an example implementation 800 described herein. Example implementation 800 may be an example process or method for forming the pixel array 700 having the layer stack 714 included therein to reduce and/or prevent ultraviolet radiation damage and/or etching damage to the photodiodes of the pixel sensors included therein.

Figure 8A:
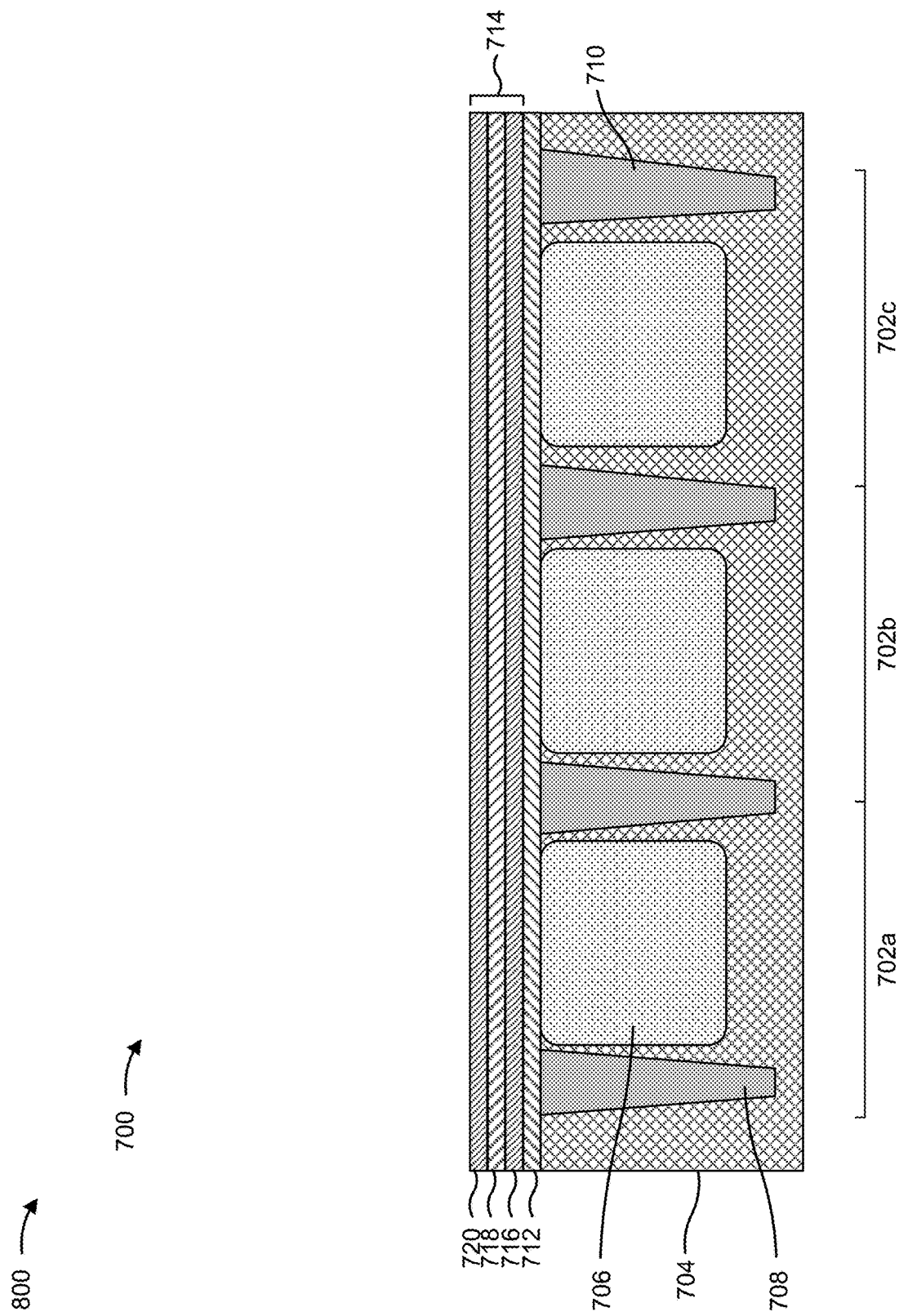
FIGS. 8A-8G are diagrams of an example implementation described herein.

As shown in FIG. 8A, the photodiodes 706, the isolation structures 708, the oxide layer 710, the high-k dielectric layer 712, and the layer stack 714 (including the first layer 716, the second layer 718, and the third layer 720), may be formed in a similar manner as described above in connection with FIGS. 4A-4G.

Figure 8B:
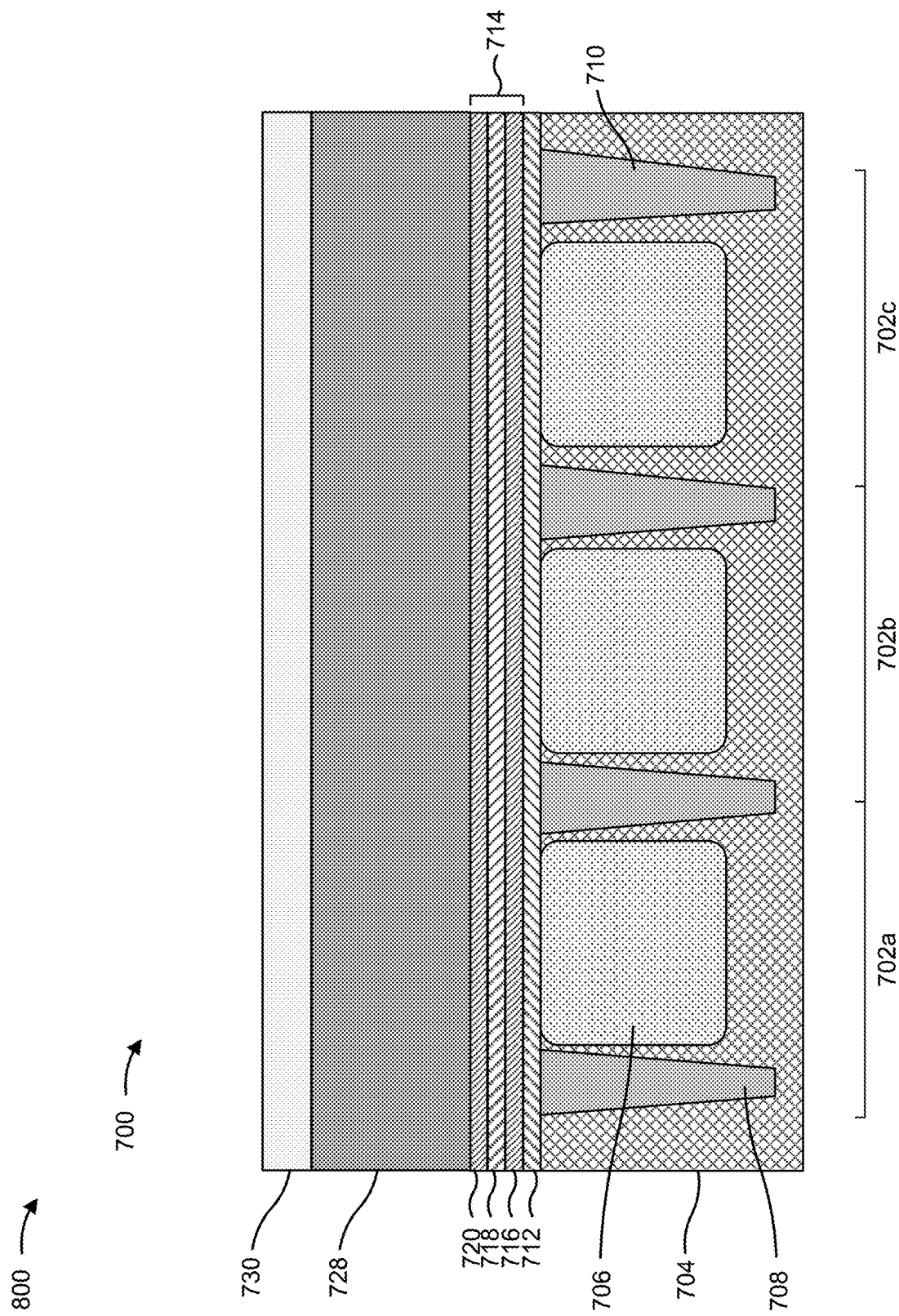

As shown in FIG. 8B, a plurality of layers may be formed over and/or on the layer stack 714 as part of forming the grid structure 722 (e.g., the CIAB). The plurality of layers may include, for example, the oxide layer 728 and the hard mask layer 730. The deposition tool 102 may deposit the oxide layer 728 over and/or on the third layer 720. The deposition tool 102 may deposit the hard mask layer 730 over and/or on the oxide layer 728. The deposition tool 102 may deposit the oxide layer 728 and/or the hard mask layer 730 using various PVD techniques, CVD techniques and/or ALD techniques, such as sputtering, PECVD, HDP-CVD, SACVD, or PEALD.

Figure 8C:
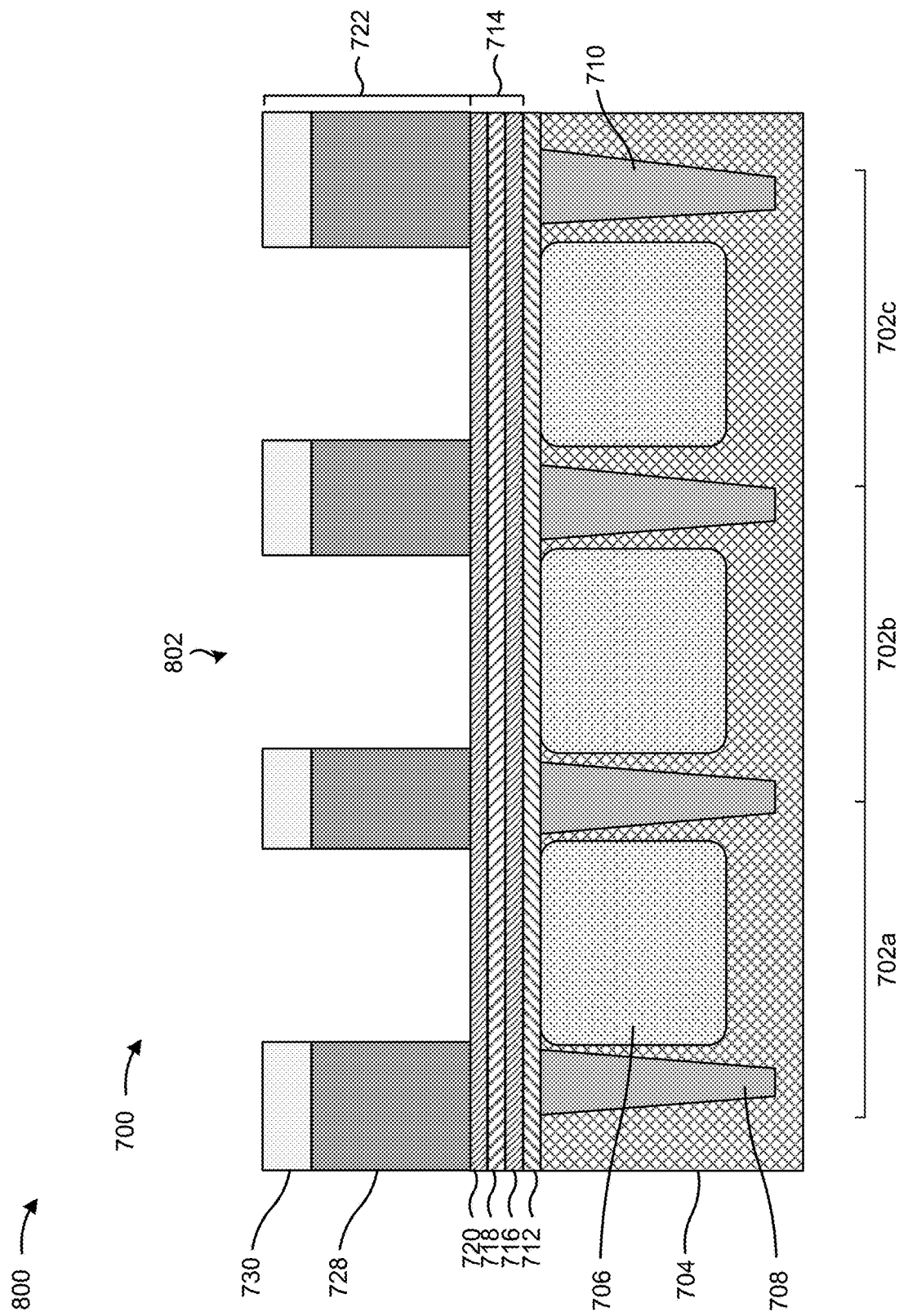

As shown in FIG. 8C, openings 802 may be formed in the plurality of layers to form the grid structure 722. The openings 802 may be formed over the photodiodes 706 of the pixel sensors 702 such that color filter regions may be filled in the openings 802. In some implementations, the opening 802 and the grid structure 722 are be formed using a photoresist (e.g., deposited by the deposition tool 102), where a pattern in the photoresist is formed by exposing the photoresist to a radiation source (e.g., using the exposure tool 104) and removing either the exposed portions or the non-exposed portions of the photoresist (e.g., using developer tool 106). In some implementations, the openings 802 and the grid structure 722 are formed using the hard mask layer 730 to define the openings 802. In these examples, the pattern may be formed in the hard mask layer 730, and the etching tool 108 etches the openings 802 through the oxide layer 728 and to the third layer 720 based on the pattern in the hard mask layer 730.

Figure 8D:
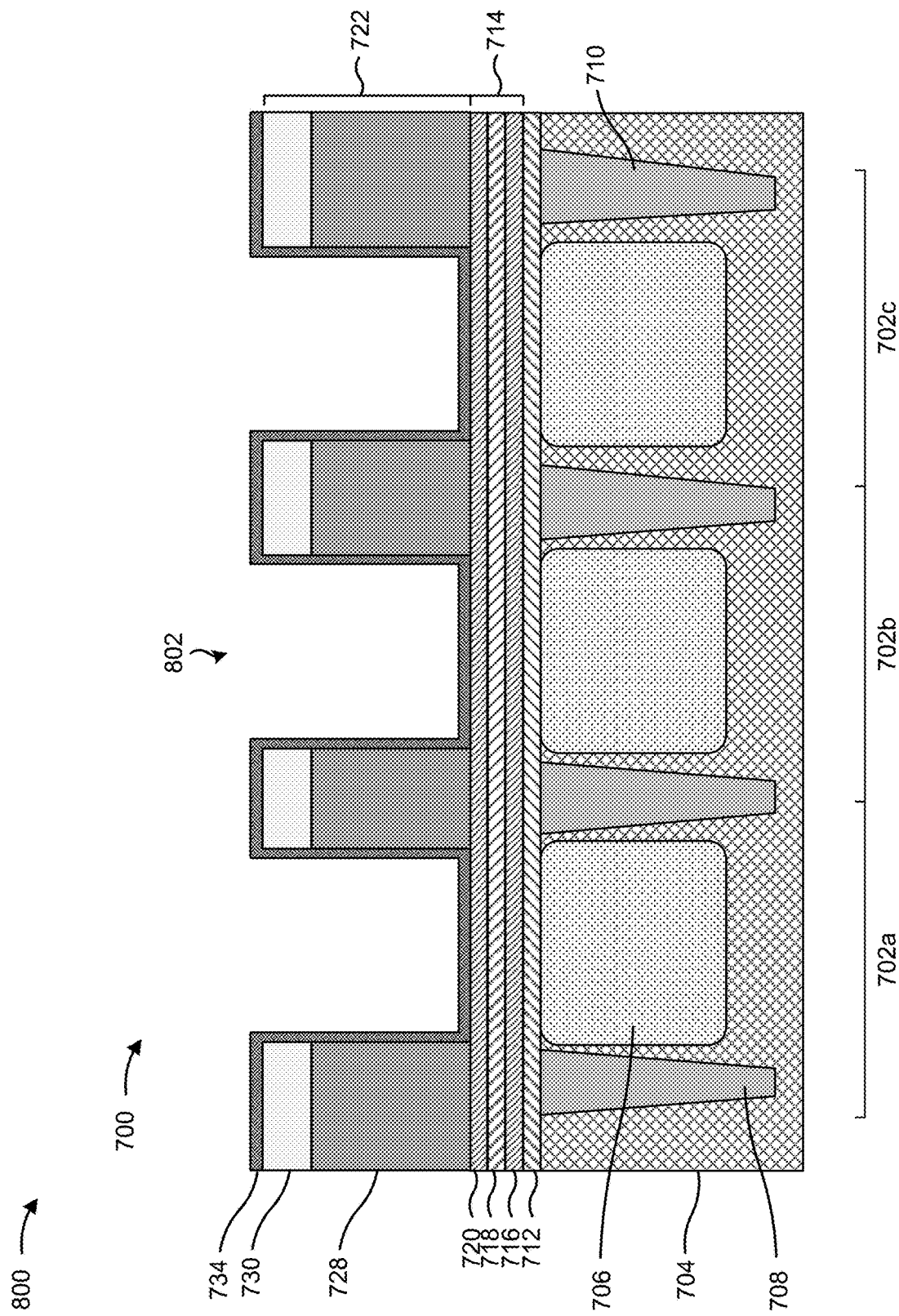

As shown in FIG. 8D, the passivation liner 734 may be formed over and/or on the hard mask layer 730, over and/or on the sidewalls of the grid structure 722 in the openings 802, and over and/or on the third layer 720 in the openings 802. A semiconductor processing tool (e.g., the deposition tool 102) may conformally deposit the passivation liner 734 using various PVD techniques, CVD techniques and/or ALD techniques, such as sputtering, PECVD, HDP-CVD, SACVD, or PEALD. The passivation liner 734 may be conformally deposited to a thickness in a range of approximately 10 angstroms to approximately 200 angstroms.

Figure 8E:
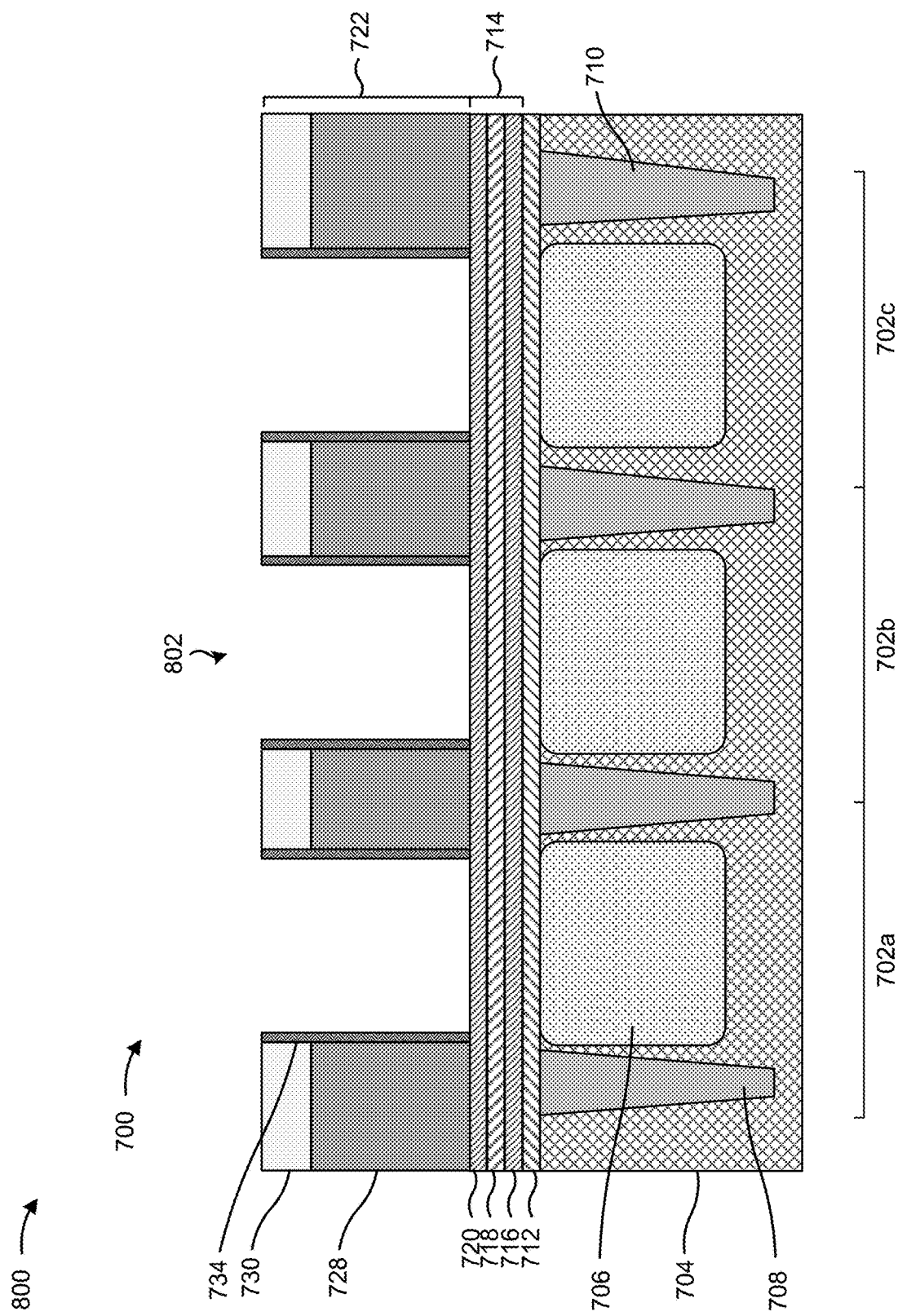

As shown in FIG. 8E, portions of the passivation liner 734 may be removed from the top surface of the hard mask layer 720 and from the third layer 720 in the openings 802 such that the impact of the passivation liner 734 on the quantum efficiency of the pixel sensors 702 is reduced. The etch tool 108 may perform a dry etch and/or a wet etch to remove the portions of the passivation liner 734 from the hard mask layer 730 and the third layer 720.

Figure 8F:
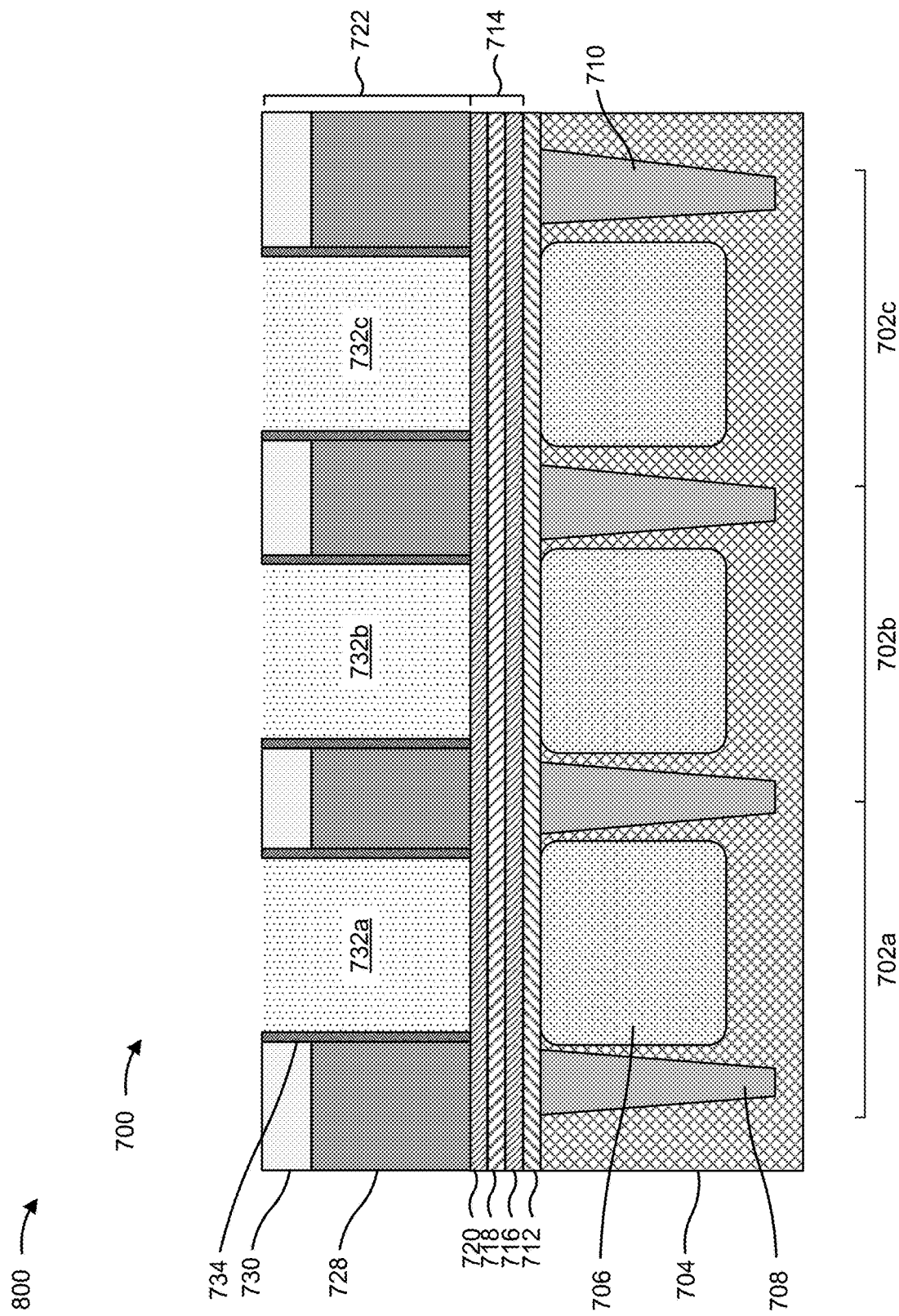

As shown in FIG. 8F, respective color filter regions 732 may be formed for each of the pixel sensors 702 in the pixel array 700 in the openings 802. For example, the color filter region 732a may be formed in an opening 802 above the photodiode 706 for the pixel sensor 702a, a color filter region 732b may be formed in an opening 802 above the photodiode 706 for the pixel sensor 702b, a color filter region 732c may be formed in an opening 802 above the photodiode 706 for the pixel sensor 702c, and so on. Each color filter region 732 may be formed in between the grid structure 722 to reduce color mixing between adjacent pixel sensors 702. A semiconductor processing tool (e.g., the deposition tool 102) may deposit the color filter regions 732 using various PVD techniques, CVD techniques and/or ALD techniques, such as sputtering, PECVD, HDP-CVD, SACVD, or PEALD.

Figure 8G:
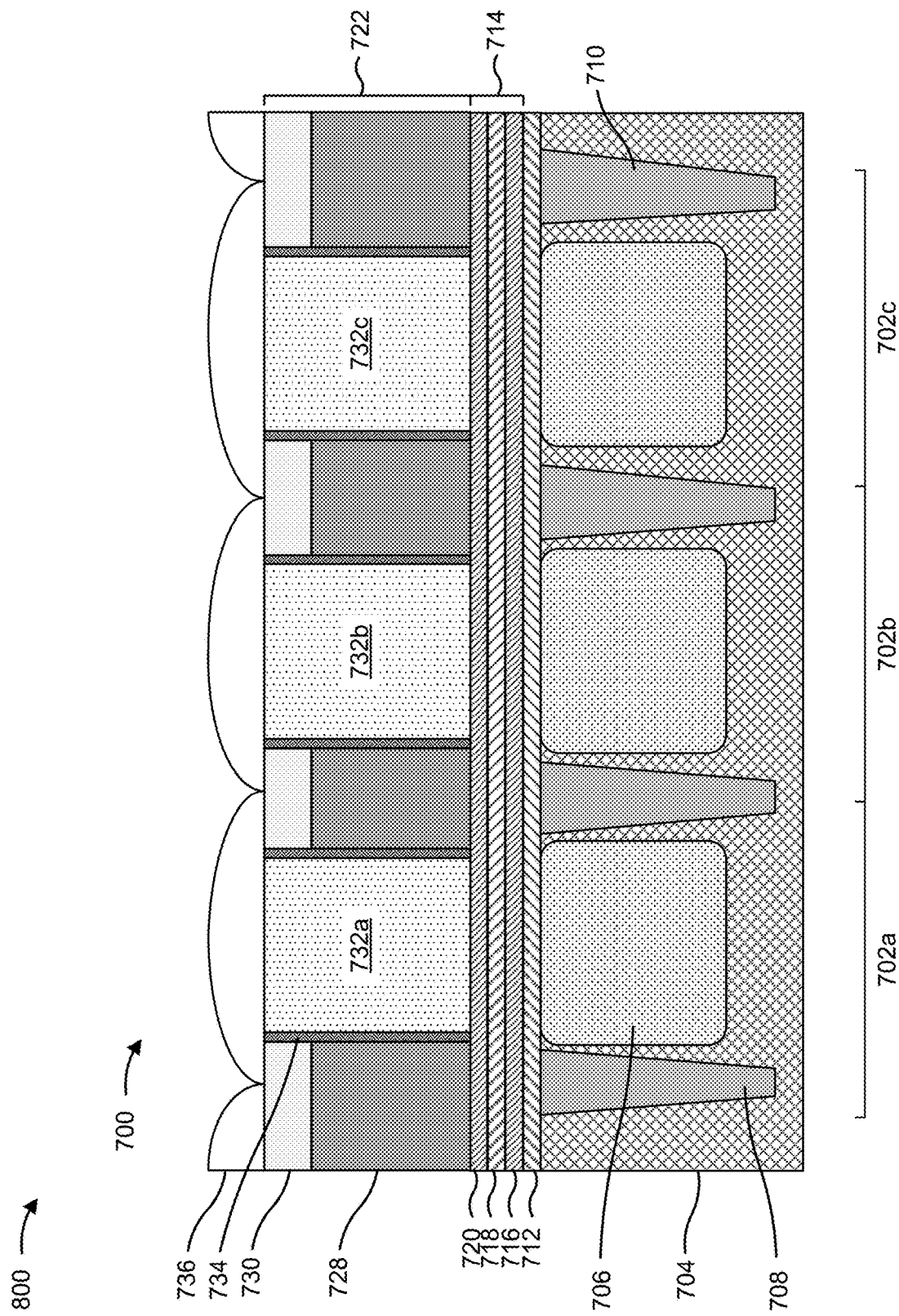

As shown in FIG. 8G, the micro-lens layer 736 including a plurality of micro-lenses is formed over and/or on the color filter regions 732. The micro-lens layer 736 may include a respective micro-lens for each of the pixel sensors 702 included in the pixel array 700. For example, a micro-lens may be formed over and/or on the color filter region 732a of the pixel sensor 702a, a micro-lens may be formed over and/or on the color filter region 732b of the pixel sensor 702b, a micro-lens may be formed over and/or on the color filter region 732c of the pixel sensor 702c, and so on.

As indicated above, FIGS. 8A-8G are provided as an example. Other examples may differ from what is described with regard to FIGS. 8A-8G.

Figure 9:
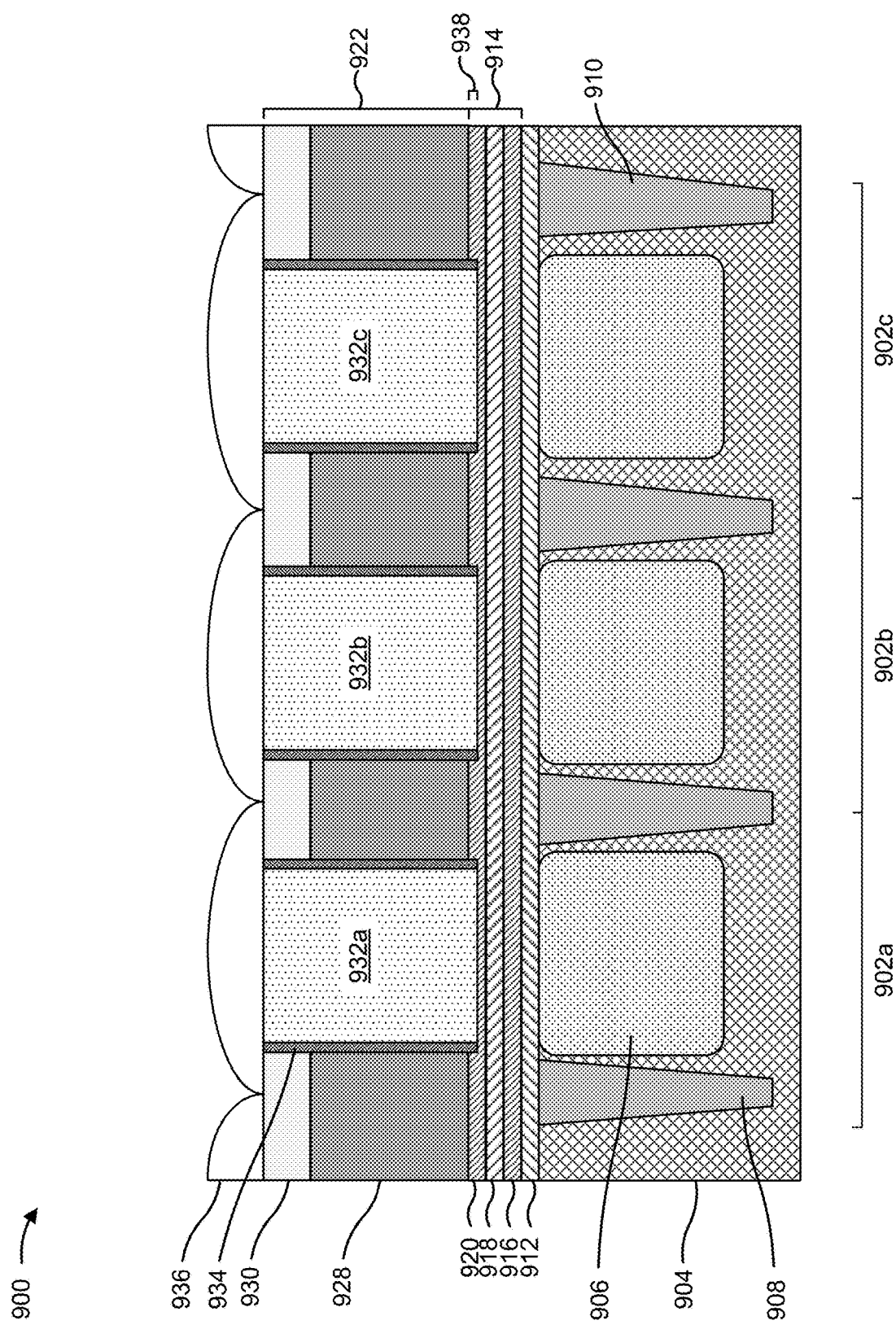
FIG. 9 is a diagram of an example pixel array described herein.

FIG. 9 is a diagram of an example pixel array 900 described herein. The pixel array 900 may be similar to the pixel array 700 and may include similar layers and/or structures. For example, the pixel sensor 900 may include a CIAB to provide increased dark current performance and/or increased white pixel performance relative to the CMG. Moreover, the pixel sensor 900 includes over-etch regions through a portion of the thickness of the third layer in the layer stack. The over-etch regions may result from etching the openings to form the grid structure. In particular, the over-etch regions may result from etching the openings partially into the third layer to ensure that the openings are fully formed through the oxide layer of the CIAB. To reduce or minimize the quantum efficiency reduction that might otherwise occur if a portion of the silicon oxide layer were to remain on the third layer.

In some implementations, the example pixel array 900 illustrated in FIG. 9 may include, or may be included in, the pixel array 200 (or a portion thereof). In some implementations, the pixel array 900 may be included in an image sensor. The image sensor may include a CMOS image sensor, a BSI CMOS image sensor, or another type of image sensor.

As shown in FIG. 9, the pixel array 900 may include a plurality of adjacent pixel sensors 902 formed in a substrate 904, such as pixel sensors 902a-902c. Each pixel sensor 902 may include a photodiode 906. An isolation structure 908 may be included in the substrate 904 between adjacent pixel sensors 902 and filled with an oxide layer 910. A high-k dielectric layer 912 may be included on the substrate 904 and over the photodiodes 906 and the isolation structure 908.

A layer stack 914 may be included over and/or on the high-k dielectric layer 912. The layer stack 914 may be configured to further increase dark current performance and/or white pixel performance by reducing and/or preventing damage to the photodiodes 906 that might otherwise result from radiation damage, plasma processing, and/or etching of various layers and/or structures of the pixel array 900. The layer stack 914 may include a first layer 916 over and/or on the high-k dielectric layer 912. The first layer 916 may include an oxide material and may be referred to as an oxide layer. The layer stack 914 may include a second layer 918 over and/or on the first layer 916. The second layer 918 may include a material having a band gap that is lower than the band gap of the material of the first layer 916 such as a silicon nitride. For example, the second layer 918 may include a material having a band gap that is less than approximately 8.8 eV such as a silicon nitride ($Si_xN_y$). The layer stack 914 may include a third layer 920 over and/or on the second layer 918. The third layer 920 may include an oxide material and may be referred to as an oxide layer. The oxide material may include a silicon oxide ($SiO_x$) or another type of oxide having a relatively high band gap, and a band gap that is greater than the band gap of the second layer 918. As an example, the second layer 920 may include silicon dioxide ($SiO_2$) and may have a band gap of approximately 8.8 eV.

A grid structure 922 may be included over and/or on the layer stack 914 (e.g., the oxide-nitride-oxide layer stack) and may surround the perimeters of the pixel sensors 902. The grid structure 922 may include a plurality of layers over and/or on the layer stack 914. In particular, the grid structure 922 may include a plurality of oxide layers and may be referred to a CIAB. For example, the grid structure 922 may include an oxide layer 928 on and/or over the third layer 920, and a hard mask layer 930 on and/or over the oxide layer 928. The oxide layer 928 may include a silicon oxide (e.g., silicon dioxide ($SiO_2$)), a hafnium oxide (e.g., hafnium dioxide ($HfO_2$)), or another oxide material. The thickness of the oxide layer 928 may be in a range of approximately 2900 angstroms to approximately 3700 angstroms. The hard mask layer 930 may include a silicon nitride ($Si_xN_y$) or a silicon oxynitride (SiON), among other examples. An example thickness of the hard mask layer 930 may be approximately 1400 angstroms.

Respective color filter regions 932 may be included in the areas between the grid structure 922. For example, a color filter region 932a may be formed in between columns of the grid structure 922 over the photodiode 906 of the pixel sensor 902a, a color filter region 932b may be formed in between columns of the grid structure 922 over the photodiode 906 of the pixel sensor 902b, a color filter region 932c may be formed in between columns of the grid structure 922 over the photodiode 906 of the pixel sensor 902c, and so on. A passivation liner 934 may be included on the sidewalls of the columns (or the openings) of the grid structure 922 between the sidewalls and the color filter regions 932. In some implementations, the passivation liner 934 is included on the hard mask layer 930. In some implementations, the passivation liner 934 is omitted from a bottom surface of the grid structure 922 between the third layer 920 and the color filter regions 932 so that the passivation liner 934 is not in the optical path of the pixel sensors 902.

A micro-lens layer 936 may be included above and/or on the color filter regions 932. The micro-lens layer 936 may include a respective micro-lens for each of the pixel sensors 902. For example, a micro-lens may be formed to focus incident light toward the photodiode 506 of the pixel sensor 902a, another micro-lens may be formed to focus incident light toward the photodiode 906 of the pixel sensor 902b, another micro-lens may be formed to focus incident light toward the photodiode 906 of the pixel sensor 902c, and so on.

As described above, the grid structure 922 may extend at least partially into the third layer 920 of the layer stack 914. In particular, the openings of the grid structure 922 may extend into a portion 938 of the thickness of the third layer 920 (referred to as an over-etch region) to ensure that the openings are fully etched through the oxide layer 920. Accordingly, a portion of the color filter regions 932 and a portion of the passivation liner 934 may be included in the portion 938 in the third layer 920.

As indicated above, FIG. 9 is provided as an example. Other examples may differ from what is described with regard to FIG. 9.

FIGS. 10A-10F are diagrams of an example implementation 1000 described herein. Example implementation 1000 may be an example process or method for forming the pixel array 900 having the layer stack 914 included therein to reduce and/or prevent ultraviolet radiation damage and/or etching damage to the photodiodes of the pixel sensors included therein.

Figure 10A:
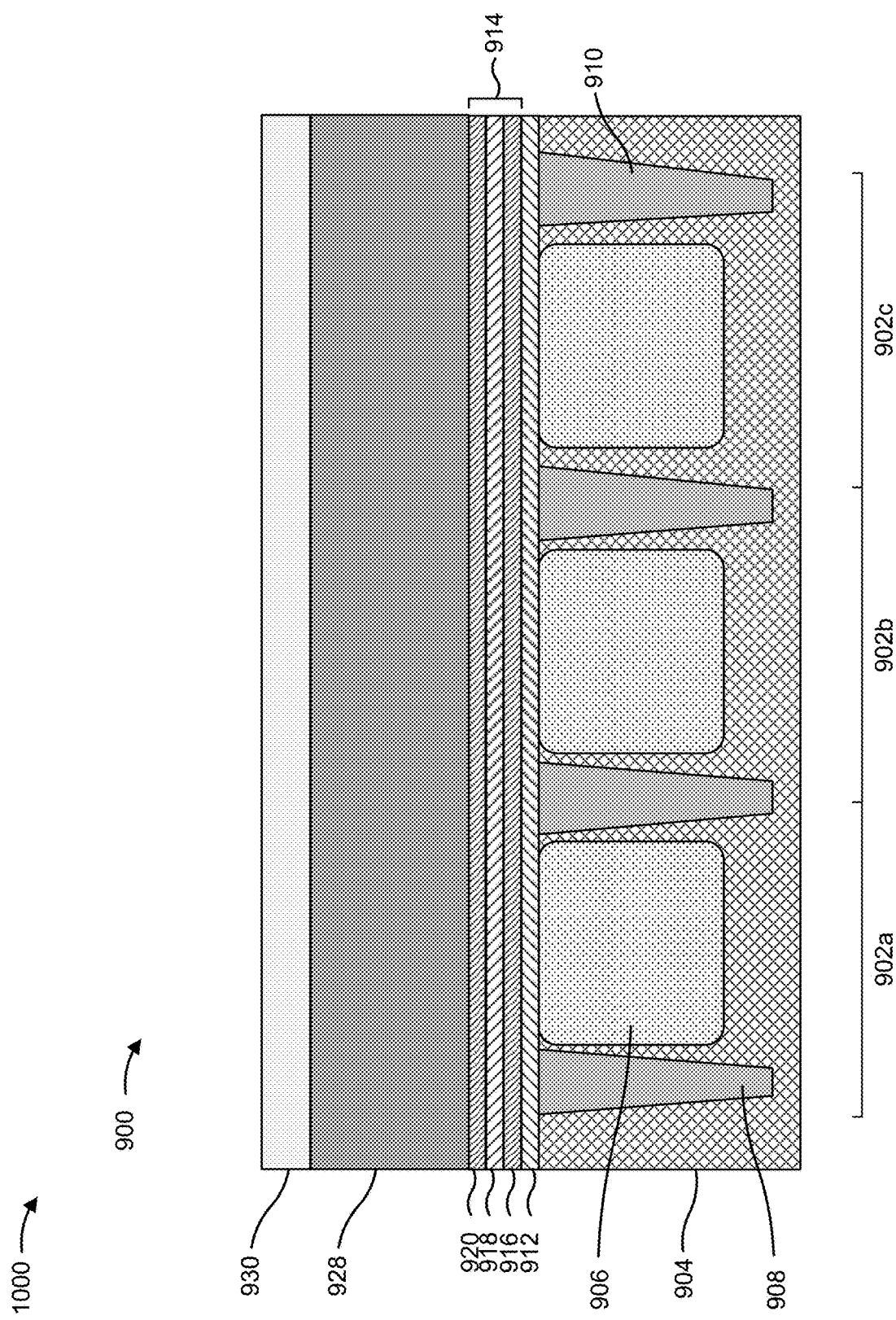
FIGS. 10A-10F are diagrams of an example implementation described herein.

As shown in FIG. 10A, the photodiodes 906, the isolation structures 908, the oxide layer 910, the high-k dielectric layer 912, the layer stack 914 (including the first layer 916, the second layer 918, and the third layer 920), the oxide layer 928, and the hard mask layer 930 may be formed in a similar manner as described above in connection with FIGS. 4A-4H and FIG. 8B.

Figure 10B:
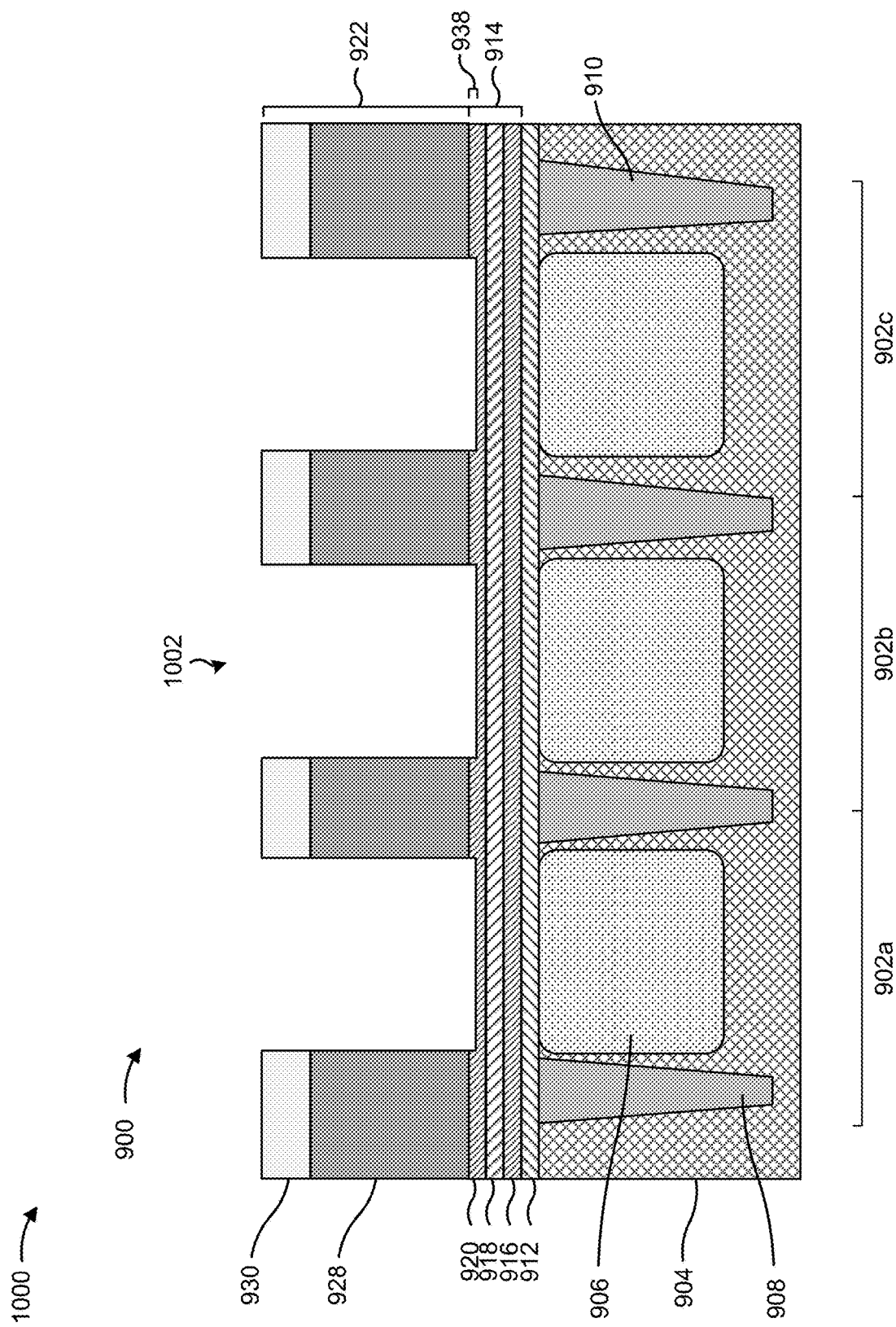

As shown in FIG. 10B, openings 1002 may be formed in the plurality of layers to form the grid structure 922. The openings 1002 may be formed over the photodiodes 906 of the pixel sensors 902 such that color filter regions may be filled in the openings 1002. In some implementations, the opening 1002 and the grid structure 922 are be formed using a photoresist (e.g., deposited by the deposition tool 102), where a pattern in the photoresist is formed by exposing the photoresist to a radiation source (e.g., using the exposure tool 104) and removing either the exposed portions or the non-exposed portions of the photoresist (e.g., using developer tool 106). In some implementations, the openings 1002 and the grid structure 922 are formed using the hard mask layer 930 to define the openings 1002. In these examples, the pattern may be formed in the hard mask layer 930, and the etching tool 108 etches the openings 1002 through the oxide layer 928 into at least the portion 938 of the third layer 920 based on the pattern in the hard mask layer 930. In some implementations, the portion 938 may extend into the third layer 920 from a top surface of the third layer 920 approximately 200 angstroms to approximately 350 angstroms to ensure that the oxide layer 928 is fully removed from the openings 1002.

Figure 10C:
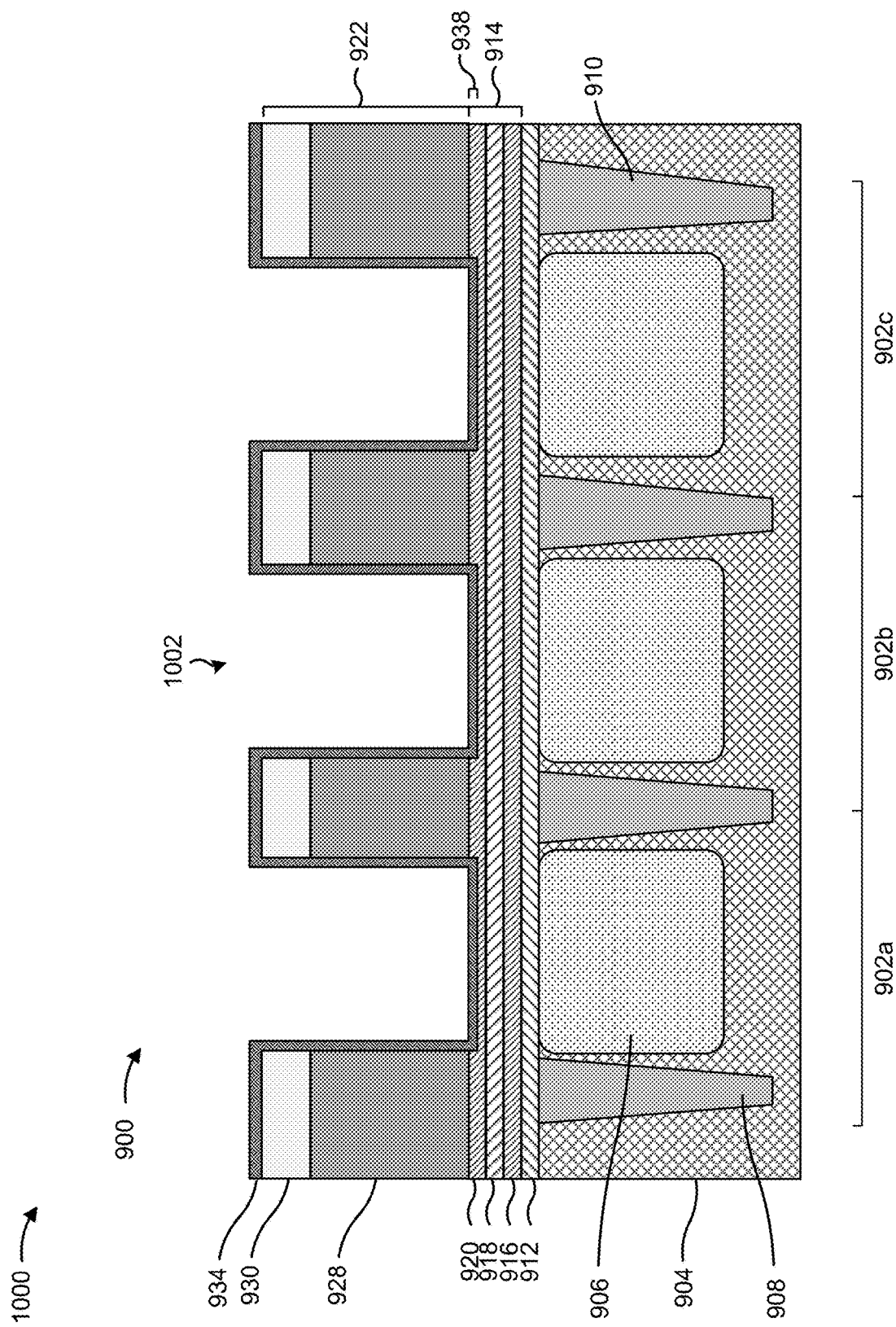

As shown in FIG. 10C, the passivation liner 934 may be formed over and/or on the hard mask layer 930, over and/or on the sidewalls of the grid structure 922 in the openings 1002, and over and/or on the third layer 920 in the portion 938 etched into the third layer 920. A semiconductor processing tool (e.g., the deposition tool 102) may conformally deposit the passivation liner 934 using various PVD techniques, CVD techniques and/or ALD techniques, such as sputtering, PECVD, HDP-CVD, SACVD, or PEALD. The passivation liner 934 may be conformally deposited to a thickness in a range of approximately 10 angstroms to approximately 200 angstroms.

Figure 10D:
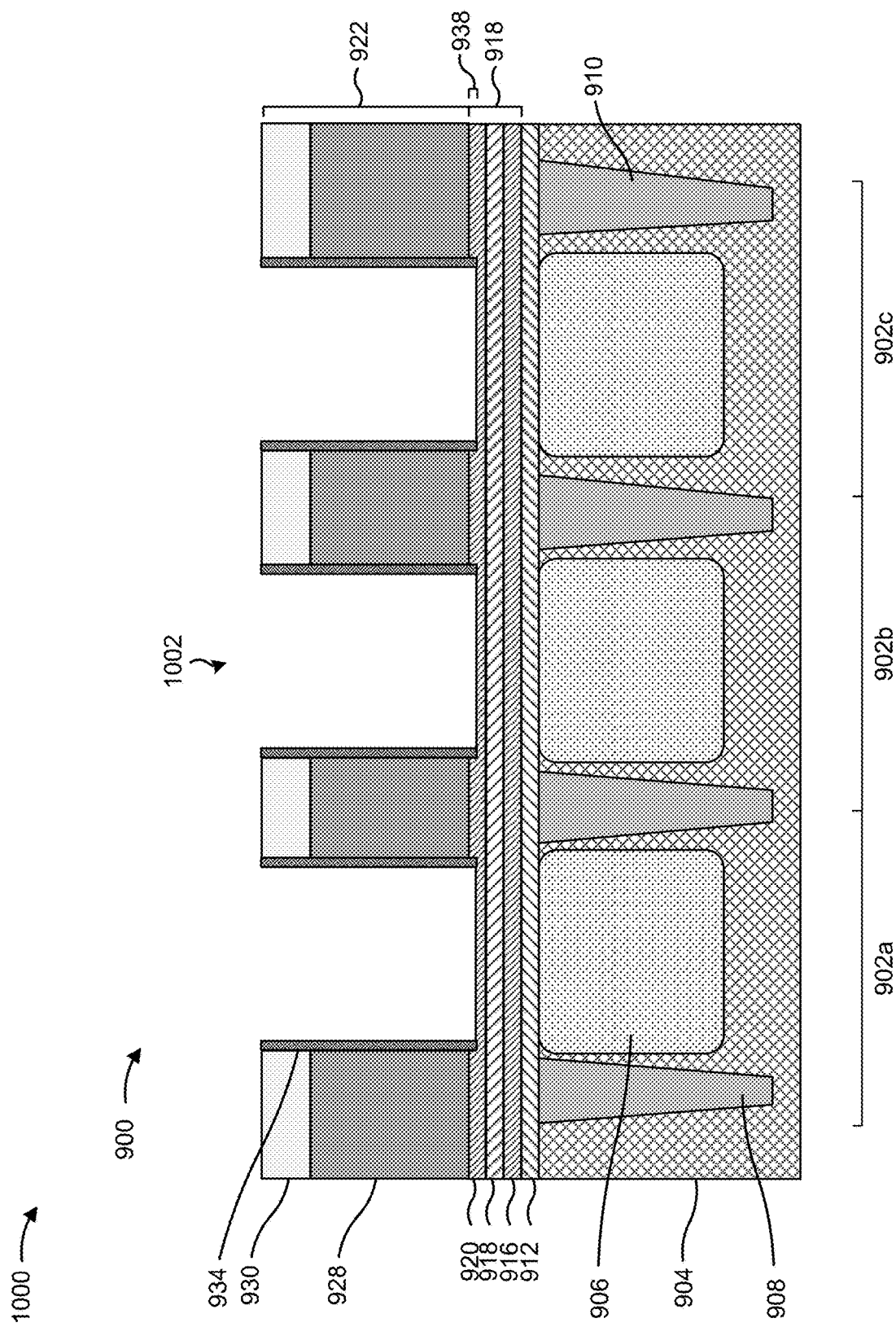

As shown in FIG. 10D, portions of the passivation liner 934 may be removed from the top surface of the hard mask layer 930 and from the third layer 920 (e.g., the portion 938 in the third layer 920) in the openings 1002 such that the impact of the passivation liner 934 on the quantum efficiency of the pixel sensors 902 is reduced. The etch tool 108 may perform a dry etch and/or a wet etch to remove the portions of the passivation liner 934 from the top surface of the hard mask layer 930 and from the portion 938 in the third layer 920 in the openings 1002.

Figure 10E:
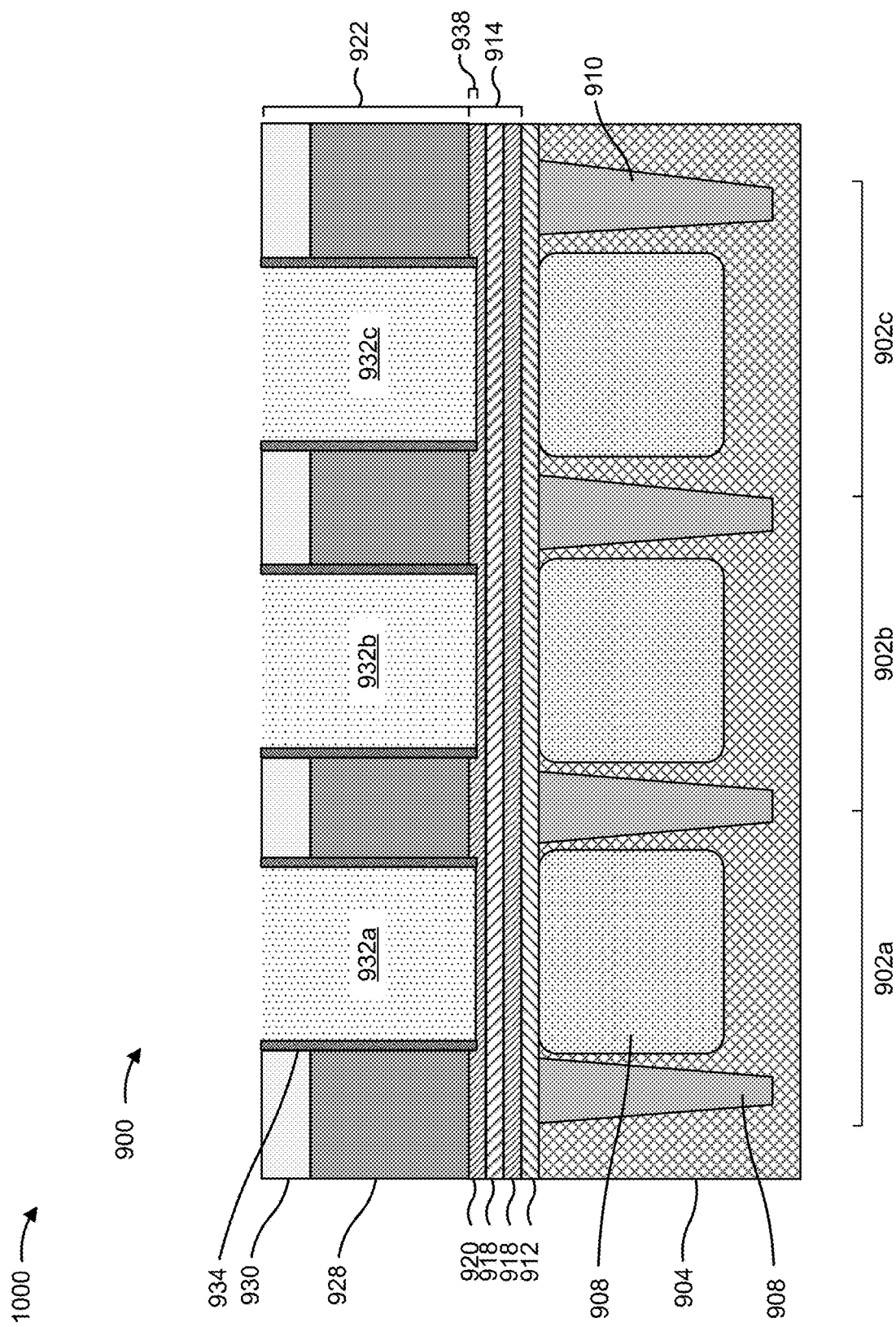

As shown in FIG. 10E, respective color filter regions 932 may be formed for each of the pixel sensors 902 in the pixel array 900 in the openings 1002. For example, the color filter region 932a may be formed in an opening 1002 above the photodiode 906 for the pixel sensor 902a, a color filter region 932b may be formed in an opening 1002 above the photodiode 906 for the pixel sensor 902b, a color filter region 932c may be formed in an opening 1002 above the photodiode 906 for the pixel sensor 902c, and so on. Each color filter region 932 may be formed in between the grid structure 922 to reduce color mixing between adjacent pixel sensors 902. Moreover, each color filter region 932 may be formed in the portion 938 in the third layer 920. A semiconductor processing tool (e.g., the deposition tool 102) may deposit the color filter regions 932 using various PVD techniques, CVD techniques and/or ALD techniques, such as sputtering, PECVD, HDP-CVD, SACVD, or PEALD.

Figure 10F:
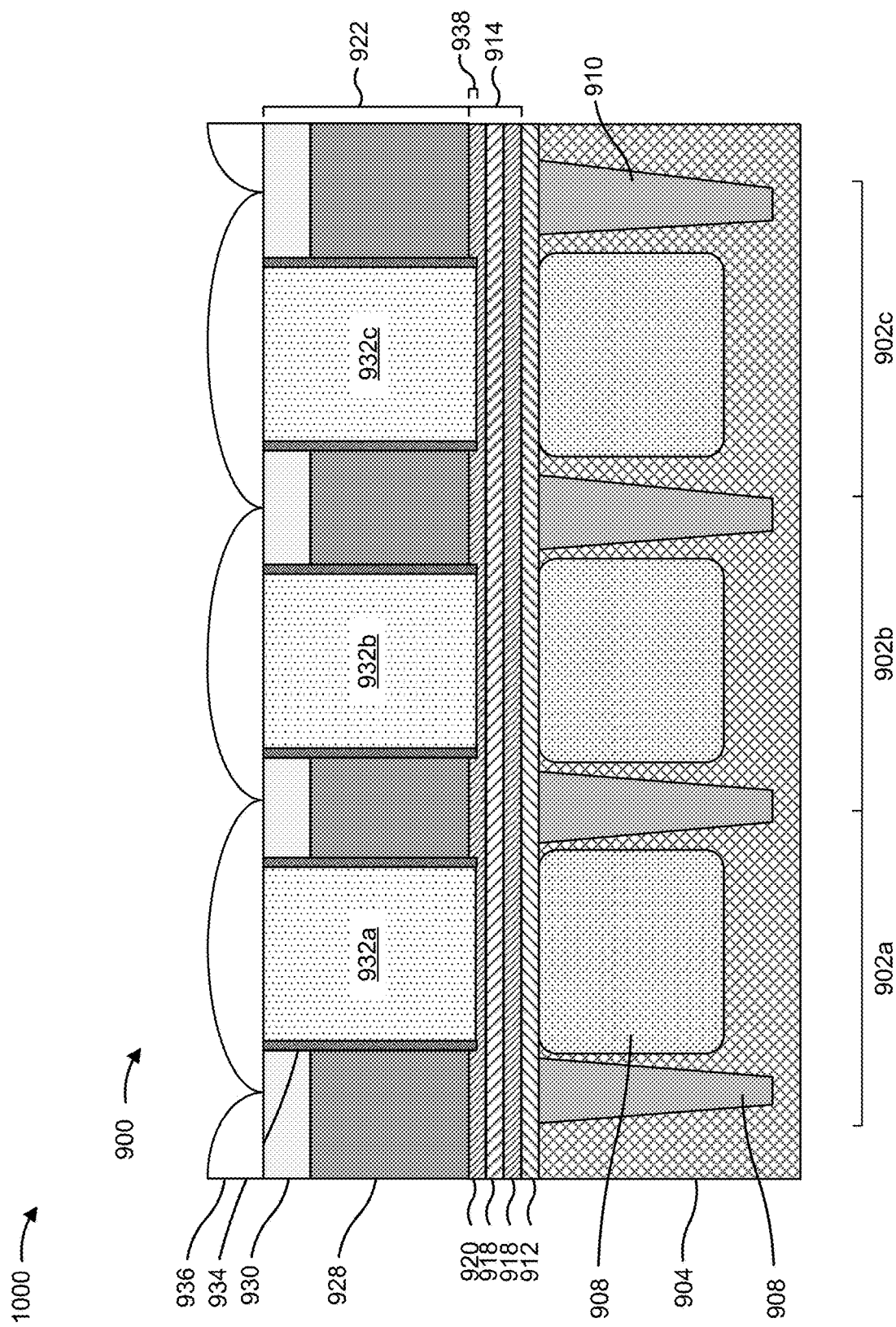

As shown in FIG. 10F, the micro-lens layer 936 including a plurality of micro-lenses is formed over and/or on the color filter regions 932. The micro-lens layer 936 may include a respective micro-lens for each of the pixel sensors 902 included in the pixel array 900. For example, a micro-lens may be formed over and/or on the color filter region 932a of the pixel sensor 902a, a micro-lens may be formed over and/or on the color filter region 932b of the pixel sensor 902b, a micro-lens may be formed over and/or on the color filter region 932c of the pixel sensor 902c, and so on.

As indicated above, FIGS. 10A-10F are provided as an example. Other examples may differ from what is described with regard to FIGS. 10A-10F.

Figure 11:
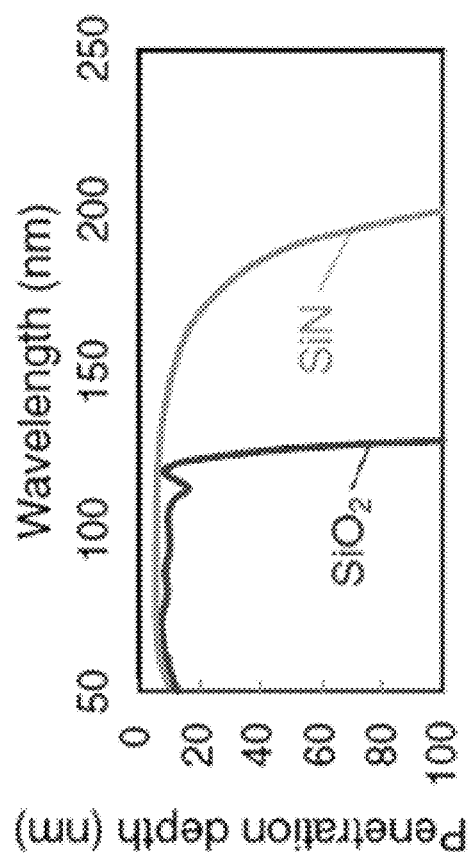
FIG. 11 is a diagram of example light penetration data described herein.

FIG. 11 is a diagram 1100 of example light penetration data described herein. Diagram 1100 illustrates light penetration data for various types of materials including silicon dioxide ($SiO_2$) and silicon nitride (SiN). As described above, silicon dioxide is an example of a material that may be used in the first layer (e.g., first layer 316, 516, 716, and/or 916) and the third layer (e.g., third layer 320, 520, 720, and/or 920) of the layer stacks (e.g., layer stack 314, 514, 714, and/or 914) described above, and silicon nitride is an example of a material that may be used in the second layer (second layer 318, 518, 718, and/or 918) of the layer stacks described above.

As shown in FIG. 11, the penetration depth (in nanometers) into silicon dioxide may quickly drop off for wavelengths of light around 140 nanometers and below. Moreover, the penetration depth (in nanometers) into silicon nitride may quickly drop off for wavelengths of light around 200 nanometers and below. Accordingly, the combination of silicon dioxide material and silicon nitride material, such as included in the layer stacks described above, may be useful in blocking ultraviolet radiation in a portion of the vacuum ultraviolet (VUV) light spectrum (which may include wavelengths ranging from approximately 100 nanometers to approximately 200 nanometers). Thus, the layer stacks described above may be used to reduce and/or prevent damage to photodiodes (e.g., photodiodes 306, 506, 706, and/or 906) that might otherwise result from VUV radiation that may be present in plasma processing, and/or etching of various layers and/or structures of the pixel arrays (e.g., pixel array 300, 500, 700, and/or 900) described herein.

As indicated above, FIG. 11 is provided as an example. Other examples may differ from what is described with regard to FIG. 11.

Figure 12:
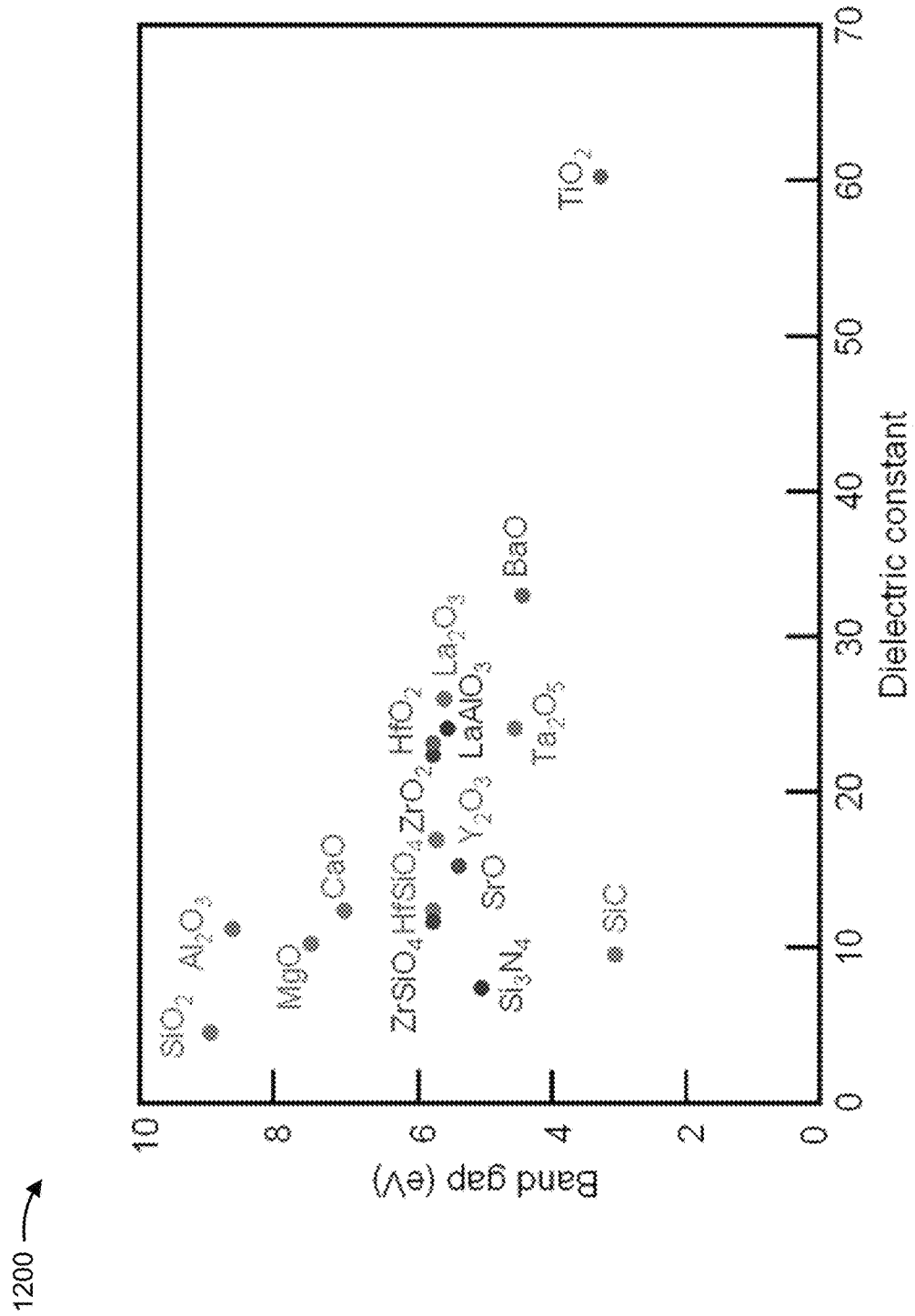
FIG. 12 is a diagram of example band gap data described herein.

FIG. 12 is a diagram 1200 of example band gap data described herein. Diagram 1200 illustrates band gaps and associated dielectric constants for various types of materials that may be included in the pixel arrays (e.g., pixel array 300, 500, 700, and/or 900) described herein. As described above, silicon dioxide ($SiO_2$) may be used in the first layer (e.g., first layer 316, 516, 716, and/or 916) of the layer stacks (e.g., layer stack 314, 514, 714, and/or 914) described above. As shown in the diagram 1200, the band gap of silicon dioxide ($SiO_2$) may be approximately 8.8 eV. As further described above, the second layer (e.g., second layer 318, 518, 718, and/or 918) of the layer stacks described herein may include a material having a band gap that is less than silicon dioxide to reduce and/or block electron-hole pairs formed in the second layer from migrating to photodiodes (e.g., photodiodes 306, 506, 706, and/or 906) of the pixel arrays (e.g., pixel array 300, 500, 700, and/or 900) described herein and damaging the photodiodes.

As further shown in diagram 1200, example materials that may be used in the second layer include (but are not limited to) hafnium dioxide ($HfO_2$), hafnium(IV) silicate ($HfSiO_4$), aluminum(III) oxide ($Al_2O_3$), silicon nitride ($Si_3N_4$), zirconium dioxide ($ZrO_2$), magnesium oxide (MgO), yttrium(III) oxide ($Y_2O_3$), tantalum(V) oxide ($Ta_2O_5$), titanium dioxide ($TiO_2$), lanthanum(III) oxide ($La_2O_3$), barium oxide (BaO), silicon carbide (SiC), lanthanum aluminate ($LaAlO_3$), strontium oxide (SrO), zirconium(IV) silicate ($ZrSiO_4$), and calcium oxide (CaO).

As indicated above, FIG. 12 is provided as an example. Other examples may differ from what is described with regard to FIG. 12.

Figure 13:
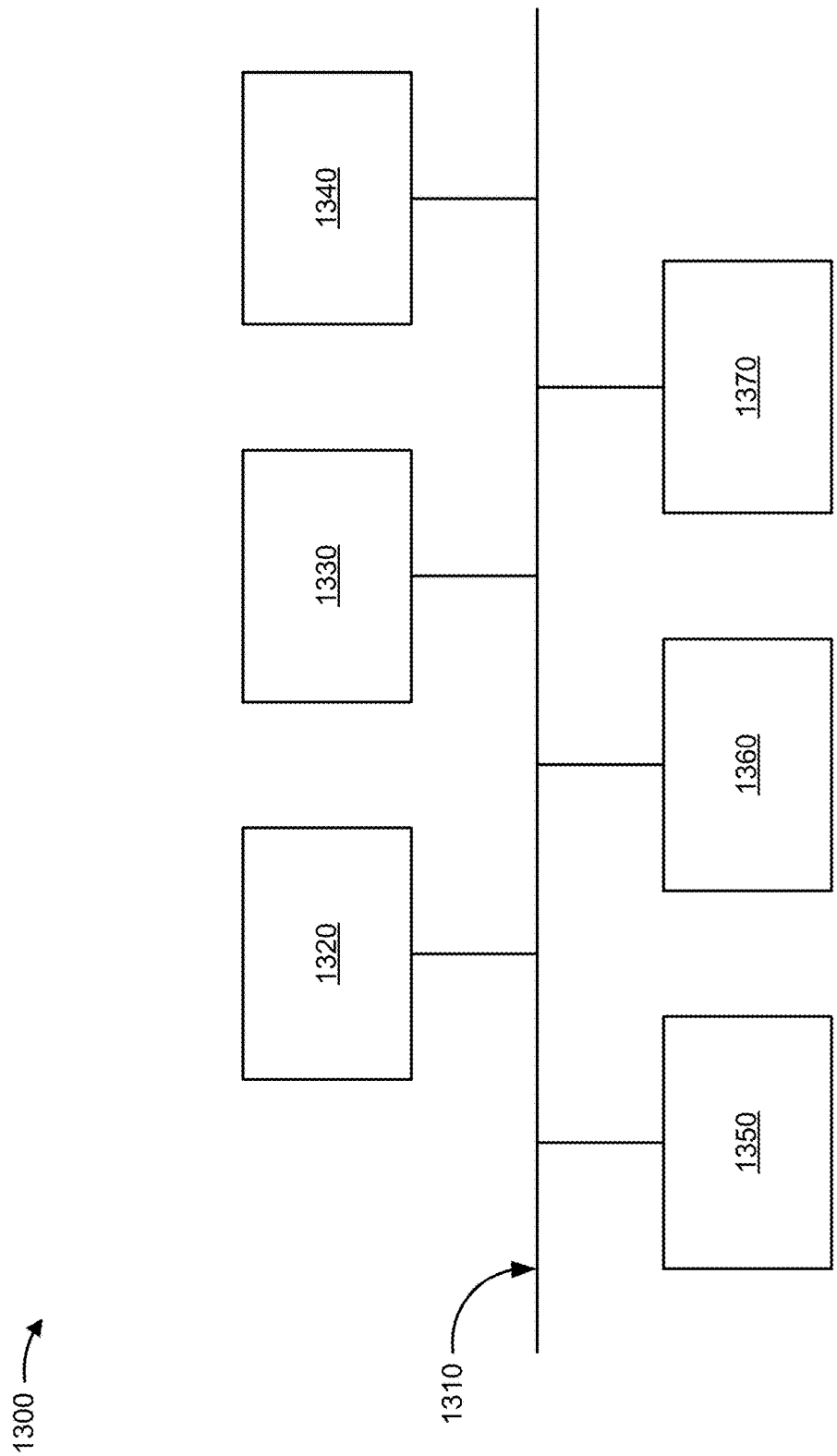
FIG. 13 is a diagram of example components of one or more devices of FIG. 1.

FIG. 13 is a diagram of example components of a device 1300. In some implementations, one or more of the semiconductor processing tools 102-114 and/or the wafer/die transport tool 116 may include one or more devices 1300 and/or one or more components of device 1300. As shown in FIG. 13, device 1300 may include a bus 1310, a processor 1320, a memory 1330, a storage component 1340, an input component 1350, an output component 1360, and a communication component 1370.

Bus 1310 includes a component that enables wired and/or wireless communication among the components of device 1300. Processor 1320 includes a central processing unit, a graphics processing unit, a microprocessor, a controller, a microcontroller, a digital signal processor, a field-programmable gate array, an application-specific integrated circuit, and/or another type of processing component. Processor 1320 is implemented in hardware, firmware, or a combination of hardware and software. In some implementations, processor 1320 includes one or more processors capable of being programmed to perform a function. Memory 1330 includes a random access memory, a read only memory, and/or another type of memory (e.g., a flash memory, a magnetic memory, and/or an optical memory).

Storage component 1340 stores information and/or software related to the operation of device 1300. For example, storage component 1340 may include a hard disk drive, a magnetic disk drive, an optical disk drive, a solid state disk drive, a compact disc, a digital versatile disc, and/or another type of non-transitory computer-readable medium. Input component 1350 enables device 1300 to receive input, such as user input and/or sensed inputs. For example, input component 1350 may include a touch screen, a keyboard, a keypad, a mouse, a button, a microphone, a switch, a sensor, a global positioning system component, an accelerometer, a gyroscope, and/or an actuator. Output component 1360 enables device 1300 to provide output, such as via a display, a speaker, and/or one or more light-emitting diodes. Communication component 1370 enables device 1300 to communicate with other devices, such as via a wired connection and/or a wireless connection. For example, communication component 1370 may include a receiver, a transmitter, a transceiver, a modem, a network interface card, and/or an antenna.

Device 1300 may perform one or more processes described herein. For example, a non-transitory computer-readable medium (e.g., memory 1330 and/or storage component 1340) may store a set of instructions (e.g., one or more instructions, code, software code, and/or program code) for execution by processor 1320. Processor 1320 may execute the set of instructions to perform one or more processes described herein. In some implementations, execution of the set of instructions, by one or more processors 1320, causes the one or more processors 1320 and/or the device 1300 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 13 are provided as an example. Device 1300 may include additional components, fewer components, different components, or differently arranged components than those shown in FIG. 13. Additionally, or alternatively, a set of components (e.g., one or more components) of device 1300 may perform one or more functions described as being performed by another set of components of device 1300.

Figure 14:
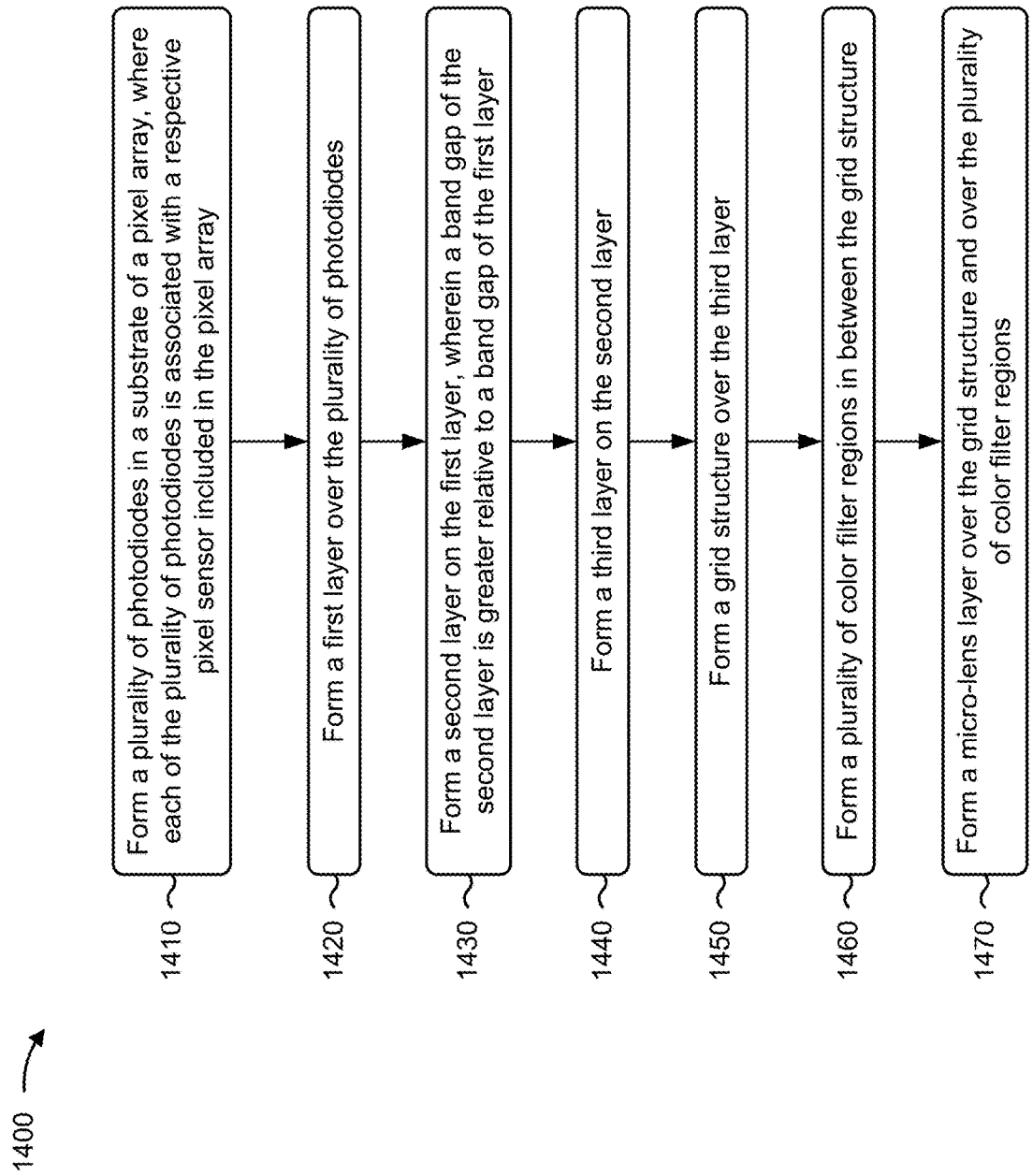
FIG. 14 is a flowchart of an example process relating to forming a pixel array.

FIG. 14 is a flowchart of an example process 1400 associated with forming a pixel array. In some implementations, one or more process blocks of FIG. 14 may be performed by a one or more semiconductor processing tools (e.g., one or more of the semiconductor processing tools 102-114). Additionally, or alternatively, one or more process blocks of FIG. 14 may be performed by one or more components of device 1300, such as processor 1320, memory 1330, storage component 1340, input component 1350, output component 1360, and/or communication component 1370.

As shown in FIG. 14, process 1400 may include forming a plurality of photodiodes in a substrate of a pixel array, where each of the plurality of photodiodes is associated with a respective pixel sensor included in the pixel array (block 1410). For example, the one or more semiconductor processing tools 102-114 may form a plurality of photodiodes (e.g., photodiodes 306, 506, 706, and/or 906) in a substrate (e.g., substrate 304, 504, 704, and/or 904) of a pixel array (e.g., pixel array 200, 300, 500, 700, and/or 900), as described above. In some implementations, each of the plurality of photodiodes is associated with a respective pixel sensor (e.g., pixel sensor 202, 302, 502, 702, 902) included in the pixel array.

As further shown in FIG. 14, process 1400 may include forming a first layer over the plurality of photodiodes (block 1420). For example, the one or more semiconductor processing tools 102-114 may form a first layer (e.g., layer 316, 516, 716, and/or 916) over the plurality of photodiodes, as described above.

As further shown in FIG. 14, process 1400 may include forming a second layer on the first layer, wherein a band gap of the second layer is greater relative to a band gap of the first layer (block 1430). For example, the one or more semiconductor processing tools 102-114 may form a second layer (e.g., layer 318, 518, 718, and/or 918) on the first layer, wherein a band gap of the second layer is greater relative to a band gap of the first layer, as described above. In some implementations, a band gap of the second layer is greater relative to a band gap of the first layer.

As further shown in FIG. 14, process 1400 may include forming a third layer on the second layer (block 1440). For example, the one or more semiconductor processing tools 102-114 may form a third layer (e.g., layer 320, 520, 720, and/or 920) on the second layer, as described above.

As further shown in FIG. 14, process 1400 may include forming a grid structure over the third layer (block 1450). For example, the one or more semiconductor processing tools 102-114 may form a grid structure (e.g., grid structure 322, 522, 722, and/or 922) over the third layer, as described above.

As further shown in FIG. 14, process 1400 may include forming a plurality of color filter regions in between the grid structure (block 1460). For example, the one or more semiconductor processing tools 102-114 may form a plurality of color filter regions (e.g., color filter regions 332, 532, 732, and/or 932) in between the grid structure, as described above.

As further shown in FIG. 14, process 1400 may include forming a micro-lens layer over the grid structure and over the plurality of color filter regions (block 1470). For example, the one or more semiconductor processing tools may form a micro-lens layer (e.g., micro-lens layer 336, 536, 736, and/or 936) over the grid structure and over the plurality of color filter regions, as described above.

Process 1400 may include additional implementations, such as any single implementation or any combination of implementations described below and/or in connection with one or more other processes described elsewhere herein.

In a first implementation, process 1400 includes forming a passivation liner (e.g., passivation liner 334, 534, 734, and/or 934) on sidewalls of the grid structure, where forming the plurality of color filter regions includes forming the plurality of color filter regions over the passivation liner. In a second implementation, alone or in combination with the first implementation, forming the grid structure includes forming a plurality of layers (e.g., layers 324, 326, 328, 330, 728, and/or 730) over the third layer, and etching through the plurality of layers to the third layer to form openings (e.g., openings 402, 602, 802, and/or 1002) for the grid structure.

In a third implementation, alone or in combination with one or more of the first and second implementations, forming the grid structure includes forming a plurality of layers (e.g., layers 524, 526, 528, 530, 928, and/or 930) over the third layer, and etching through the plurality of layers and into a portion (e.g., portion 538 and/or 938) of the third layer to form openings (e.g., openings 602 and/or 1002) for the grid structure. In a fourth implementation, alone or in combination with one or more of the first through third implementations, the grid structure includes a CMG structure. In a fifth implementation, alone or in combination with one or more of the first through fourth implementations, the grid structure includes a CIAB structure.

Although FIG. 14 shows example blocks of process 1400, in some implementations, process 1400 may include additional blocks, fewer blocks, different blocks, or differently arranged blocks than those depicted in FIG. 14. Additionally, or alternatively, two or more of the blocks of process 1400 may be performed in parallel.

In this way, a pixel sensor may include a layer stack to reduce and/or block the effects of plasma and etching on a photodiode and/or other lower-level layers. The layer stack may include a first oxide layer, a layer having a band gap that is approximately less than 8.8 eV, and a second oxide layer. The layer stack may reduce and/or prevent the penetration and absorption of ultraviolet photons resulting from the plasma and etching processes, which may otherwise cause the formation of electron-hole pairs in the substrate in which the photodiode is included.

As described in greater detail above, some implementations described herein provide a pixel sensor. The pixel sensor includes a photodiode in a substrate of the pixel sensor. The pixel sensor includes an oxide-nitride-oxide layer stack, over the photodiode in the substrate, configured to protect the photodiode from radiation damage.

As described in greater detail above, some implementations described herein provide a pixel sensor. The pixel sensor includes a photodiode in a substrate of the pixel sensor. The pixel sensor includes a layer stack, over the photodiode in the substrate, including, a first layer including a first oxide material, a second layer on the first layer, where a band gap of the second layer is less than approximately 8.8 electron-volts, and a third layer, on the second layer, including a second oxide material.

As described in greater detail above, some implementations described herein provide a method. The method includes forming a plurality of photodiodes in a substrate of a pixel array, where each of the plurality of photodiodes is associated with a respective pixel sensor included in the pixel array. The method includes forming a first layer over the plurality of photodiodes. The method includes forming a second layer on the first layer, where a band gap of the second layer is greater relative to a band gap of the first layer. The method includes forming a third layer on the second layer. The method includes forming a grid structure over the third layer. The method includes forming a plurality of color filter regions in between the grid structure. The method includes forming a micro-lens layer over the grid structure and over the plurality of color filter regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a plurality of photodiodes in a substrate of a pixel array,
      wherein each of the plurality of photodiodes is associated with a respective pixel sensor included in the pixel array;
   forming a first oxide layer over the plurality of photodiodes;
   forming a silicon nitride layer directly on the first oxide layer,
      wherein a band gap of the silicon nitride layer is lower than a band gap of the first oxide layer;
   forming a second oxide layer directly on the silicon nitride layer;
   forming a grid structure over the second oxide layer;
   forming a passivation liner over a top layer of the grid structure, on sidewalls of the grid structure, and on a portion of the second oxide layer;
   removing a first portion of the passivation liner from the second oxide layer;
   forming a plurality of color filter regions in between portions of the passivation liner on the sidewalls of the grid structure and directly on a surface of the second oxide layer; and
   forming a micro-lens layer over a second portion of the passivation liner and over the plurality of color filter regions,
      wherein the second portion of the passivation liner is over an entire portion of the top layer of the grid structure.

2. The method of claim 1, wherein forming the grid structure comprises:
   forming a plurality of layers over the second oxide layer; and
   etching through the plurality of layers and into the portion of the second oxide layer to form openings for the grid structure.

3. The method of claim 1, wherein the grid structure comprises a composite metal grid (CMG) structure.

4. The method of claim 1, wherein the grid structure comprises a color filter in a box (CIAB) structure.

5. A system, comprising:
   one or more semiconductor processing tools configured to:
      form a plurality of photodiodes in a substrate of a pixel array,
         wherein each of the plurality of photodiodes s associated with a respective pixel sensor included in the pixel array;
      form a first oxide layer over the plurality of photodiodes;
      form a silicon nitride layer directly on the first oxide layer,
         wherein a band gap of the silicon nitride layer is lower than a band gap of the first oxide layer;
      form a second oxide layer directly on the silicon nitride layer;
      form a grid structure over the second oxide layer;
      form a passivation liner over a top layer of the grid structure, on sidewalls of the grid structure, and on a portion of the second oxide layer;
      remove a first portion of the passivation liner from the second oxide layer;
      form a plurality of color filter regions in between portions of the passivation liner on the sidewalls of the grid structure and directly on a surface of the second oxide layer; and
      form a micro-lens layer over a second portion of the passivation liner and over the plurality of color filter regions,
         wherein the second portion of the passivation liner is over an entire portion of the top layer of the grid structure.

6. The system of claim 5, wherein the one or more semiconductor processing tools, to form the grid structure, are configured to:
   form a plurality of layers over the second oxide layer; and
   etch through the plurality of layers and into the portion of the second oxide layer to form openings for the grid structure.

7. The system of claim 5, wherein the grid structure comprises a composite metal grid (CMG) structure.

8. The system of claim 5, wherein the grid structure comprises a color filter in a box (CIAB) structure.

9. The system of claim 5, wherein the band gap of the silicon oxide layer is less than 8.8 electron-volts.

10. The method of claim 2, wherein the surface of the second oxide layer is formed based on the portion of the second oxide layer being etched.

11. The system of claim 6, wherein the surface of the second oxide layer is formed based on the portion of the second oxide layer being etched.

12. A method, comprising:
   forming a plurality of photodiodes between an isolation structure and in a substrate of a pixel array,
      wherein each of the plurality of photodiodes is associated with a respective pixel sensor included in the pixel array;
   forming a layer stack over the plurality of photodiodes and the isolation structure, wherein the layer stack comprises a first layer, a second layer directly on the first layer, and a third layer directly on the second layer, wherein the second layer comprises silicon nitride;
   forming a grid structure over a portion of the layer stack that is over the isolation structure,
      wherein the grid structure includes a tungsten layer;
   forming a passivation liner on a top of the grid structure, on sidewalls of the grid structure, and on a portion of the layer stack;
   removing a first portion of the passivation liner from the layer stack;
   forming a plurality of color filter regions in between portions of the passivation liner on the sidewalls of the grid structure and directly on a surface of the layer stack; and
   forming a micro-lens layer over a second portion of the passivation liner and over the plurality of color filter regions,
      wherein the second portion of the passivation liner is over an entire portion of the grid structure.

13. The method of claim 12, wherein the grid structure further includes a titanium nitride (TiN) layer, and
   wherein forming the grid structure comprises:
      forming the tungsten layer over the TiN layer.

14. The method of claim 13, wherein forming the grid structure further comprises:
   etching through the TiN layer and the tungsten layer and into the portion of the layer stack to form openings for the grid structure.

15. The method of claim 12, wherein forming the grid structure comprises:

forming an oxide layer over the tungsten layer.

16. The method of claim 15, wherein forming the grid structure further comprises:

forming a hard mask layer over the oxide layer.

17. The method of claim 12, wherein forming the grid structure comprises:

forming a titanium nitride (TiN) layer;
forming the tungsten layer over the TiN layer;
forming an oxide layer over the tungsten layer; and
forming a hard mask layer over the oxide layer.

18. The method of claim 1, wherein the plurality of photodiodes are formed in an upper portion of that substrate that is adjacent to the first oxide layer.

19. The method of claim 1, further comprising:

forming a high dielectric constant (high-k) dielectric layer on the substrate,
wherein the first oxide layer is formed on the high-k dielectric layer.

20. The method of claim 16, wherein at least one of:

the oxide layer has a thickness of approximately 2900 angstroms to approximately 3700 angstroms, or
the hard mask layer includes a silicon nitride (SixNy) or a silicon oxynitride (SiON).

* * * * *